(12) United States Patent
Kurokawa et al.

(10) Patent No.: US 10,033,379 B2
(45) Date of Patent: *Jul. 24, 2018

(54) SEMICONDUCTOR DEVICE INCLUDING POWER STORAGE ELEMENTS, SWITCHES, AND CIRCUIT INCLUDING LOAD

(71) Applicant: SEMICONDUCTOR ENERGY LABORATORY CO., LTD., Atsugi-shi, Kanagawa-ken (JP)

(72) Inventors: Yoshiyuki Kurokawa, Kanagawa (JP); Yuki Okamoto, Kanagawa (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 46 days.

This patent is subject to a terminal disclaimer.

(21) Appl. No.: 15/412,094

(22) Filed: Jan. 23, 2017

(65) Prior Publication Data

US 2017/0134020 A1 May 11, 2017

Related U.S. Application Data

(63) Continuation of application No. 14/814,609, filed on Jul. 31, 2015, now Pat. No. 9,595,955.

(30) Foreign Application Priority Data

Aug. 8, 2014 (JP) .................................. 2014-162900

(51) Int. Cl.
*G11C 5/14* (2006.01)
*H03K 17/687* (2006.01)
(Continued)

(52) U.S. Cl.
CPC ............. *H03K 17/687* (2013.01); *G11C 7/12* (2013.01); *H01L 27/1225* (2013.01); *H03B 5/00* (2013.01); *H03K 3/0315* (2013.01); *H03L 7/0995* (2013.01)

(58) Field of Classification Search
CPC .... G11C 5/06; G11C 5/14; G11C 7/00; G11C 7/1006; G11C 11/16; G11C 11/24;
(Continued)

(56) References Cited

U.S. PATENT DOCUMENTS

| 5,731,856 A | 3/1998 | Kim et al. |
| 5,744,864 A | 4/1998 | Cillessen et al. |

(Continued)

FOREIGN PATENT DOCUMENTS

| EP | 1737044 A | 12/2006 |
| EP | 2226847 A | 9/2010 |

(Continued)

OTHER PUBLICATIONS

Asakuma.N et al., "Crystallization and Reduction of Sol-Gel-Derived Zinc Oxide Films by Irradiation With Ultraviolet Lamp", Journal of Sol-Gel Science and Technology, 2003, vol. 26, pp. 181-184.

(Continued)

*Primary Examiner* — Hien Nguyen
(74) *Attorney, Agent, or Firm* — Nixon Peabody LLP; Jeffrey L. Costellia

(57) ABSTRACT

To generate an analog current without restriction by a power supply voltage. A semiconductor device includes a first node, a second node, a first- to an n-th-stage power storage element (n is an integer greater than or equal to 2), and a first- to an n-th-stage switch. The capacities of the first- to the n-th-stage power storage element are different from one another. The first- to the n-th-stage power storage element are electrically connected in parallel between the first node and the second node. A first terminal of a k-th stage power storage element (k is an integer greater than or equal to 1 and less than or equal to n) is electrically connected to the first input node via a k-th stage switch. The on/off states of the (Continued)

first- to the n-th-stage switch are controlled by a first to an n-th signal.

17 Claims, 23 Drawing Sheets

(51) Int. Cl.
    *H03K 3/03*     (2006.01)
    *H03L 7/099*     (2006.01)
    *H01L 27/12*     (2006.01)
    *H03B 5/00*     (2006.01)
    *G11C 7/12*     (2006.01)

(58) Field of Classification Search
    CPC .............. G11C 11/401; G11C 11/1653; H03K 19/0013; H03K 19/0948; H03K 19/1776; H03K 19/17728
    See application file for complete search history.

(56) References Cited

U.S. PATENT DOCUMENTS

| | | | |
|---|---|---|---|
| 6,140,799 A | 10/2000 | Thomasson | |
| 6,285,164 B1 * | 9/2001 | Noda .................. | G01R 31/361 320/130 |
| 6,294,274 B1 | 9/2001 | Kawazoe et al. | |
| 6,563,174 B2 | 5/2003 | Kawasaki et al. | |
| 6,727,522 B1 | 4/2004 | Kawasaki et al. | |
| 7,049,190 B2 | 5/2006 | Takeda et al. | |
| 7,061,014 B2 | 6/2006 | Hosono et al. | |
| 7,064,346 B2 | 6/2006 | Kawasaki et al. | |
| 7,105,868 B2 | 9/2006 | Nause et al. | |
| 7,211,825 B2 | 5/2007 | Shih et al. | |
| 7,282,782 B2 | 10/2007 | Hoffman et al. | |
| 7,297,977 B2 | 11/2007 | Hoffman et al. | |
| 7,323,356 B2 | 1/2008 | Hosono et al. | |
| 7,385,224 B2 | 6/2008 | Ishii et al. | |
| 7,402,506 B2 | 7/2008 | Levy et al. | |
| 7,411,209 B2 | 8/2008 | Endo et al. | |
| 7,453,065 B2 | 11/2008 | Saito et al. | |
| 7,453,087 B2 | 11/2008 | Iwasaki | |
| 7,462,862 B2 | 12/2008 | Hoffman et al. | |
| 7,468,304 B2 | 12/2008 | Kaji et al. | |
| 7,501,293 B2 | 3/2009 | Ito et al. | |
| 7,674,650 B2 | 3/2010 | Akimoto et al. | |
| 7,732,819 B2 | 6/2010 | Akimoto et al. | |
| 8,575,985 B2 | 11/2013 | Ohmaru et al. | |
| 8,669,781 B2 | 3/2014 | Ohmaru | |
| 8,824,186 B2 | 9/2014 | Evans, Jr. | |
| 8,994,341 B2 * | 3/2015 | Voorwinden .......... | H02J 7/0068 320/162 |
| 9,299,394 B2 | 3/2016 | Upputuri et al. | |
| 2001/0046027 A1 | 11/2001 | Tai et al. | |
| 2002/0056838 A1 | 5/2002 | Ogawa | |
| 2002/0132454 A1 | 9/2002 | Ohtsu et al. | |
| 2003/0189401 A1 | 10/2003 | Kido et al. | |
| 2003/0218222 A1 | 11/2003 | Wager, III et al. | |
| 2004/0038446 A1 | 2/2004 | Takeda et al. | |
| 2004/0127038 A1 | 7/2004 | Carcia et al. | |
| 2005/0017302 A1 | 1/2005 | Hoffman | |
| 2005/0199959 A1 | 9/2005 | Chiang et al. | |
| 2006/0035452 A1 | 2/2006 | Carcia et al. | |
| 2006/0043377 A1 | 3/2006 | Hoffman et al. | |
| 2006/0091793 A1 | 5/2006 | Baude et al. | |
| 2006/0092583 A1 | 5/2006 | Alahmad et al. | |
| 2006/0108529 A1 | 5/2006 | Saito et al. | |
| 2006/0108636 A1 | 5/2006 | Sano et al. | |
| 2006/0110867 A1 | 5/2006 | Yabuta et al. | |
| 2006/0113536 A1 | 6/2006 | Kumomi et al. | |
| 2006/0113539 A1 | 6/2006 | Sano et al. | |
| 2006/0113549 A1 | 6/2006 | Den et al. | |
| 2006/0113565 A1 | 6/2006 | Abe et al. | |
| 2006/0169973 A1 | 8/2006 | Isa et al. | |
| 2006/0170111 A1 | 8/2006 | Isa et al. | |
| 2006/0197092 A1 | 9/2006 | Hoffman et al. | |
| 2006/0208977 A1 | 9/2006 | Kimura | |
| 2006/0228974 A1 | 10/2006 | Thelss et al. | |
| 2006/0231882 A1 | 10/2006 | Kim et al. | |
| 2006/0238135 A1 | 10/2006 | Kimura | |
| 2006/0244107 A1 | 11/2006 | Sugihara et al. | |
| 2006/0284171 A1 | 12/2006 | Levy et al. | |
| 2006/0284172 A1 | 12/2006 | Ishii | |
| 2006/0292777 A1 | 12/2006 | Dunbar | |
| 2007/0024187 A1 | 2/2007 | Shin et al. | |
| 2007/0046191 A1 | 3/2007 | Saito | |
| 2007/0052025 A1 | 3/2007 | Yabuta | |
| 2007/0054507 A1 | 3/2007 | Kaji et al. | |
| 2007/0090365 A1 | 4/2007 | Hayashi et al. | |
| 2007/0108446 A1 | 5/2007 | Akimoto | |
| 2007/0152217 A1 | 7/2007 | Lai et al. | |
| 2007/0172591 A1 | 7/2007 | Seo et al. | |
| 2007/0187678 A1 | 8/2007 | Hirao et al. | |
| 2007/0187760 A1 | 8/2007 | Furuta et al. | |
| 2007/0194379 A1 | 8/2007 | Hosono et al. | |
| 2007/0252928 A1 | 11/2007 | Ito et al. | |
| 2007/0272922 A1 | 11/2007 | Kim et al. | |
| 2007/0287296 A1 | 12/2007 | Chang | |
| 2008/0006877 A1 | 1/2008 | Mardilovich et al. | |
| 2008/0038882 A1 | 2/2008 | Takechi et al. | |
| 2008/0038929 A1 | 2/2008 | Chang | |
| 2008/0050595 A1 | 2/2008 | Nakagawara et al. | |
| 2008/0073653 A1 | 3/2008 | Iwasaki | |
| 2008/0083950 A1 | 4/2008 | Pan et al. | |
| 2008/0106191 A1 | 5/2008 | Kawase | |
| 2008/0128689 A1 | 6/2008 | Lee et al. | |
| 2008/0129195 A1 | 6/2008 | Ishizaki et al. | |
| 2008/0156886 A1 | 7/2008 | Tsuchiya | |
| 2008/0166834 A1 | 7/2008 | Kim et al. | |
| 2008/0182358 A1 | 7/2008 | Cowdery-Corvan et al. | |
| 2008/0224133 A1 | 9/2008 | Park et al. | |
| 2008/0254569 A1 | 10/2008 | Hoffman et al. | |
| 2008/0258139 A1 | 10/2008 | Ito et al. | |
| 2008/0258140 A1 | 10/2008 | Lee et al. | |
| 2008/0258141 A1 | 10/2008 | Park et al. | |
| 2008/0258143 A1 | 10/2008 | Kim et al. | |
| 2008/0296568 A1 | 12/2008 | Ryu et al. | |
| 2009/0068773 A1 | 3/2009 | Lai et al. | |
| 2009/0073325 A1 | 3/2009 | Kuwabara et al. | |
| 2009/0114910 A1 | 5/2009 | Chang | |
| 2009/0134399 A1 | 5/2009 | Sakakura et al. | |
| 2009/0152506 A1 | 6/2009 | Umeda et al. | |
| 2009/0152541 A1 | 6/2009 | Maekawa et al. | |
| 2009/0278122 A1 | 11/2009 | Hosono et al. | |
| 2009/0280600 A1 | 11/2009 | Hosono et al. | |
| 2010/0065844 A1 | 3/2010 | Tokunaga | |
| 2010/0092800 A1 | 4/2010 | Itagaki et al. | |
| 2010/0109002 A1 | 5/2010 | Itagaki et al. | |
| 2012/0306533 A1 | 12/2012 | Ohmaru | |
| 2012/0314524 A1 | 12/2012 | Takemura | |
| 2013/0265010 A1 | 10/2013 | Nomura et al. | |
| 2014/0021904 A1 | 1/2014 | Takahashi et al. | |
| 2016/0028347 A1 | 1/2016 | Okamoto et al. | |
| 2016/0043070 A1 | 2/2016 | Momo et al. | |
| 2016/0043715 A1 * | 2/2016 | Kurokawa .......... | H03K 17/687 365/189.011 |
| 2016/0043716 A1 | 2/2016 | Kurokawa et al. | |
| 2016/0126888 A1 | 5/2016 | Okamoto et al. | |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |

(56) References Cited

FOREIGN PATENT DOCUMENTS

| JP | 2002-289859 A | 10/2002 |
|---|---|---|
| JP | 2003-086000 A | 3/2003 |
| JP | 2003-086808 A | 3/2003 |
| JP | 2003-133420 A | 5/2003 |
| JP | 2003-258643 A | 9/2003 |
| JP | 2004-103957 A | 4/2004 |
| JP | 2004-273614 A | 9/2004 |
| JP | 2004-273732 A | 9/2004 |
| JP | 2013-012731 A | 1/2013 |
| WO | WO-2004/114391 | 12/2004 |
| WO | WO-2015/121771 | 8/2015 |
| WO | WO-2016/020802 | 2/2016 |

OTHER PUBLICATIONS

Asaoka.Y et al., "29.1: Polarizer-Free Reflective LCD Combined With Ultra Low-Power Driving Technology", SID Digest '09 : SID International Symposium Digest of Technical Papers, May 31, 2009, pp. 395-398.

Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.

Cho.D et al., "21.2:Al and Sn-Doped Zinc Indium Oxide Thin Film Transistors for AMOLED Back-Plane", SID Digest '09 : SID International Symposium Digest of Technical Papers, May 31, 2009, pp. 280-283.

Clark.S et al., "First Principles Methods Using Castep", Zeitschrift fur Kristallographie, 2005, vol. 220, pp. 567-570.

Coates.D et al., "Optical Studies of the Amorphous Liquid-Cholesteric Liquid Crystal Transition:The "Blue Phase"", Physics Letters, Sep. 10, 1973, vol. 45A, No. 2, pp. 115-116.

Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.

Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.

Fortunato.E et al., "Wide-Bandgap High-Mobility ZnO Thin-Film Transistors Produced at Room Temperature", Appl. Phys. Lett. (Applied Physics Letters) , Sep. 27, 2004, vol. 85, No. 13, pp. 2541-2543.

Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.

Godo.H et al., "P-9:Numerical Analysis on Temperature Dependence of Characteristics of Amorphous In—Ga—Zn-Oxide TFT", SID Digest '09 : SID International Symposium Digest of Technical Papers, May 31, 2009, pp. 1110-1112.

Godo.H et al., "Temperature Dependence of Characteristics and Electronic Structure for Amorphous In—Ga—Zn-Oxide TFT", AM-FPD '09 Digest of Technical Papers, Jul. 1, 2009, pp. 41-44.

Hayashi.R et al., "42.1: Invited Paper: Improved Amorphous In—Ga—Zn—O TFTs", SID Digest '08 : SID International Symposium Digest of Technical Papers, May 20, 2008, vol. 39, pp. 621-624.

Hirao.T et al., "Novel Top-Gate Zinc Oxide Thin-Film Transistors (ZnO TFTs) for AMLCDS", J. Soc. Inf. Display (Journal of the Society for Information Display), 2007, vol. 15, No. 1, pp. 17-22.

Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.

Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.

Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.

Ikeda.T et al., "Full-Functional System Liquid Crystal Display Using Cg-Silicon Technology", SID Digest '04 : SID International Symposium Digest of Technical Papers, 2004, vol. 35, pp. 860-863.

Janotti.A et al., "Native Point Defects in ZnO", Phys. Rev. B (Physical Review. B), Oct. 4, 2007, vol. 76, No. 16, pp. 165202-1-165202-22.

Janotti.A et al., "Oxygen Vacancies in ZnO", Appl. Phys. Lett. (Applied Physics Letters) , 2005, vol. 87, pp. 122102-1-122102-3.

Jeong.J et al., "3.1: Distinguished Paper: 12.1-Inch WXGA AMOLED Display Driven by Indium-Gallium-Zinc Oxide TFTs Array", SID Digest '08 : SID International Symposium Digest of Technical Papers, May 20, 2008, vol. 39, No. 1, pp. 1-4.

Jin.D et al., "65.2:Distinguished Paper:World-Largest (6.5") Flexible Full Color Top Emission AMOLED Display on Plastic Film and its Bendind Poperties", SID Digest '09 : SID International Symposium Digest of Technical Papers, May 31, 2009, pp. 983-985.

Kanno.H et al., "White Stacked Electrophosphorecent Organic Light-Emitting Devices Employing MOO3 as a Charge-Generation Layer", Adv. Mater. (Advanced Materials), 2006, vol. 18, No. 3, pp. 339-342.

Kikuchi.H et al., "39.1:Invited Paper:Optically Isotropic Nano-Structured Liquid Crystal Composites for Display Applications", SID Digest '09 : SID International Symposium Digest of Technical Papers, May 31, 2009, pp. 578-581.

Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.

Kikuchi.H et al., "Polymer-Stabilized Liquid Crystal Blue Phases", Nature Materials, Sep. 2, 2002, vol. 1, pp. 64-68.

Kim.S et al., "High-Performance oxide thin film transistors passivated by various gas plasmas", 214th ECS Meeting, 2008, No. 2317, ECS.

Kimizuka.N et al., "Spinel,YBFE2O4, and YB2FE3O7 Types of Structures for Compounds in the In2O3 and Sc2O3-A2O3-Bo Systems [A; Fe, Ga, or Al; B: Mg, Mn, Fe, Ni, Cu,Or Zn] at Temperatures Over 1000 °C.", Journal of Solid State Chemistry, 1985, vol. 60, pp. 382-384.

Kimizuka.N et al., "Syntheses and Single-Crystal Data of Homologous Compounds, In2O3(ZnO)m (m = 3, 4, and 5), InGaO3(ZnO)3, and G32O3(ZnO)m (m = 7, 8, 9, and 16) in the In2O3—ZnGa2O4—ZnO System", Journal of Solid State Chemistry, Apr. 1, 1995, vol. 116, No. 1, pp. 170-178.

Kitzerow.H et al., "Observation of Blue Phases in Chiral Networks", Liquid Crystals, 1993, vol. 14, No. 3, pp. 911-916.

Kurokawa.Y et al., "UHF RFCPUS on Flexible and Glass Substrates for Secure RFID Systems", Journal of Solid-State Circuits , 2008, vol. 43, No. 1, pp. 292-299.

Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.

Lee.H et al., "Current Status of, Challenges to, and Perspective View of AM-OLED ", IDW '06 : Proceedings of the 13th International Display Workshops, Dec. 7, 2006, pp. 663-666.

Lee.J et al., "World's Largest (15-Inch) XGA AMLCD Panel Using IGZO Oxide TFT", SID Digest '08 : SID International Symposium Digest of Technical Papers, May 20, 2008, vol. 39, pp. 625-628.

Lee.M et al., "15.4:Excellent Performance of Indium-Oxide-Based Thin-Film Transistors by DC Sputtering", SID Digest '09 : SID International Symposium Digest of Technical Papers, May 31, 2009, pp. 191-193.

Li.C et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355.

(56) References Cited

OTHER PUBLICATIONS

Masuda.S et al., "Transparent thin film transistors using ZnO as an active channel layer and their electrical properties", J. Appl. Phys. (Journal of Applied Physics), Feb. 1, 2003, vol. 93, No. 3, pp. 1624-1630.

Meiboom.S et al., "Theory of the Blue Phase of Cholesteric Liquid Crystals", Phys. Rev. Lett. (Physical Review Letters), May 4, 1981, vol. 46, No. 18, pp. 1216-1219.

Miyasaka.M, "Suftla Flexible Microelectronics on Their Way to Business", SID Digest '07 : SID International Symposium Digest of Technical Papers, 2007, vol. 38, pp. 1673-1676.

Mo.Y et al., "Amorphous Oxide TFT Backplanes for Large Size AMOLED Displays", IDW '08 : Proceedings of the 6th International Display Workshops, Dec. 3, 2008, pp. 581-584.

Nakamura.M et al., "The phase relations in the $In_2O_3$—$Ga_2ZnO_4$—$ZnO$ system at 1350°C.", Journal of Solid State Chemistry, Aug. 1, 1991, vol. 93, No. 2, pp. 298-315.

Nakamura.M, "Synthesis of Homologous Compound with New Long-Period Structure", NIRIM Newsletter, Mar. 1, 1995, vol. 150, pp. 1-4.

Nomura.K et al., "Amorphous Oxide Semiconductors for High-Performance Flexible Thin-Film Transistors", Jpn. J. Appl. Phys. (Japanese Journal of Applied Physics), 2006, vol. 45, No. 53, pp. 4303-4308.

Nomura.K et al., "Carrier transport in transparent oxide semiconductor with intrinsic structural randomness probed using single-crystalline $InGaO_3(ZnO)_5$ films", Appl. Phys. Lett. (Applied Physics Letters), Sep. 13, 2004, vol. 85, No. 11, pp. 1993-1995.

Nomura.K et al., "Room-Temperature Fabrication of Transparent Flexible Thin-Film Transistors Using Amorphous Oxide Semiconductors", Nature, Nov. 25, 2004, vol. 432, pp. 488-492.

Nomura.K et al., "Thin-Film Transistor Fabricated in Single-Crystalline Transparent Oxide Semiconductor", Science, May 23, 2003, vol. 300, No. 5623, pp. 1269-1272.

Nowatari.H et al., "60.2: Intermediate Connector With Suppressed Voltage Loss for White Tandem OLEDs"; SID Digest '09 : SID International Symposium Digest of Technical Papers, May 31, 2009, vol. 40, pp. 899-902.

Oba.F et al., "Defect energetics in ZnO: A hybrid Hartree-Fock density functional study", Phys. Rev. B (Physical Review. B): 2008, vol. 77, pp. 245262-1-245202-6.

Oh.M et al., "Improving the Gate Stability of ZnO Thin-Film Transistors With Aluminum Oxide Dielectric Layers", J. Electrochem. Soc. (Journal of The Electrochemical Society), 2008, vol. 155, No. 12, pp. H1009-H1014.

Ohara.H et al., "21.3:4.0 in. QVGA AMOLED Display Using In—Ga—Zn-Oxide TFTs With a Novel Passivation Layer", SID Digest '09 : SID International Symposium Digest of Technical Papers, May 31, 2009, pp. 284-287.

Ohara.H et al., "Amorphous In—Ga—Zn-Oxide TFTs with Suppressed Variation for 4.0 inch QVGA AMOLED Display", AM-FPD '09 Digest of Technical Papers, Jul. 1, 2009, pp. 227-230, the Japan Society of Applied Physics.

Orita.M et al., "Amorphous transparent conductive oxide $InGaO_3(ZnO)m$ (m<4):a Zn4s conductor", Philosophical Magazine, 2001, vol. 81, No. 5, pp. 501-515.

Orita.M et al., "Mechanism of Electrical Conductivity of Transparent $InGaZnO_4$", Phys. Rev. B (Physical Review. B), Jan. 15, 2000, vol. 61, No. 3, pp. 1811-1816.

Osada.T et al., "15.2: Development of Driver-Integrated Panel using Amorphous In—Ga—Zn-Oxide TFT", SID Digest '09 : SID International Symposium Digest of Technical Papers, May 31, 2009, vol. 40, pp. 184-187.

Osada.T et al., "Development of Driver-Integrated Panel Using Amorphous In—Ga—Zn-Oxide TFT", AM-FPD '09 Digest of Technical Papers, Jul. 1, 2009, pp. 33-36.

Park.J et al., "Amorphous Indium-Gallium-Zinc Oxide TFTs and Their Application for Large Size AMOLED", AM-FPD '08 Digest of Technical Papers, Jul. 2, 2008, pp. 275-278.

Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.

Park.J et al., "Electronic Transport Properties of Amorphous Indium-Gallium-Zinc Oxide Semiconductor Upon Exposure To Water", Appl. Phys. Lett. (Applied Physics Letters), 2008, vol. 92, pp. 072104-1-072104-3.

Park.J et al., "High performance amorphous oxide thin film transistors with self-aligned top-gate structure", IEDM 09: Technical Digest of International Electron Devices Meeting, Dec. 7, 2009, pp. 191-194.

Park.J et al., "Improvements in the Device Characteristics of Amorphous Indium Gallium Zinc Oxide Thin-Film Transistors by Ar Plasma Treatment", Appl. Phys. Lett. (Applied Physics Letters), Jun. 26, 2007, vol. 90, No.26, pp. 262106-1-262106-3.

Park.S et al., "Challenge to Future Displays: Transparent AM-OLED Driven by Peald Grown ZnO TFT", IMID '07 Digest, 2007, pp. 1249-1252.

Park.Sang-Hee et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.

Prins.M et al., "A Ferroelectric Transparent Thin-Film Transistor", Appl. Phys. Lett. (Applied Physics Letters), Jun. 17, 1996, vol. 68, No. 25, pp. 3650-3652.

Sakata.J et al., "Development of 4.0-In. AMOLED Display With Driver Circuit Using Amorphous In—Ga—Zn-Oxide TFTs", IDW '09 : Proceedings of the 16th International Display Workshops, 2009, pp. 689-692.

Son.K et al., "42.4L: Late-News Paper: 4 Inch QVGA AMOLED Driven by the Threshold Voltage Controlled Amorphous Gizo ($Ga_2O_3$—$In_2O_3$—$ZnO$) TFT", SID Digest '08 : SID International Symposium Digest of Technical Papers, May 20, 2008, vol. 39, pp. 633-636.

Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.

Tsuda.K et al., "Ultra Low Power Consumption Technologies for Mobile TFT-LCDs ", IDW '02 : Proceedings of the 9th International Display Workshops, Dec. 4, 2002, pp. 295-298.

Ueno.K et al., "Field-Effect Transistor on $SrTiO_3$ With Sputtered $Al_2O_3$ Gate Insulator", Appl. Phys. Lett. (Applied Physics Letters), Sep. 1, 2003, vol. 83, No. 9, pp. 1755-1757.

Van de Walle.C, "Hydrogen as a Cause of Doping in Zinc Oxide", Phys. Rev. Lett. (Physical Review Letters), Jul. 31, 2000, vol. 85, No. 5, pp. 1012-1015.

\* cited by examiner

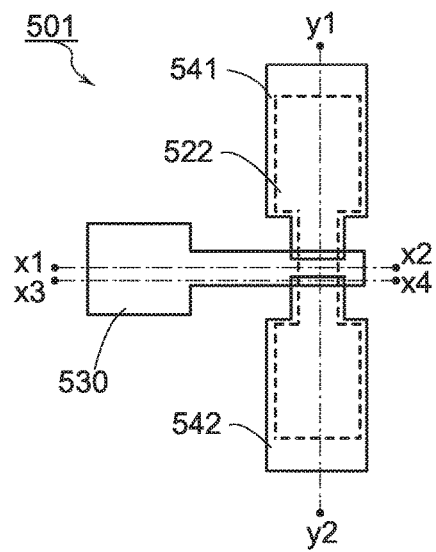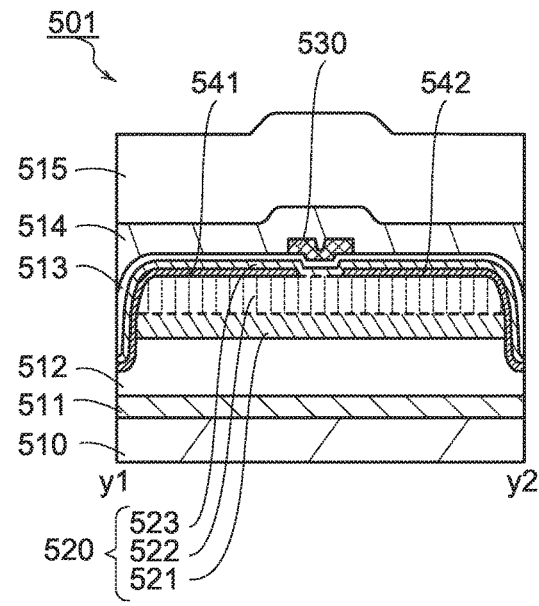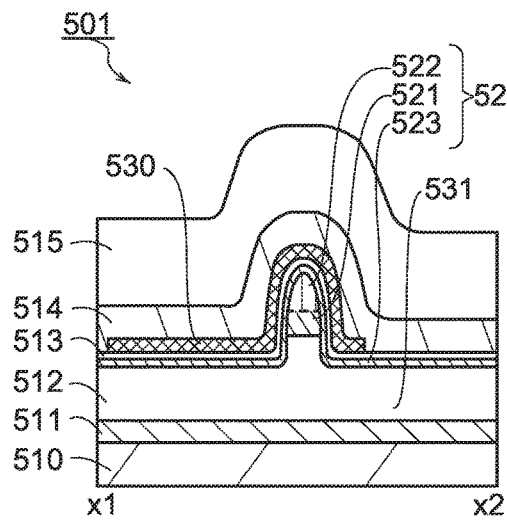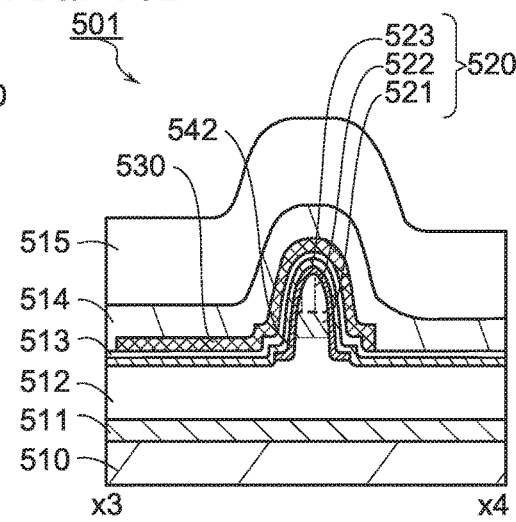

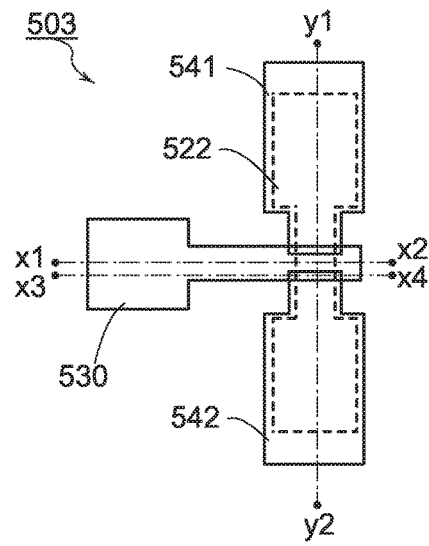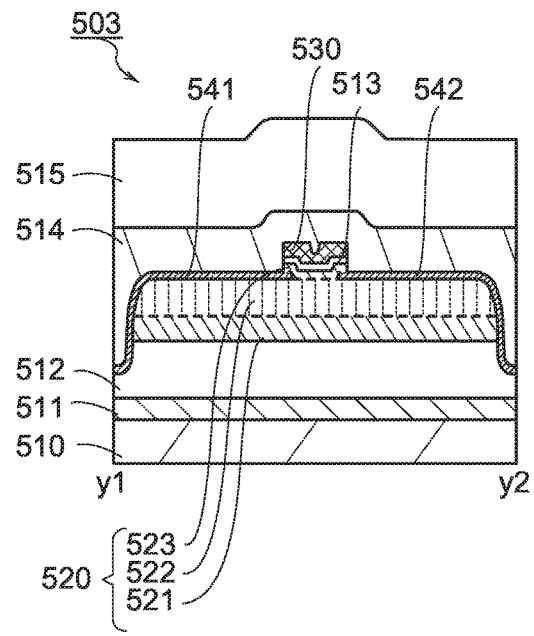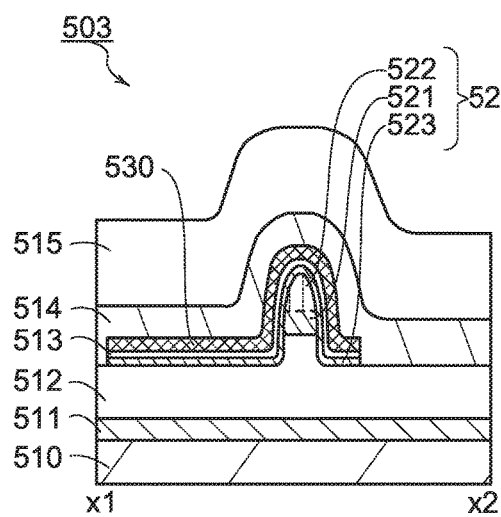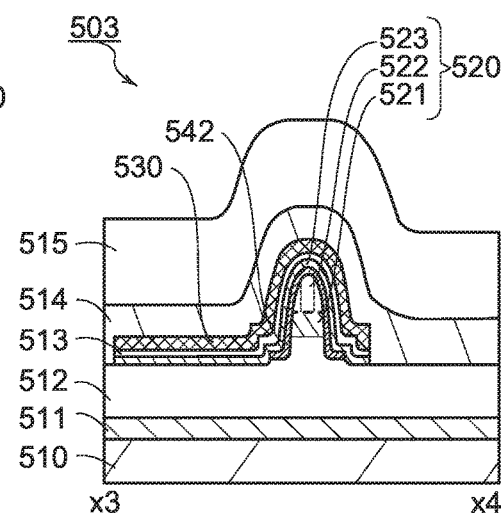

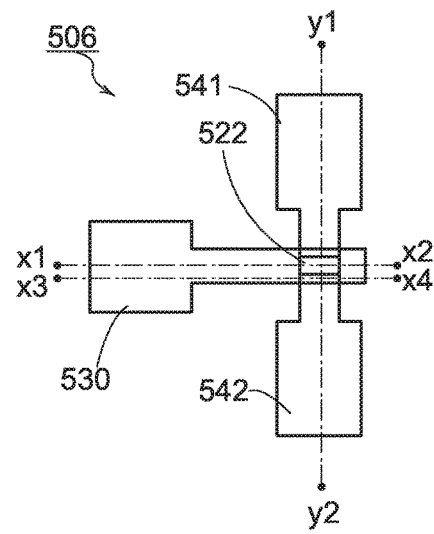
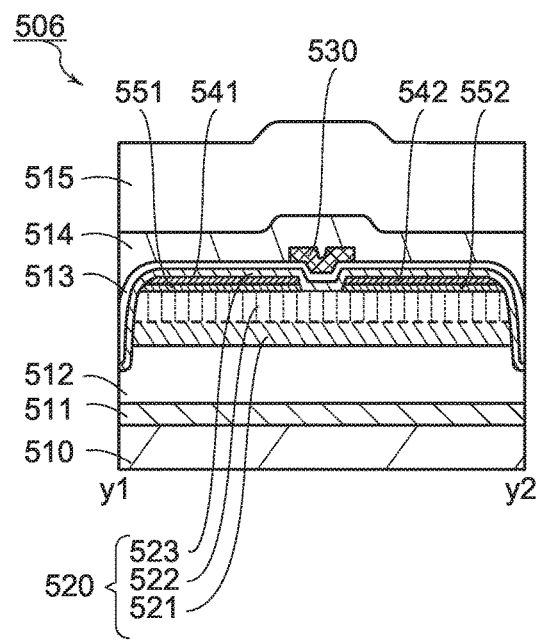
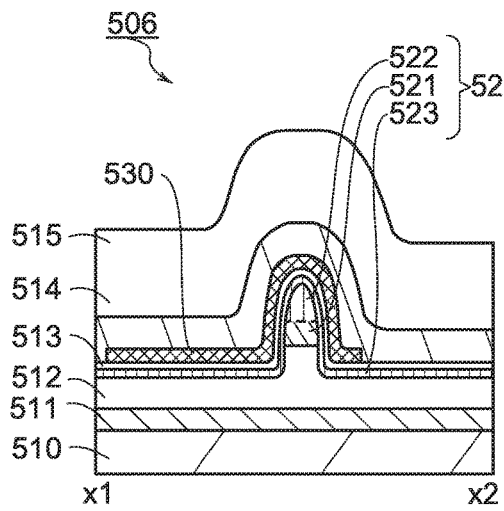
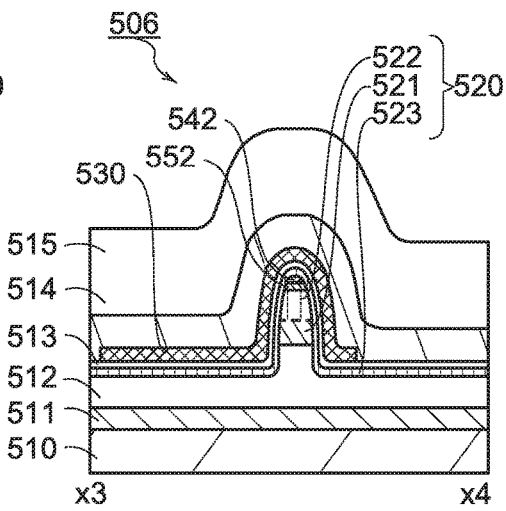

SEMICONDUCTOR DEVICE INCLUDING POWER STORAGE ELEMENTS, SWITCHES, AND CIRCUIT INCLUDING LOAD

BACKGROUND OF THE INVENTION

1. Field of the Invention

One embodiment of the present invention relates to a semiconductor device, a driving method thereof, a manufacturing method thereof, and the like.

2. Description of the Related Art

A semiconductor device in which an integrated circuit and a solid electrolyte secondary battery are stacked is proposed (see Patent Document 1).

A DA converter which converts a digital signal into an analog signal is used for a variety of semiconductor devices. An example of a DA converter which generates an analog current signal includes an R-2R ladder resistor type DA converter (see Patent Document 2).

Transistors including oxide semiconductors have known, and various semiconductor devices including such transistors have been proposed. For example, programmable ladder resistor type DACs are proposed (see FIG. 5 in Patent Document 3).

PATENT DOCUMENT

[Patent Document 1] Japanese Published Patent Application No. 2003-133420
[Patent Document 2] Japanese Published Patent Application No. 2003-258643
[Patent Document 3] Japanese Published Patent Application No. 2013-012731

SUMMARY OF THE INVENTION

It is an object of one embodiment of the present invention to provide a novel semiconductor device or a method for operating the novel semiconductor device. Alternatively, it is an object of one embodiment of the present invention to generate an analog current which does not depend on a power supply voltage, to shorten the rise time, or to provide a programmable semiconductor device.

Note that the description of a plurality of objects does not mutually preclude the existence. One embodiment of the present invention does not necessarily achieve all the objects. Objects other than those listed above are apparent from the description of the specification, drawings, and claims, and also such objects could be an object of one embodiment of the present invention.

One embodiment of the present invention is a semiconductor device including a first node, a second node, a first-stage power storage element to an n-th-stage power storage element (n is an integer greater than or equal to 2), and a first-stage switch to an n-th-stage switch. The capacities of the first-stage power storage element to the n-th-stage power storage element are different from one another. The first-stage power storage element to the n-th-stage power storage element are electrically connected in parallel between the first node and the second node. A first terminal of a k-th-stage power storage element (k is an integer greater than or equal to 1 and less than or equal to n) is electrically connected to the first node via a k-th-stage switch. The on/off states of the first-stage switch to the n-th-stage switch are controlled by a first signal to an n-th signal, respectively.

In the above embodiment, the k-th-stage switch may include a transistor the on/off state of which is controlled by a k-th signal. Alternatively, in the above embodiment, the following structure may be employed in which the k-th-stage switch includes a first transistor, a second transistor, and a capacitor; in the k-th-stage switch, a first terminal of the first transistor is electrically connected to the first terminal of the k-th-stage power storage element, a second terminal of the first transistor is electrically connected to the first node, a gate of the first transistor is electrically connected to the capacitor, the k-th signal is input to a first terminal of the second transistor, and a second terminal of the second transistor is electrically connected to the gate of the first transistor; and the on/off states of second transistors of the first-stage switch to n-th-stage switch are controlled by a common signal.

In this specification and the like, ordinal numbers such as first, second, and third are used to avoid confusion among components, and the terms do not limit the components numerically or do not limit the order.

Note that in this specification and the like, a semiconductor device refers to a device that utilizes semiconductor characteristics, and means a circuit including a semiconductor element (e.g., a transistor or a diode), a device including the circuit, and the like. The semiconductor device also means any device that can function by utilizing semiconductor characteristics. For example, an integrated circuit, and a chip including an integrated circuit are all semiconductor devices. Moreover, a memory device, a display device, a light-emitting device, a lighting device, an electronic device, and the like themselves might be semiconductor devices, or might each include a semiconductor device.

Note that a transistor is an element having three terminals: a gate, a source, and a drain. A gate is a terminal which functions as a control node for controlling the conduction state of a transistor. Depending on the type of the transistor or levels of potentials applied to the terminals, one of a pair of input/output terminals (nodes) functions as a source and the other functions as a drain. Therefore, the terms "source" and "drain" can be switched in this specification and the like. In this specification and the like, the two terminals other than the gate may be referred to as a first terminal and a second terminal.

A node can be referred to as a terminal, a wiring, an electrode, a conductor, an impurity region, or the like depending on a circuit configuration, a device structure, and the like. Furthermore, a terminal and the like can be referred to as a node.

Note that in many cases, a voltage refers to a potential difference between a certain potential and a reference potential (e.g., a ground potential (GND) or a source potential). A voltage can be referred to as a potential and vice versa. Note that the potential indicates a relative value. Accordingly, "ground potential" does not necessarily mean 0 V.

Note that in this specification and the like, the terms "film" and "layer" can be interchanged depending on the case or circumstances. For example, in some cases, the term "conductive film" can be used instead of the term "conductive layer," and the term "insulating film" can be used instead of the term "insulating layer".

One embodiment of the present invention can provide a novel semiconductor device or a method for operating the novel semiconductor device. Alternatively, one embodiment of the present invention enables generation of an analog current which does not depend on a power supply voltage, shortening of the rise time, or provision of a programmable semiconductor device.

Note that the descriptions of these effects do not disturb the existence of other effects. In one embodiment of the present invention, there is no need to achieve all the effects described above. In one embodiment of the present invention, an object other than the above objects, an effect other than the above effects, and a novel feature will be apparent from the description of the specification and the drawings.

BRIEF DESCRIPTION OF THE DRAWINGS

In the accompanying drawings:

FIGS. 16A to 16D illustrate a structure example of an OS transistor: FIG. 16A is a top view; FIG. 16B is a cross-sectional view taken along line y1-y2; FIG. 16C is a cross-sectional view taken along line x1-x2; and FIG. 16D is a cross-sectional view taken along line x3-x4;

FIG. 17A is a top view; FIG. 17B is a cross-sectional view taken along line y1-y2; FIG. 17C is a cross-sectional view taken along line x1-x2; and FIG. 17D is a cross-sectional view taken along line x3-x4;

FIGS. 18A to 18D illustrate a structure example of an OS transistor: FIG. 18A is a top view; FIG. 18B is a cross-sectional view taken along line y1-y2; FIG. 18C is a cross-sectional view taken along line x1-x2; and FIG. 18D is a cross-sectional view taken along line x3-x4;

FIG. 19A is a top view; FIG. 19B is a cross-sectional view taken along line y1-y2; FIG. 19C is a cross-sectional view taken along line x1-x2; and FIG. 19D is a cross-sectional view taken along line x3-x4;

FIG. 20A is a top view; FIG. 20B is a cross-sectional view taken along line y1-y2; FIG. 20C is a cross-sectional view taken along line x1-x2; and FIG. 20D is a cross-sectional view taken along line x3-x4;

FIGS. 21A to 21D illustrate a structure example of an OS transistor: FIG. 21A is a top view; FIG. 21B is a cross-sectional view taken along line y1-y2; FIG. 21C is a cross-sectional view taken along line x1-x2; and FIG. 21D is a cross-sectional view taken along line x3-x4;

DETAILED DESCRIPTION OF THE INVENTION

Figure 1:
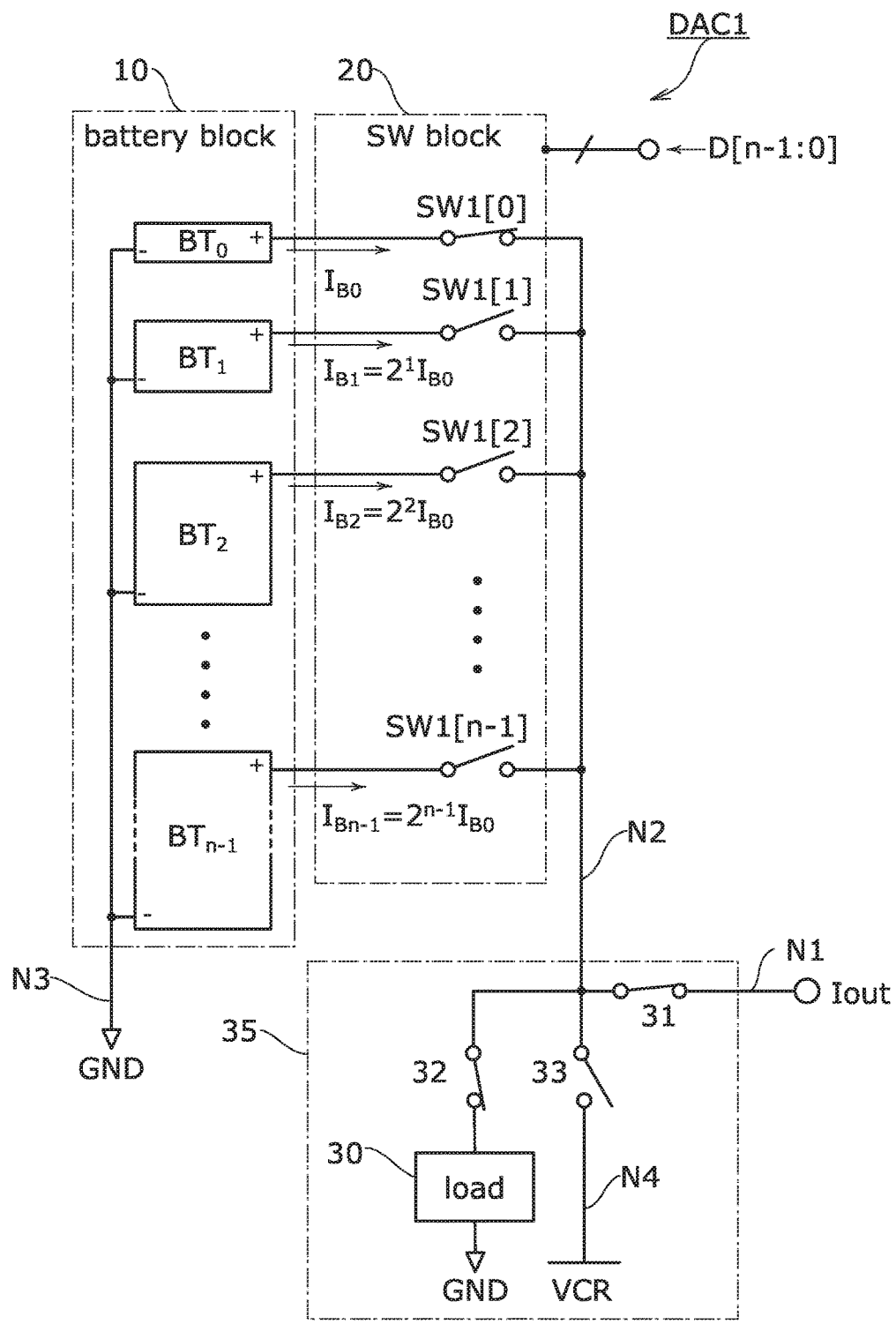
FIG. 1 is a block diagram illustrating a configuration example of a DAC.

Embodiments of the present invention will be described below. Note that the present invention is not limited to the following description. It will be readily appreciated by those skilled in the art that modes and details of the present invention can be modified in various ways without departing from the spirit and scope of the present invention. The present invention therefore should not be construed as being limited to the following description of the embodiments.

In the drawings, the same components, components having similar functions, components formed of the same material, or components formed at the same time are denoted by the same reference numerals in some cases, and description thereof is not repeated in some cases.

In this specification and the like, when the same reference numerals are used for a plurality of elements and those elements need to be distinguished from each other, "_1", "1", "[n]", "[m, n]", or the like may be added to the reference numerals. For example, in the case where a plurality of wirings WWL in a memory cell array are individually distinguished from one another, the wiring WLW in the second row is described using an address number (row number) of the memory cell array, as a wiring WWL[2] in some cases.

In this specification, for example, a data signal Data is abbreviated to "signal Data", "Data", or the like in some cases. The same applies to other components (e.g., a signal, a voltage, a potential, a circuit, an element, an electrode, and a wiring).

Embodiments of the present invention are described below, and any of the embodiments can be combined as appropriate. In addition, in the case where some a plurality of structure examples are given in one embodiment, any of the structure examples can be combined as appropriate.

Embodiment 1

As an example of a semiconductor device, a DA converter (DAC) is described.

<<Configuration Example of DA Converter>>

FIG. 1 is a block diagram illustrating a configuration example of a DAC. A DAC1 in FIG. 1 has a function of converting an n-bit (n is an integer of 2 or more) digital signal D[n−1:0] into a current $I_{out}$. The current $I_{out}$ is an analog current and is an output current of the DAC1. The DAC1 includes a battery block 10, a switch (SW) block 20, and a circuit block 35.

The battery block 10 includes n batteries (BT). Here, a battery in a k-th stage is referred to as a battery $BT_k$ (k is an integer of 0 to (n−1)). The switch block 20 includes n switches SW1. Between a node N2 and a node N3, n batteries $BT_0$ to $BT_{n-1}$ are electrically connected in parallel. Positive electrodes of the n batteries $BT_0$ to $BT_{n-1}$ are electrically connected to the node N2 via SW1[1] to SW1[n−1], respectively.

<Circuit Block 35>

The circuit block 35 includes a load 30, a switch 31, a switch 32, and a switch 33. A node N1 functions as an output node of the DAC1. A current (an analog signal) $I_{out}$ is output from the node N1. A low power supply voltage GND is input to the node N3. A voltage VCR is input to a node N4. The voltage VCR is a charge voltage for charging the battery block 10. The voltage GND is lower than VCR, and for example, may be a ground potential or 0 V.

The circuit block 35 has a function of controlling charging and discharging of the battery block 10. The switch 31 has a function of controlling the state of conduction between the node N1 and the node N2. The switch 32 has a function of controlling the state of conduction between the load 30 and the node N2. The switch 33 has a function of controlling the state of conduction between the node N4 and the node N2. When the DAC1 operates, the switches 31 and 32 are turned on and the switch 33 is turned off so that the battery block 10 is discharged. Alternatively, the switch 31 is turned on and the switches 32 and 33 are turned off so that the battery block 10 is discharged. To charge the battery block 10, the switches 31 and 32 are turned off and the switch 33 is turned on. The switches 31 to 33 function as control portions for controlling charging and discharging of the battery block 10. The configuration of the circuit 35 is not limited to the example of FIG. 1 as long as the DAC1 has a function of switching between a charging state and a discharging state. For example, in some cases, the load 30 and the switch 32 are not necessarily provided depending on a configuration or an operation method of a circuit connected to an output terminal of the DAC1.

<Switch Block 20>

The switch block 20 includes n-stage switches SW1. To the switch block 20, a signal D[n−1:0] is input. A signal D[k] has a function of controlling the on/off state of the SW1[k]. In the example of FIG. 1, in the case where the signal D[k] has a value "0", the corresponding switch SW1[k] is turned off, and in the case where the signal D[k] has a value "1", the switch SW1[k] is turned on.

<Battery Block 10>

The battery block 10 has a function as a current source for supplying n kinds of currents $I_{B0}$ to $I_{Bn-1}$. The battery block 10 includes n-stage batteries $BT_0$ to $BT_{n-1}$. The batteries $BT_0$ to $BT_{n-1}$ are power storage elements capable of being charged. The electromotive force of each of the batteries $BT_0$ to $BT_{n-1}$ is the same, and the capacities of the batteries $BT_0$ to $BT_{n-1}$ are different from one another. For example, in the case where the DAC1 is a binary DAC, the capacities of the batteries $BT_0$ to $BT_{n-1}$ are weighted by powers of two; the capacity of the battery $BT_k$ is $2^k$ times as high as that of the battery $BT_0$. When the battery block 10 is discharged and the switches SW1[0] to SW1[n−1] are turned on, the output current $I_{Bk}$ of the battery $BT_k$ is $2^k$ times as high as that of the current $I_{B0}$ if the output current of the $BT_0$ is $I_{B0}$.

The batteries $BT_0$ to $BT_{n-1}$ are preferably all-solid-state secondary batteries including a solid electrolyte, so that safety of the semiconductor device can be ensured, and circuits (e.g., the switch block 20 and the circuit block 35) and the batteries $BT_0$ to $BT_{n-1}$ can be easily manufactured on the same substrate in a semiconductor manufacturing process. The batteries $BT_0$ to $BT_{n-1}$ may be electric double layer capacitors. In the case of the electric double layer capacitors, the batteries $BT_0$ to $BT_{n-1}$ are preferably all-solid-state secondary batteries including a solid electrolyte for the above reason.

<Digital-Analog Conversion>

Operation of the DAC1 is described using an example where n is 3. In the case where a signal D[2:0] is "000", $I_{out}=0\times I_{B2}+0\times I_{B1}+0\times I_{B1}=0$ ampere. In the case where the signal D[2:0] is "001", $I_{out}=0\times I_{B2}+0\times I_{B1}+1\times I_{B0}=I_{B0}$. In the case where the signal D[2:0] is "010", $I_{out}=0\times I_{B2}+1\times I_{B1}+0\times I_{B0}=2I_{B0}$. In the case where the signal D[2:0] is "011", $I_{out}=0\times I_{B2}+1\times I_{B1}+1\times I_{B0}=3I_{B0}$.

That is, in the case where the digital signal D[n−1:0] is input to the DAC1, the $I_{out}$ becomes $(D[0]+2D[1]+2^2D[2]+\ldots+2^{n-1}D[n-1])I_{B0}$. Here, the signal D[k] is 0 or 1. As described above, the DAC1 has a function of outputting a current $I_{out}$ that is proportional to the digital value of the signal D[n−1:0], and is capable of functioning as a current output type DA converter.

The DAC1 is not restricted by the power supply voltage of the semiconductor device including the DAC1 because the DAC incorporates the battery block 10 functioning as a current source. The current $I_{out}$ depends on the capacities of the batteries $BT_0$ to $BT_{n-1}$. The change in the current $I_{out}$ by the change in the lowest bit, 1 bit, of the D[n−1:0] is based on the capacity of the battery $BT_0$. Thus, the capacity of the $BT_0$ is made small, so that the $I_{out}$ having a small value can be generated and the value of the current $I_{out}$ can be finely adjusted. In contrast, the capacity of the battery $BT_0$ is made large, so that the $I_{out}$ having a large value can be generated.

<Charging>

When the battery block 10 is charged, the switches 31 and 32 are turned off and the switch 33 is turned on so that the circuit block 35 is charged and the voltage VCR is supplied to the node N2. At that time, for example, in the switch block 20, the n-stage switches SW1[0] to SW1[n−1] may be turned on so that the n-stage batteries $BT_0$ to $BT_{n-1}$ are all charged. Alternatively, only the batteries in the stages which have been discharged by the operation of the digital-analog conversion of the battery block 10 may be charged. Such charging can be performed by making the circuit block 35 charged with the digital signal D[n−1:0] to be processed input. In the battery block 10, only the batteries which need to be charged are charged, whereby energy required for the charging can be reduced.

<<Circuit Configuration Example 1 of DA Converter>>

Figure 2:
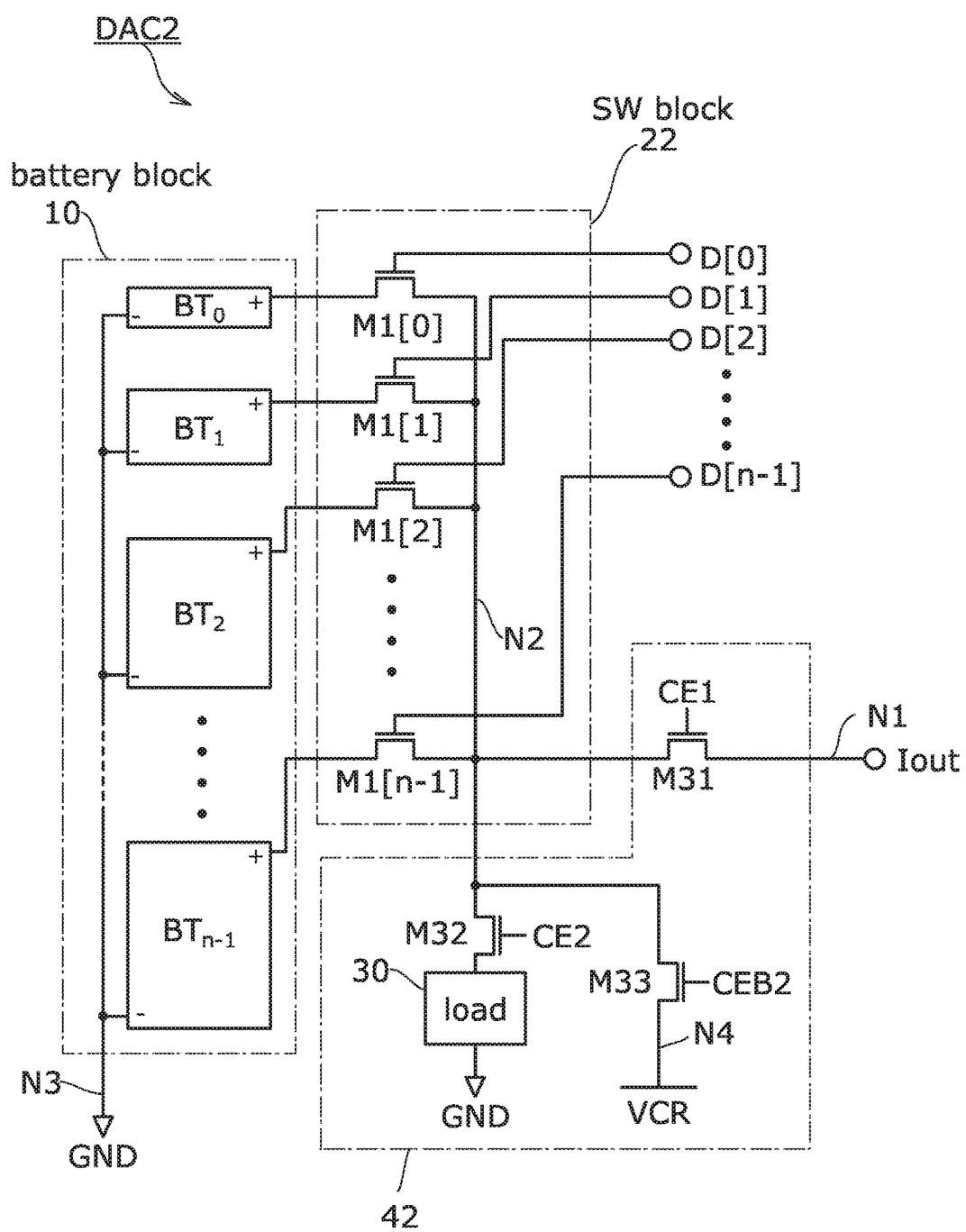
FIG. 2 is a circuit diagram illustrating a configuration example of a DAC.

FIG. 2 shows an example of a more specific circuit configuration of the DAC1. A DAC2 in FIG. 2 corresponds to a circuit in which n-channel transistors are used as the switches 31 to 33 and the switches SW1.

<Switch Block 22>

A switch block 22 includes n transistors M1. Signals D[0] to D[n−1] are input to gates of the transistors M1[0] to M1[n−1], respectively. Note that the transistors M1 may be p-channel transistors. In that case, an inverter circuit is provided for each of wirings to which the signals D[0] to D[n−1] are input, and inversion signals of the signals D[0] to D[n−1] are input to the gates of the transistors M1[0] to M1[n−1], respectively.

<Circuit Block 42>

A circuit 42 corresponds to a circuit in which n-channel transistors are used as the switches 31 to 33 of the circuit block 35. FIG. 2 shows an example in which different signals are input to gates of transistors M31 and M32. A signal CE1 is input to the gate of the transistor M31 and a signal CE2 is input to the gate of the transistor M32. A signal CEB2 is input to a gate of a transistor M33. The signal CEB2 is an inversion signal of the signal CE2. With such a structure, timing of output of an analog signal can be changed as appropriate. The signal CE2 may be input to the gate of the transistor M31. Alternatively, a signal different from the signal CEB2 may be input to the transistor M33 so that the on/off state of the transistor M33 is controlled independently of the on/off states of the transistors M31 and M32.

The transistors M31 to M33 may be n-channel transistors or p-channel transistors. For example, in the case where the transistor M32 is an n-channel transistor and the transistor M33 is a p-channel transistor, the signal CE2 can be input to the gate of the transistor M33, so that the number of signals can be reduced.

<<Circuit Configuration Example 2 of DA Converter>>

Figure 3:
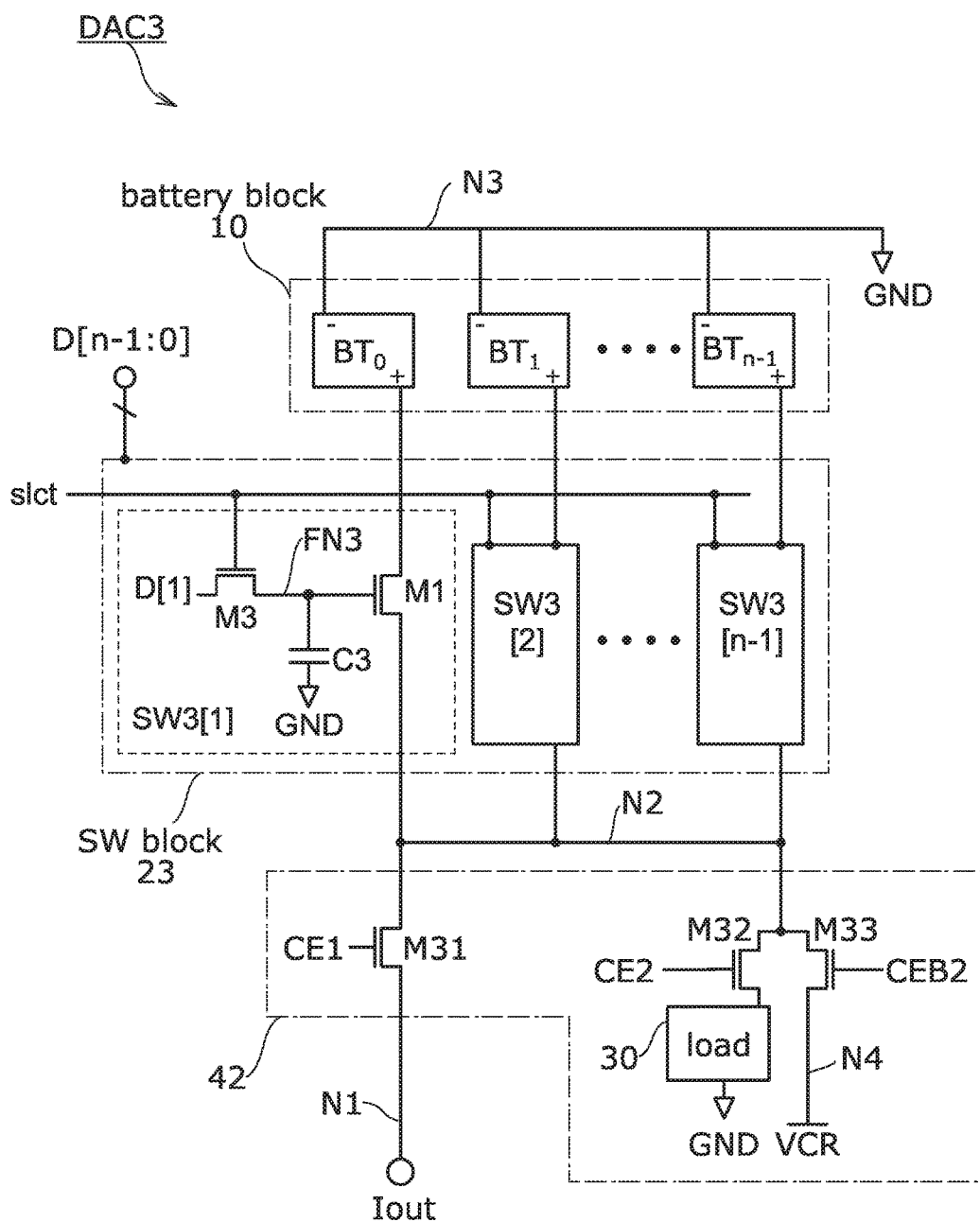
FIG. 3 is a circuit diagram illustrating a configuration example of a DAC.

A DAC 3 in FIG. 3 is a modification example of the DAC2 in FIG. 2, and has a difference in the circuit configuration of a switch block. To a switch block 23, a digital signal D[n−1:0] and a signal slct are input. The switch block 23 includes n-stage switches SW3. A switch SW3[k] is a circuit having a function of controlling the conduction state between a positive electrode of the battery $BT_k$ and the node N2.

<Switch SW3>

The switch SW3[k] is provided with a holding circuit which holds the voltage of the gate of the transistor M1. The holding circuit has a memory structure including one transistor and one capacitor, and includes a node FN3, a transistor M3, and a capacitor C3. The switch SW3[k] has a function of holding a voltage corresponding to the voltage of a signal D[k] at the node FN3. The capacitor C3 can function as a storage capacitor which holds the voltage at the node FN3. The transistor M3 can function as a writing transistor.

The signal slct is input to the gate of the transistor M3. The signal D[k] is input to a source of the transistor M3. A drain of the transistor M3 is referred to as the node FN3. At the node FN3, the gate of the transistor M1 and the capacitor C3 are electrically connected. The on/off state of the transistor M1 is controlled by the voltage at the node FN3.

To write the signal D[k] to the SW3[k], the transistor M3 is turned on by the signal slct. When the value of the signal D[k] is "0", the node FN3 is at an L level, when the value of the signal D[k] is "1", the node FN3 is at an H level. The amplitude of the signal D[k] is determined so that the transistor M1 is turned off when the node FN3 is at the L level and that the transistor M1 is turned on when the node FN3 is at the H level.

When the transistor M3 is turned off by the signal slct, the node FN3 is an electrically floating state and the SW3[k] holds data. That is, the transistor M1 can be turned on or turned off depending on the value of the signal D[k]. Because the state of the transistor M1 is determined by the voltage at the node FN3, a change in the voltage at the node FN3 in the data holding state is preferably suppressed. Thus, the off-state current of the transistor M3 is preferably as low as possible.

Extremely low off-state current means that, for example, off-state current per micrometer of channel width is lower than or equal to 100 zA (z represents zepto and denotes a factor of $10^{-21}$). Since the off-state current is preferably as low as possible, the normalized off-state current is preferably lower than or equal to 10 zA/fpm or lower than or equal to 1 zA/μm, more preferably lower than or equal to 10 yA/μm (y represents yocto and denotes a factor of $10^{-24}$).

In order to make the off-state current of the transistor extremely low, a channel of the transistor is formed in a semiconductor whose bandgap is wide, for example, a semiconductor whose band gap is greater than or equal to 3.0 eV. As an example of such a semiconductor, an oxide semiconductor containing a metal oxide can be given. A transistor including an oxide semiconductor in its channel (hereinafter also referred to as an OS transistor) has low leakage current due to thermal excitation and extremely low off-state current.

An oxide semiconductor of an OS transistor preferably contains at least one of indium (In) and zinc (Zn). Typical examples of the oxide semiconductor of the OS transistor include an In—Ga—Zn oxide and an In—Sn—Zn oxide. By reducing impurities serving as electron donors, such as moisture or hydrogen, and also reducing oxygen vacancies, an i-type (intrinsic) or a substantially i-type oxide semiconductor can be obtained. Here, such an oxide semiconductor is referred to as a highly purified oxide semiconductor. By forming the channel using a highly purified oxide semiconductor, the off-state current of the OS transistor that is normalized by channel width can be as low as several yoctoamperes per micrometer to several zeptoamperes per micrometer. Note that the oxide semiconductor and the OS transistor are described in detail in Embodiment 3.

Unless otherwise specified, the off-state current in this specification refers to a drain current of a transistor in the off state (also referred to as non-conduction state and cutoff state). Unless otherwise specified, the off state of an n-channel transistor means that a potential difference (Vgs) between its gate and source is lower than the threshold voltage (Vth), and the off state of a p-channel transistor means that Vgs is higher than Vth. For example, the off-state current of an n-channel transistor sometimes refers to a drain current that flows when the gate-source voltage Vgs is lower than the threshold voltage Vth.

The off-state current of a transistor depends on Vgs in some cases. Thus, "the off-state current of a transistor is smaller than or equal to I" means "there is Vgs with which the off-state current of a transistor becomes smaller than or equal to I" in some cases. Furthermore, "the off-state current of a transistor" means "the off-state current in an off state at predetermined Vgs", "the off-state current in an off state at Vgs in a predetermined range", "the off-state current in an off state at Vgs with which sufficiently reduced off-state current is obtained", or the like.

As an example, the assumption is made of an n-channel transistor where the threshold voltage Vth is 0.5 V and the drain current is $1\times10^{-9}$ A at Vgs of 0.5 V, $1\times10^{-13}$ A at Vgs of 0.1 V, $1\times10^{-19}$ A at Vgs of −0.5 V, and $1\times10^{-22}$ A at Vgs of −0.8 V. The drain current of the transistor is $1\times10^{-19}$ A or lower at Vgs of −0.5 V or at Vgs in the range of −0.8 V to −0.5 V; therefore, it can be said that the off-state current of the transistor is $1\times10^{-19}$ A or lower. Since there is Vgs at which the drain current of the transistor is $1\times10^{-22}$ A or lower, it may be said that the off-state current of the transistor is $1\times10^{-22}$ A or lower.

The off-state current of a transistor depends on temperature in some cases. Unless otherwise specified, the off-state current in this specification may be an off-state current at room temperature, 60° C., 85° C., 95° C., or 125° C. Alternatively, the off-state current may be an off-state current at a temperature at which the reliability required for a semiconductor device or the like including the transistor is ensured or a temperature at which the semiconductor device or the like including the transistor is used (e.g., temperature in the range of 5° C. to 35° C.). The description "an off-state current of a transistor is lower than or equal to I" may mean that there is Vgs at which the off-state current of a transistor is lower than or equal to I at room temperature, 60° C., 85° C., 95° C., 125° C. a temperature at which the reliability required for a semiconductor device or the like including the transistor is ensured, or a temperature at which the semiconductor device or the like including the transistor is used (e.g., temperature in the range of 5° C. to 35° C.).

In this specification, unless otherwise specified, the description "an off-state current of a transistor is lower than or equal to I" may mean that there is Vgs at which the off-state current of a transistor is lower than or equal to I at Vds of 0.1 V, 0.8 V, 1 V, 1.2 V, 1.8 V, 2.5 V, 3 V, 3.3 V, 10 V, 12 V, 16 V, or 20 V, at Vds at which the required reliability of a semiconductor device or the like including the transistor is ensured, or at Vds at which in the semiconductor device or the like including the transistor is used.

In the above description of an off-state current, a drain may be replaced with a source. That is, the off-state current sometimes refers to a current that flows through a source of a transistor in the off state. In this specification, the term "leakage current" sometimes expresses the same meaning as off-state current. In this specification, the off-state current sometimes refers to a current that flows between a source and a drain when a transistor is off, for example.

<Digital-Analog Conversion>

The circuit block 42 is discharged. Here, the transistor M31 is turned off by the signal CE1. A signal slct at an H level and a digital signal D[n−1:0] with a predetermined value are input to the switch block 23, so that the value of the digital signal D [n−1:0] is written to the switch block 23. That is, the values of the signals D[0] to D[n−1] are written to the switches SW3[0] to SW3[n−1], respectively.

To output an analog current $I_{out}$ from the DAC3, the signal slct is set at an L level and the signal CE1 is set at an H level. The current $I_{out}$ corresponding to the digital value of the signal D[n−1:0] is output from the DAC3 since the switch SW3[k] in a stage corresponding to a bit with a value 1 in the signal D[n−1:0] is turned on.

In the n-stage switches SW3, digital data is held at the nodes FN3. Thus, even when power to the semiconductor device including the DAC3 is interrupted, the DAC3 can output the current $I_{out}$ while the charge capacity of the battery remains. Thus, when the semiconductor device is restarted, an analog current $I_{out}$ the amount of which is substantially the same amount as that at the interruption of the power can be output from the DAC3. Accordingly, the time and the energy required for the rise of the semiconductor device can be reduced.

<Charging>

Because the switch(es) SW3 in a stage corresponding to a bit with a value 1 in the signal D[n−1:0] is/are turned on and the switch(es) SW3 in the other stages is/are turned off, the discharge stage of the circuit block 42 allows the batteries $BT_0$ to $BT_{n-1}$ in the stage where the switches SW3 is turned on to be charged and the batteries $BT_0$ to $BT_{n-1}$ in the other stages not to be charged. That is, only the stages of the batteries $BT_0$ to $BT_{n-1}$ which have been discharged by the operation of the digital-analog conversion, may be charged, so that energy required for the charging can be reduced.

In the case where all the batteries $BT_0$ to $BT_{n-1}$ in the battery block 10 are charged, the charging operation is performed after the signal D[n−1:0] all bits of which are "1" is written to the switch block 23. Alternatively, in the case where the batteries $BT_0$ to $BT_{n-1}$ are selectively charged, the charging operation is performed after the signal D[n−1:0] which turns on the switch SW3 in a stage with the batteries to be charged is written to the switch block 23.

<<Voltage Output Type DAC>>

Figure 4:
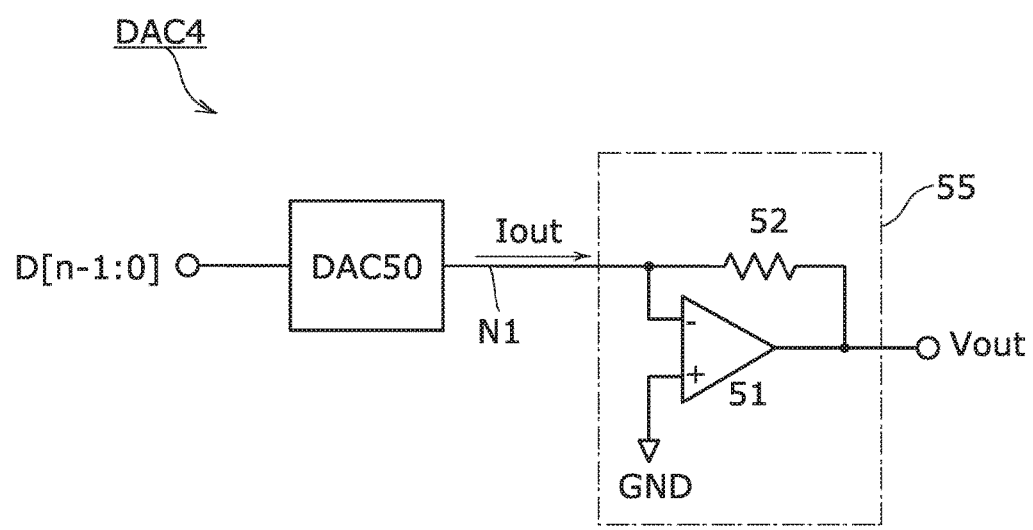
FIG. 4 is a block diagram illustrating a configuration example of a DAC.

The DAC1 to DAC3 are circuits for outputting an analog current $I_{out}$. In the case where an analog voltage needs to be generated from the signal D[n−1:0], a current-voltage converter circuit is connected to the output node N1 of each of the DAC1 to DAC3. A DAC4 in FIG. 4 is a voltage output type DA converter. The DAC4 includes a DAC50 and a circuit 55. Any of the DAC1 to DAC3 can be used as the DAC50. The circuit 55 has a function of converting an analog current $I_{out}$ into an analog voltage $V_{out}$. The circuit 55 includes an operational amplifier 51 and a resistor 52.

Embodiment 2

Any of the DACs described in Embodiment 1 can be incorporated in a variety of semiconductor devices. In this embodiment, a semiconductor device including the DAC is described.

<<Configuration Example 1 of Oscillator Circuit>>

Figure 5:
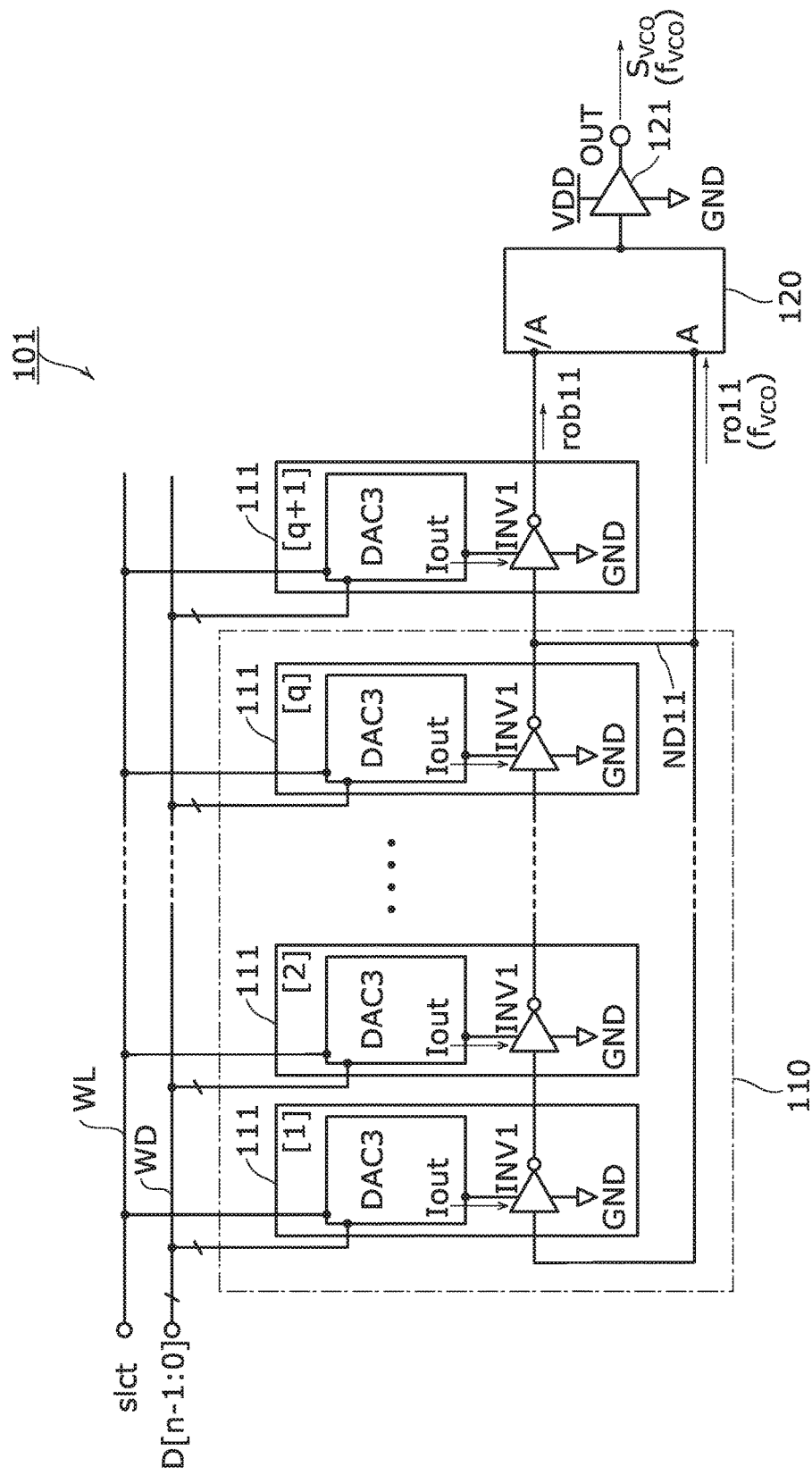
FIG. 5 is a block diagram illustrating a configuration example of an oscillator circuit.

FIG. 5 is a block diagram showing a configuration example of an oscillator circuit. A circuit 101 in FIG. 5 includes (q+1) circuits 111 (q is an odd number greater than 1 and less than n), a circuit 120, and a buffer circuit 121. The (q+1) circuits 111 are electrically connected to a wiring group WD and a wiring WL. An n-bit digital signal D[n−1:0] is input to the wiring group WD, and a signal slct is input to the wiring WL. The oscillation frequency $f_{VCO}$ of an output signal $S_{VCO}$ of the circuit 101 can be changed by the digital signal D[n−1:0]. A voltage VDD is a high power supply voltage of the circuit 101. A voltage GND is a low power supply voltage of the circuit, which is lower than the voltage VDD.

Each circuit 111 includes an inverter circuit INV1 and the DAC3 (see FIG. 3). In each circuit 111, an output terminal of the inverter circuit INV1 is electrically connected to an input terminal of the inverter circuit INV1 in the circuit 111 in a next stage. An output terminal of the inverter circuit INV1 in an q-th-stage circuit 111 is electrically connected to an input terminal of the inverter circuit INV1 in a first-stage circuit 111 and an input terminal of the inverter circuit INV1 in an (q+1)-th-stage circuit 111. A circuit 110 includes q circuits 111 that are electrically connected in a ring shape, and can operate as a ring oscillator circuit. A node ND11 is an output node of the circuit 110, and a signal ro11 at an oscillation frequency $f_{VCO}$ is output from the circuit 110.

The circuit 120 has a function of changing the potential level of an input signal of an input terminal A. The circuit 120 can be a level shifter circuit, for example. A signal whose potential level is inverse of that of the input signal of the terminal A is input to a terminal/A. The circuit 120 can perform level shift operation in which respective amplitudes of the input signals at the input terminal A and the terminal/A are increased. Furthermore, in the example of FIG. 5, a signal $S_{VCO}$ that is obtained by level-shifting the input signal at the input terminal A is output from an output terminal of the circuit 120. The oscillation frequency of the signal $S_{VCO}$ is $f_{VCO}$. A circuit 111[q+1] is provided so as to generate an inversion signal rob11 of the signal ro11.

The DAC3 is electrically connected to the wiring group WD and the wiring WL. Although not shown, signals CE1 and CE2 for controlling charging and discharging are input to the DAC3. The DAC3 is electrically connected to a node to which the high power supply voltage of the inverter circuit INV1 is supplied. The delay time of the inverter circuit INV1 can be controlled by an analog current $I_{out}$ output from the DAC3. The oscillation frequency $f_{VCO}$ is determined by the delay time of each inverter circuit INV1 in the circuit 110. The oscillation frequency $f_{VCO}$ of the circuit 111 can be determined by the digital signal D[n−1:0].

The oscillation frequency $f_{VCO}$ of the output signal ro11 of the circuit 110 can be controlled by the digital signal D[n−1:0]; however, the amplitude of the output signal ro11 is also changed. Thus, in order to make the amplitude of the signal $S_{VCO}$ constant regardless of the value of the digital signal D[n−1:0], it is effective to provide the circuit 120 at an output stage of the circuit 101. The buffer circuit 121 is provided as appropriate.

The circuit 111 has a function of storing the delay time of the inverter circuit INV1. In other words, the circuit 111 has a function of storing digital data (a value of the signal D[n−1:0]) for setting the delay time of the inverter circuit INV1. Thus, writing operation of the digital signal D[n−1:0] is not required every time the circuit 101 is started up and oscillation at a predetermined frequency f to is possible without delay.

<<Configuration Example 2 of Oscillator Circuit>>

Figure 6:
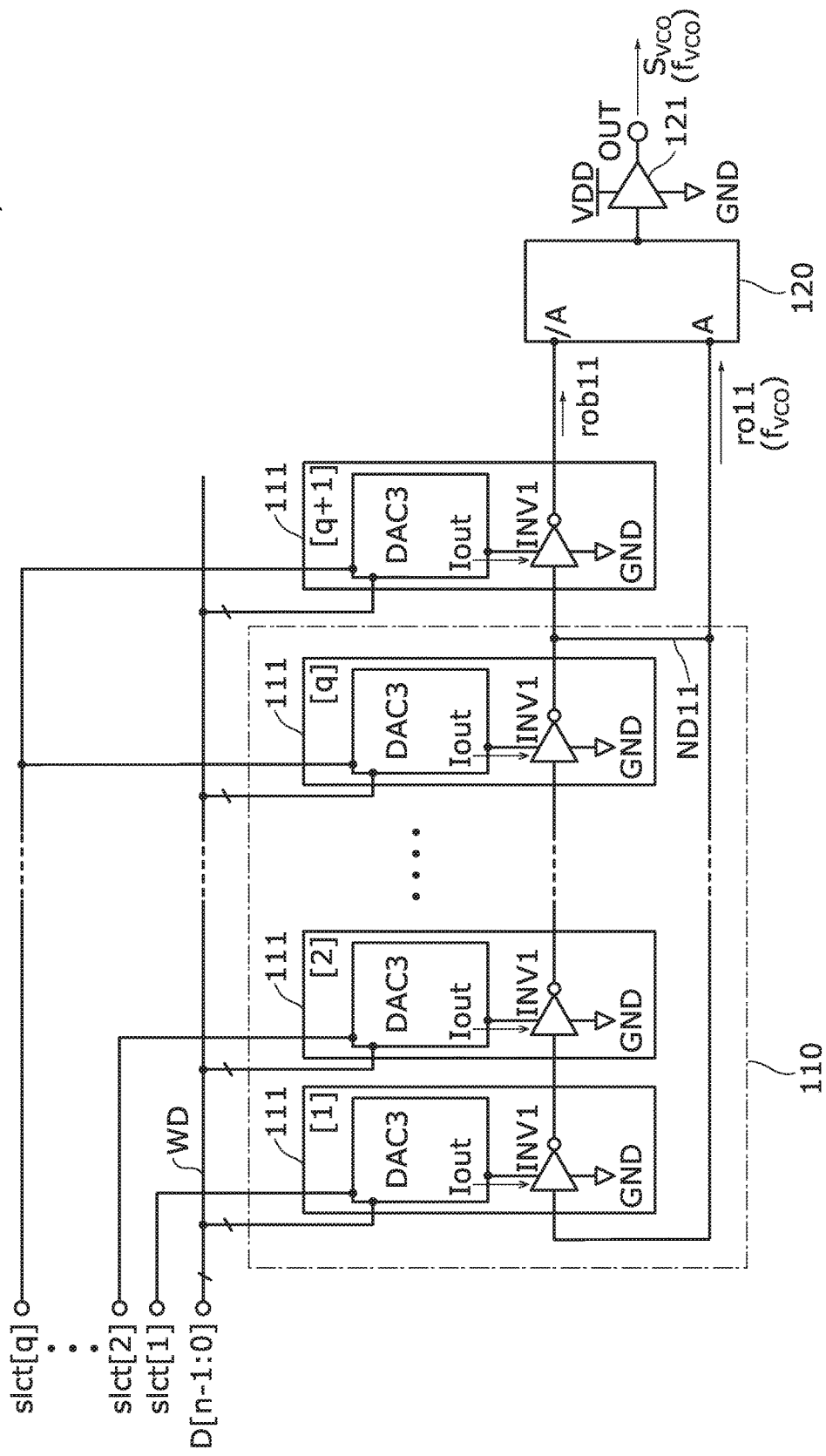
FIG. 6 is a circuit diagram illustrating a configuration example of an oscillator circuit.

FIG. 6 shows a modification example of the circuit 101 in FIG. 5. In the circuit 101 in FIG. 5, the same digital signal D[n−1:0] is written to the DAC3 in each stage of the circuit 110. In the circuit 102 in FIG. 6, different digital signals D[n−1:0] can be written to the DACs 3 in the stages of the circuit 110.

In the circuit 102, q wirings WL are provided and different signals slct can be input to the first- to q-th-stage circuits 111. The circuit 111 in a (q+1)-th stage is electrically connected to a wiring WL[q], and a signal slct[q] is input to the circuit 111 in the (q+1)-th stage.

In the circuit 102, different digital signals D[n−1:0] can be stored in the DACs 3 in the stages of the circuit 110; thus, fine adjustment of the oscillation frequency $f_{VCO}$ in the circuit 102 is easier than that in the circuit 101.

<<Configuration Example 3 of Oscillator Circuit>>

In the circuit 101 in FIG. 5, the DAC2 (FIG. 2) can be used instead of the DAC3. In that case, the wiring WL is omitted.

<<Configuration Example of PLL>>

Figure 7:
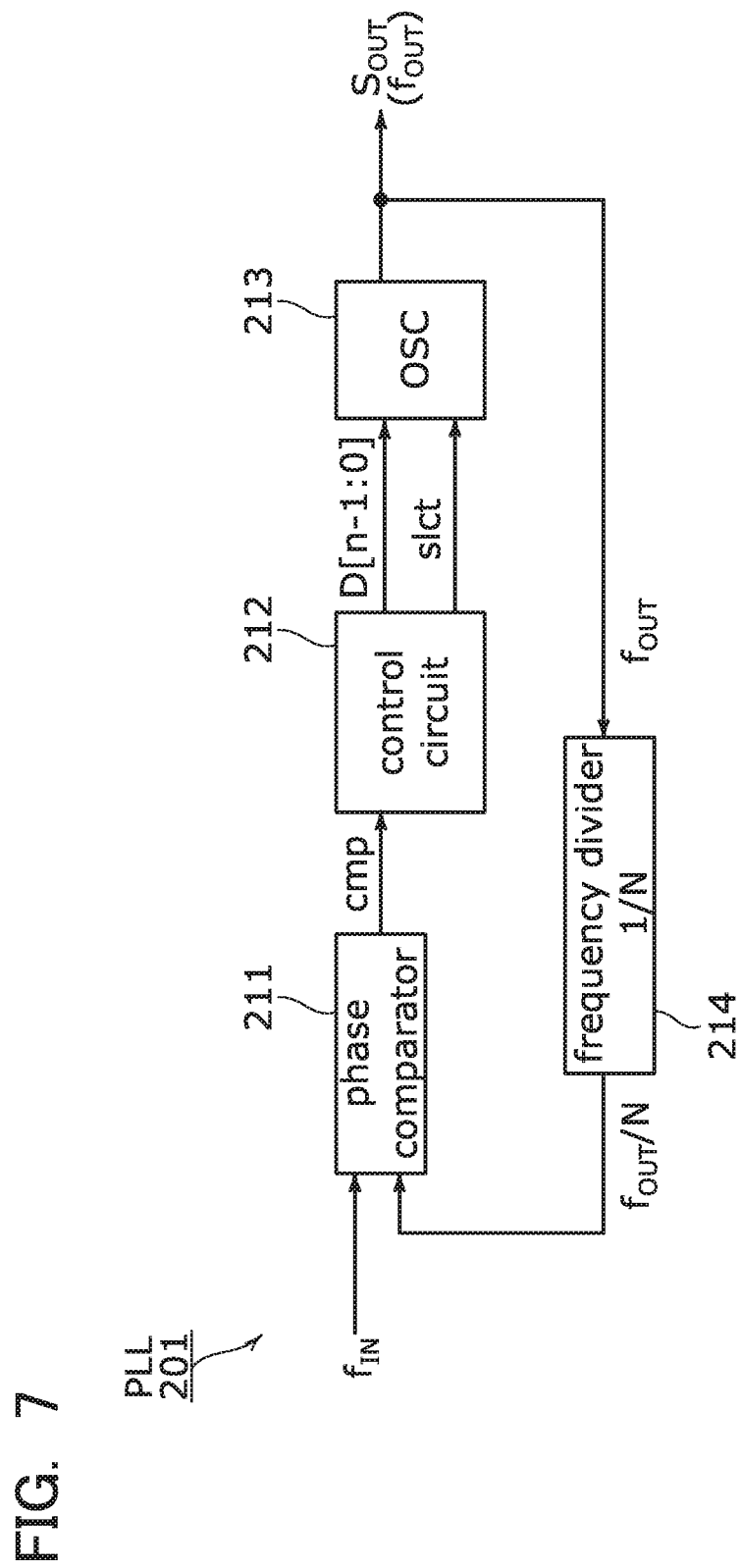
FIG. 7 is a block diagram illustrating a configuration example of a phase locked loop.

FIG. 7 shows an example of a phase locked loop (PLL). The oscillator circuit described above can be used as an oscillator circuit of the PLL. A PLL 201 illustrated in FIG. 7 includes a phase comparator 211, a control circuit 212, an oscillator circuit (OSC) 213, and a frequency divider 214. The PLL 201 has a function of outputting a signal $S_{OUT}$ at an oscillation frequency $f_{OUT}$. For example, the signal Sour is input to another circuit as a clock signal.

The frequency divider 214 has a function of generating a signal whose frequency is 1/N times (N is an integer of two or more) the frequency of an alternating-current signal that is input. In the example of FIG. 7, the frequency divider 214 output a signal at a frequency $f_{OUT}/N$. The phase comparator 211 has a function of detecting a phase difference between two input signals and outputting the detection result as a voltage signal cmp. In the example of FIG. 7, the phase comparator 211 outputs a phase difference between a signal at a frequency $f_{IN}$ and a signal at a frequency $f_{OUT}/N$ as the voltage signal cmp. The control circuit 212 has a function of generating a digital signal D[n−1:0] and a signal slct in accordance with the voltage signal cmp and the like.

The circuit 101 in FIG. 5 or the circuit 102 in FIG. 6 can be used as the OSC 213. In the case of using the circuit 102, q signals slct are generated in the control circuit 212.

After the OSC 213 is tuned so that the PLL 201 oscillates at a desired frequency, the OSC 213 can output a signal at a predetermined frequency even when power of peripheral circuits other than the OSC 213 is turned off. Furthermore, when the PLL 201 is restarted after the power of the whole PLL 201 is shut off, the PLL 201 can instantly output a signal which oscillates at a frequency similar to the frequency used before the power shutdown even without performing the tuning of the OSC 213. With the use of the circuits 101 and 102 in this manner, a PLL capable of quick restarting can be provided.

When it is not necessary to store an oscillation frequency in the PLL 201, an oscillator circuit described in Configuration example 3 can be used as the OSC 213.

Any of the oscillator circuits or the PLL 201 in this embodiment can be incorporated into various semiconductor devices as a circuit generating a clock signal.

The PLL can be incorporated into a processing unit, and can function as a clock generation circuit. Examples of the processing unit include a central processing unit (CPU), a graphics processing unit (GPU), a programmable logic device (PLD), a digital signal processor (DSP), a microcontroller unit (MCU), a custom LSI, and a wireless IC which can send and receive data wirelessly. When the PLL is incorporated in the wireless IC, a carrier wave or a clock signal synchronized with a demodulated signal can be generated.

<<Configuration Example of Analog-Digital Converter Circuit>>

Figure 8:
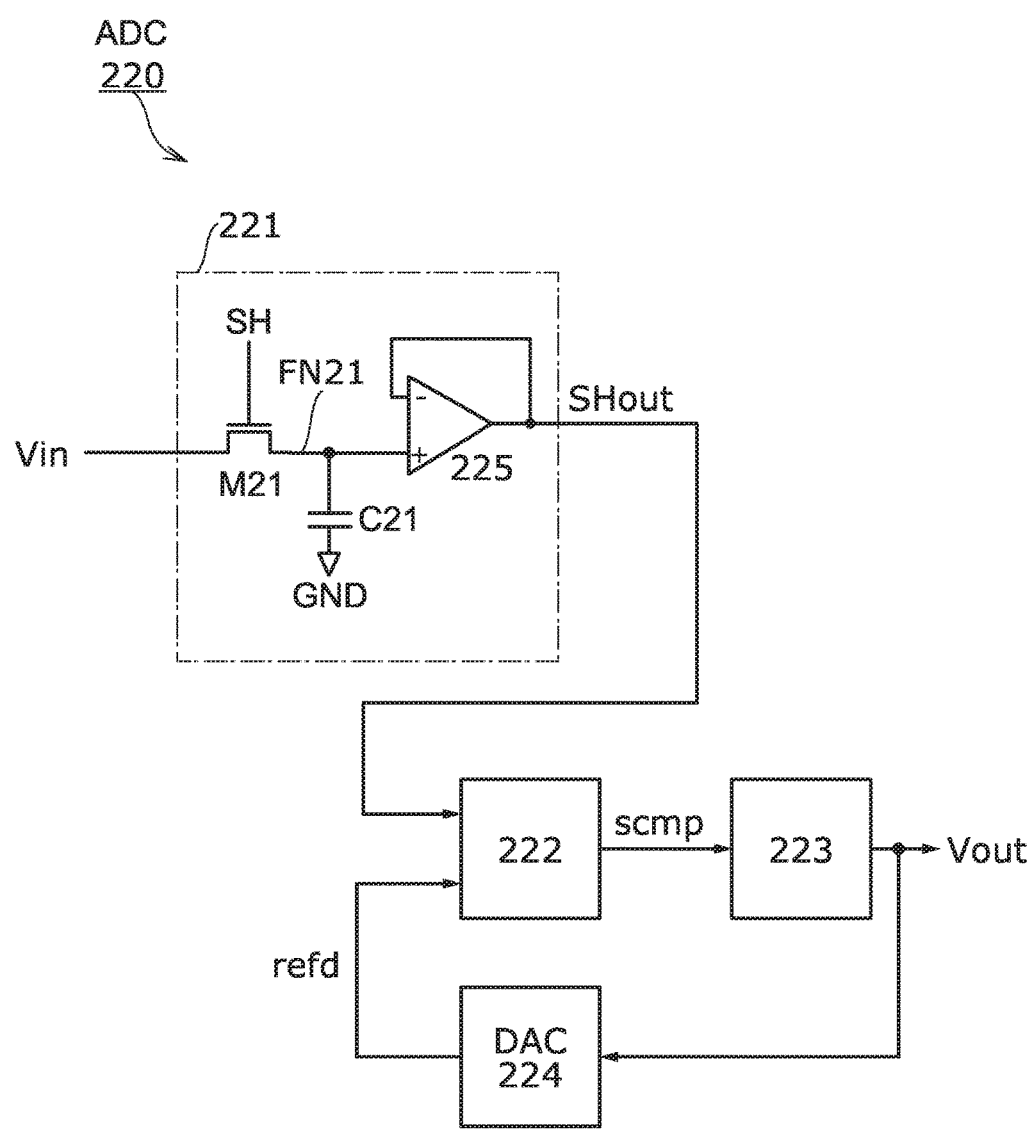
FIG. 8 is a block diagram illustrating a configuration example of an analog-digital converter circuit (ADC)

FIG. 8 shows an example of a successive approximation ADC. An ADC 220 in FIG. 8 has a function of converting an analog voltage $V_{in}$ into a digital signal $V_{out}$. The ADC 220 includes a sample-and-hold circuit 221, a comparator 222, a successive conversion comparator 223, and a DAC 224.

The sample-and-hold circuit 221 has a function of holding a voltage $V_{in}$ that is input and outputting it to the comparator 222. The sample-and-hold circuit 221 includes a transistor M21, a capacitor C21, and an operational amplifier 225. A signal SH is input to a gate of the transistor M21. The transistor M21 and the capacitor C21 can function as a sample-and-hold circuit, which does not require power for data holding. With the signal SH, a sampling operation and a holding operation can be controlled. During the holding operation, a change in the voltage of the node FN21 is preferably suppressed as much as possible. Accordingly, the transistor M21 is preferably a transistor having extremely low off-state current, for example, an OS transistor. The operational amplifier 225 is provided so as to amplify the voltage at the node FN21. An output signal $SH_{out}$ of the sample-and-hold circuit 221 is an analog signal.

The comparator 222 has a function of successively approximating the output signal $SH_{out}$ of the sample-and-hold circuit 221 and an output signal refd of the DAC224. The comparator 222 outputs a signal scmp corresponding to the result of the successive approximation. The successive conversion comparator 223 has a function of successively setting the value of a digital signal per bit and generating the digital signal $V_{out}$. The DAC 224 converts the digital signal $V_{out}$ output from the successive conversion comparator 223 into the analog signal refd. The signal refd is output to the comparator 222 as reference data. As the DAC 224, the voltage output type DAC 4 in FIG. 4 can be used.

<<Driver Circuit>>

Any of the DACs described in Embodiment 1 can be used as a driver circuit which drives basic circuits arranged in matrix. For example, any of the DACs can be used as a signal line driver circuit which drives a signal line of an active matrix display device. In the signal line driver circuit, any of the DACs is provided so as to convert a grayscale signal that is a digital signal into an analog signal.

Any of the DACs described in Embodiment 1 can be used as a column driver circuit of a memory device and the like. Any of the DACs is provided as the column driver circuit of the memory device so as to convert a digital signal that is to be written to a memory cell array of the memory device to an analog signal. As examples of a semiconductor device including any of the DACs, a display device and a memory device are described.

<Display Device>

Figure 9:
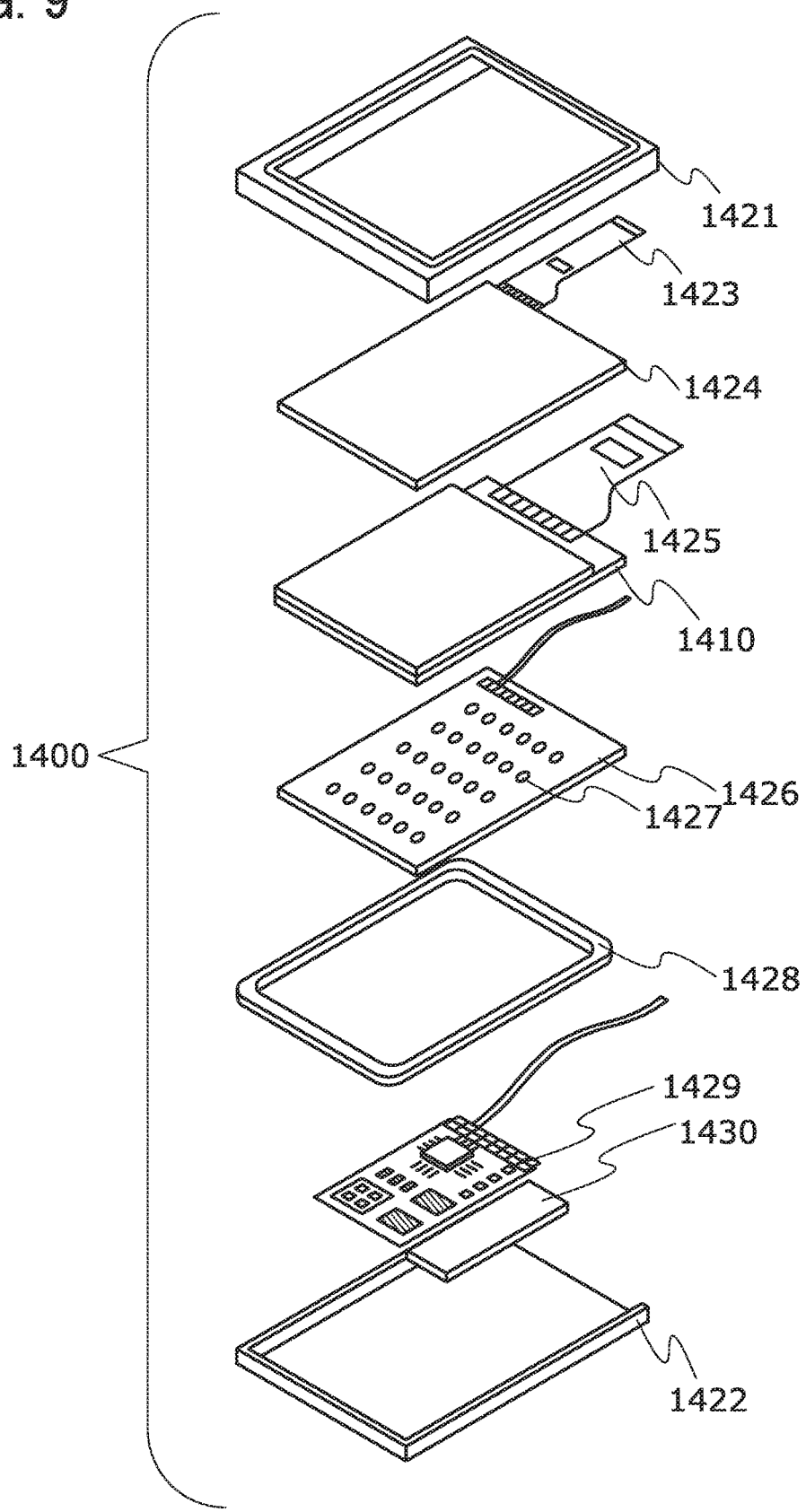
FIG. 9 is a perspective exploded view showing an example of a display device.

As shown in FIG. 9, in a display device 1400, a touch panel unit 1424 connected to an FPC 1423, a display panel 1410 connected to an FPC 1425, a backlight unit 1426, a frame 1428, a printed board 1429, and a battery 1430 are provided between an upper cover 1421 and a lower cover 1422. Note that the backlight unit 1426, the battery 1430, the touch panel unit 1424, and the like are not provided in some cases. For example, in the case where the display device 1400 is a reflective liquid crystal display device or an electroluminescent (EL) display device, the backlight unit 1426 is unnecessary. The display device 1400 may be additionally provided with a member such as a polarizing plate, a retardation plate, or a prism sheet.

The shapes and sizes of the upper cover 1421 and the lower cover 1422 can be changed as appropriate in accordance with the sizes of the touch panel unit 1424 and the display panel 1410.

The display panel 1410 includes a pixel portion including a plurality of pixels, a signal line driver circuit, and a scan line driver circuit. In the pixel portion, the pixels are arranged in an array. Any of the DACs described above can be incorporated in the signal line driver circuit.

The touch panel unit 1424 includes a resistive touch panel or a capacitive touch panel. The touch panel is arranged so as to overlap with the pixel portion of the display panel 1410. It is also possible to provide a touch panel function for a counter substrate (sealing substrate) of the display panel 1410. A photosensor may be provided in each pixel of the display panel 1410 to form an optical touch panel. An electrode for a touch sensor may be provided in each pixel of the display panel 1410 so that a capacitive touch panel is obtained.

The backlight unit 1426 includes a light source 1427. The light source 1427 may be provided at an end portion of the backlight unit 1426 and a light diffusing plate may be used.

The frame 1428 protects the display panel 1410 and functions as an electromagnetic shield for blocking electromagnetic waves generated by the operation of the printed board 1429. The frame 1428 may function as a radiator plate.

The printed board 1429 includes a power supply circuit and a signal processing circuit for outputting a video signal and a clock signal. The PLL described above can be incorporated in the signal processing circuit. A clock signal generated in the PLL is supplied to the signal line driver circuit and the scan line driver circuit of the display panel 1410, and a driver circuit of the touch panel unit. A part of or the whole of the signal line driver circuit of the touch panel unit may be provided for the printed board 1429. A part of or the whole of the scan line driver circuit may be provided for the printed board 1429. A part of or the whole of the driver circuit of the touch panel unit may be provided for the printed board 1429. As a power supply for supplying power to the power supply circuit, an external commercial power supply or a power supply using the battery 1430 provided separately may be used. The battery 1430 can be omitted in the case of using a commercial power supply.

《Configuration Example of Memory Device》

Figure 10:
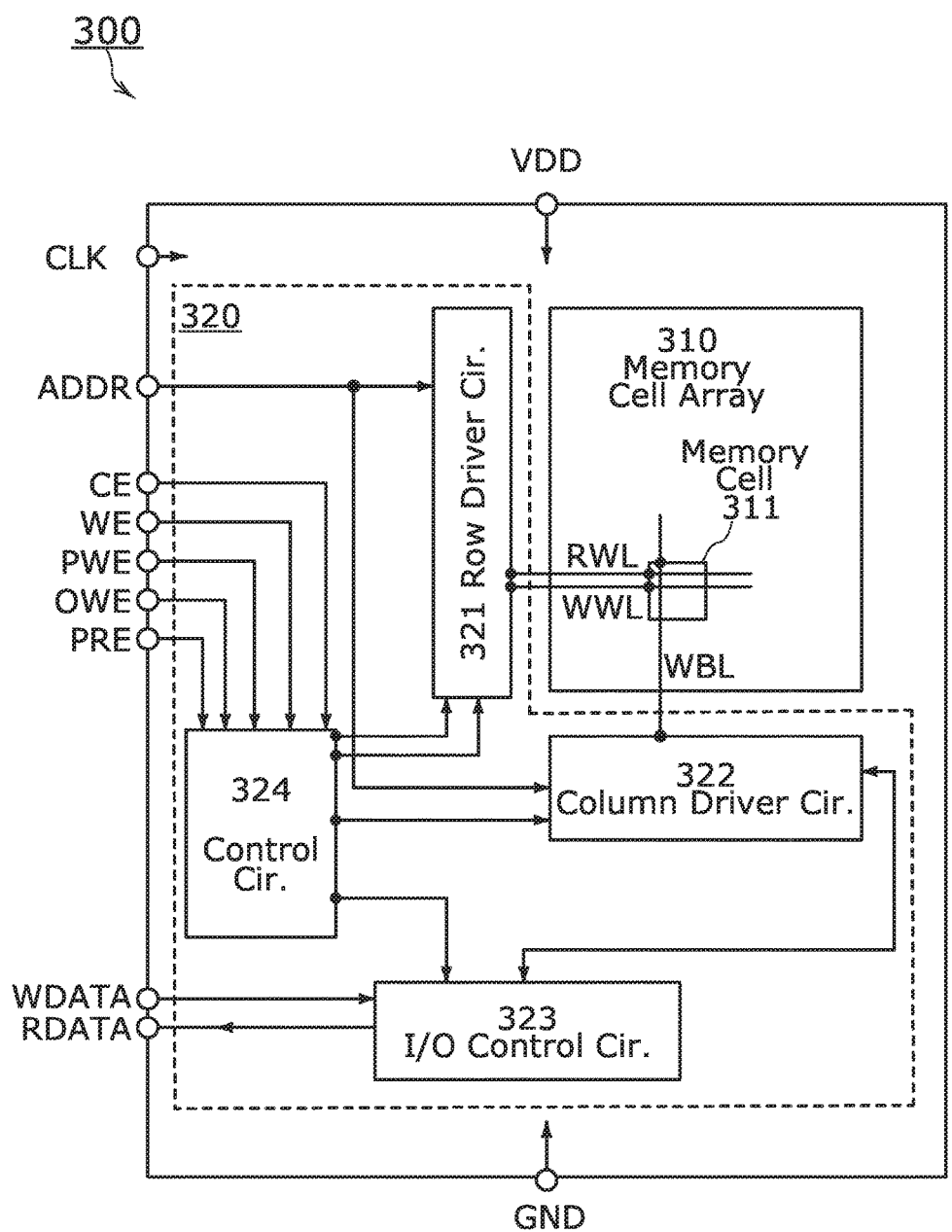
FIG. 10 is a block diagram illustrating a configuration example of a memory device.

A memory device 300 in FIG. 10 can be used as a random access memory.

The memory device 300 includes a memory cell array 310 and a peripheral circuit 320. In the memory cell array 310, a plurality of memory cells 311 are arranged in an array. The memory cells 311 are connected to a wiring WWL, a wiring RWL, a wiring WBL, and a wiring RBL. The peripheral circuit 320 includes, for example, a row driver circuit 321, a column driver circuit 322, an input/output (I/O) control circuit 323, and a control circuit 324.

To the memory device 300, a low power supply voltage GND, a high power supply voltage VDD are supplied from the outside. Furthermore, a clock signal CLK, control signals (CE, WE, PWE, OWE, and PRE), an address signal ADDR (hereinafter referred to as an ADDR), and a data signal WDATA are input to the memory device 300 from the outside. The ADDR is input to the row driver circuit 321 and the column driver circuit 322. The data signal WDATA is input to the input/output (I/O) control circuit 323.

The I/O control circuit 323 has functions of controlling writing of the data signal WDATA to the memory cell array 310, controlling reading of data from the memory cell array 310, and generating a data signal RDATA from data read from the memory cell array 310, for example.

The row driver circuit 321 has a function of decoding the ADDR and generating a signal that selects a row of the memory cell array 310, to which data is written and from which data is read. Specifically, the row driver circuit 321 generates a signal that drives or selects the wiring WWL and the wiring RWL in accordance with the decoded result of the ADDR.

The column driver circuit 322 has a function of selecting a column of the memory cell array 310, to which data is written or from which data is read, after decoding the ADDR, and controlling voltages of the wiring WWL and the wiring RWL. Furthermore, the column driver circuit 322 has functions of temporarily holding data read from the memory cell array 310, and holding a data signal output from the I/O control circuit 323.

The control circuit 324 is a circuit for controlling the whole memory device 300. The control circuit 324 processes the signals CE, WE, PWE, OWE, and PRE input from the outside and generates control signals of circuits included in the peripheral circuit 320. A chip enable signal is referred to as CE, and write enable signals are referred to as WE, PWE, and OWE. The write enable signal WE allows data to be written from the I/O control circuit 323 to the column driver circuit 322. The write enable signal PWE allows data to be written from the column driver circuit 322 to the memory cell array 310. The write enable signal OWE allows data to be written from the column driver circuit 322 to the I/O control circuit 323. A read enable signal, which is referred to as PRE, allows data to be read from the memory cell array 310 to the column driver circuit 322. The signals that the control circuit 324 processes are not limited to them. If necessary, another control signal may be input to the control circuit 324, or the above signals are not necessarily input.

<Memory Cell Array>

Figure 11:
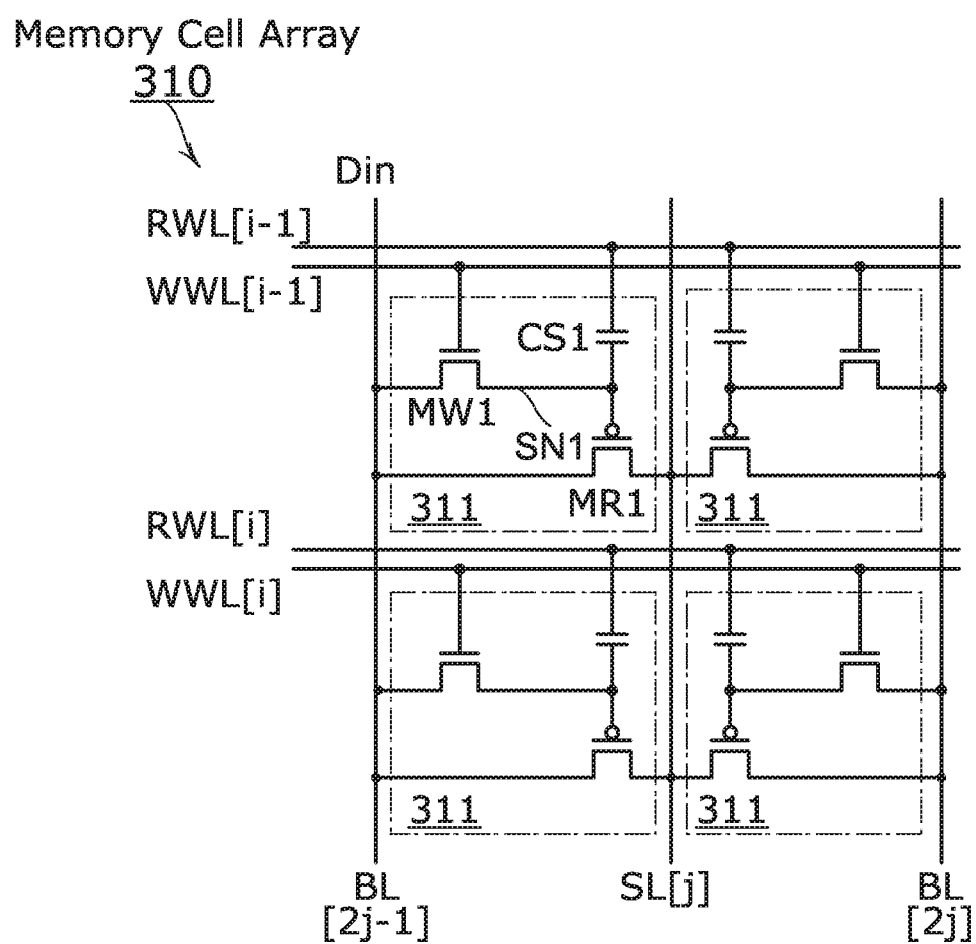
FIG. 11 is a circuit diagram illustrating a configuration example of a memory cell array.

FIG. 11 is a block diagram illustrating a configuration example of the memory cell array 310. As illustrated in FIG. 11, the memory cell array 310 includes a plurality of memory cells 311 and a plurality of wirings WWL, RWL, BL, and SL. In the memory cell array 310, a plurality of memory cells 311 are arranged in an array. In FIG. 11, the memory cells 311 at 2 rows×2 columns are typically illustrated. Symbols such as [i] and [2i−1] which are given to the reference numerals in FIG. 11 indicate a row number (row address) or a column number (column address). Here, i is an integer greater than or equal to 2 and i is an integer greater than or equal to 1.

In accordance with the arrangement of the memory cells 311, the memory cell array 310 is provided with the wiring WWL, and the wiring RWL in each row and with the wiring BL in each column. The wiring SL is provided in every other column. The memory cells 311 in the same row are electrically connected to the row driver circuit 321 by the wiring WWL and the wiring RWL in the same row, and the memory cells 311 in the same column are electrically connected to the column driver circuit 322 by the wiring BL in the same column.

In the case where the potential of the wiring SL is changed in accordance with the operation of the semiconductor memory device 300, for example, the wiring SL is electrically connected to the column driver circuit 322, and a signal output to the wiring SL is generated in the column driver circuit 322. In the case where the potential of the wiring SL is kept constant at the operation of the memory device 300, all of the wirings SL in the memory cell array 310 may be electrically connected to a wiring for supplying a predetermined fixed potential (potential supply line).

As shown in FIG. 11, the memory cell 311 is electrically connected to the wirings WWL, RWL, BL, and SL. The memory cell 311 includes a node SN1, a transistor MW1, a transistor MR1, and a capacitor CS1. A data signal written to the memory cell 311 is input to the wiring BL. The node SN1 can function as a storage node that holds a voltage corresponding to the data signal D and is electrically connected to a gate of a transistor M1.

The wiring WWL can function as a writing word line, and a signal that controls the conduction state of the transistor MW1 (a writing control signal) is input to the wiring WWL. The wiring RWL can function as a reading word line. The wiring RWL and the node SN1 are capacitively coupled to each other via the capacitor CS1. The voltage of the node SN1 at the time of reading is controlled by the wiring RWL. The transistor MW1 can function as a writing transistor. In order to suppress a change in the voltage at the node SN1, the off-state current of the transistor is preferably as low as possible. For example, an OS transistor is used. The transistor MR1 can function as a reading transistor. The transistor MR1 can function as a switch and also as an amplifying transistor that amplifies the voltage retained in the node SN1. The transistor MR1 may be an n-channel transistor.

The voltage of the wiring WWL is controlled so that the voltage of the node SN1 reaches a voltage corresponding to the voltage of the wiring BL, whereby data can be written to the memory cell 311. Furthermore, the voltage of the wiring RWL is controlled so that the voltage of the wiring BL reaches a voltage corresponding to the potential of a floating node FN, whereby data can be read from the memory cell 311.

To hold multilevel data in the memory cell array 310, a signal $D_{in}$ input to the wiring BL is a signal having a voltage corresponding to a data value of the data signal WDATA at the time of writing operation. When the data signal WDATA is, for example, 2-bit digital data, it has a voltage having any one of four levels.

In a reading operation, the wiring BL is supplied with a precharge voltage $V_{precharge}$. After the precharge voltage $V_{precharge}$ is supplied, the wiring BL becomes an electrically floating state. The wiring SL is supplied with a discharge voltage $V_{discharge}$ which is lower than the precharge voltage $V_{precharge}$ supplied to the wiring BL. In the memory cell 311, a current corresponding to the voltage of the node SN1 flows through the transistor MR1. The voltage of the wiring BL becomes lower than the $V_{precharge}$ in accordance with the current flowing through the transistor MR1; thus, the data value held in the memory cell 311 can be obtained by detecting the voltage of the wiring BL.

<Column Driver Circuit>

Figure 12:
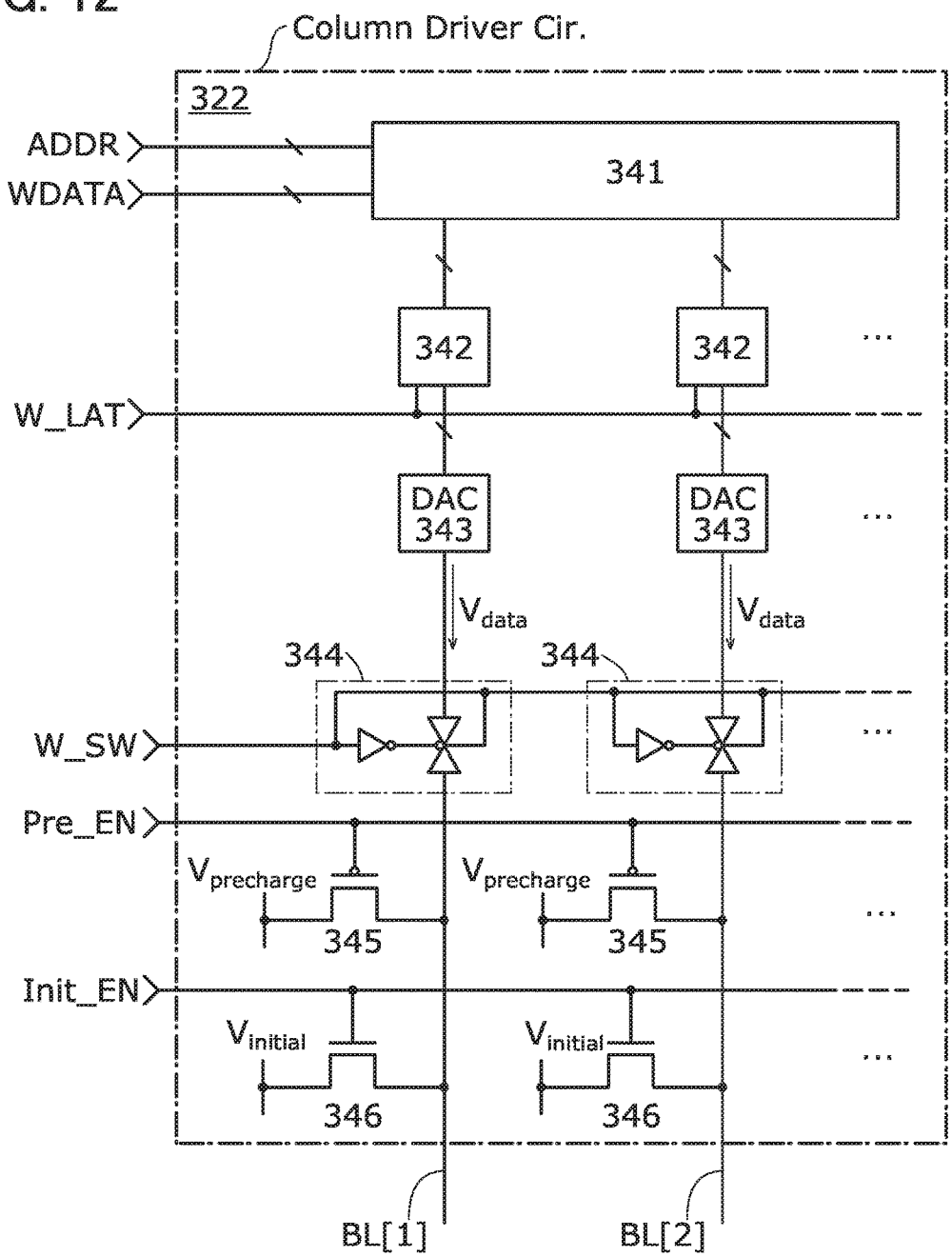
FIG. 12 is a circuit diagram illustrating a configuration example of a column driver circuit.

FIG. 12 shows a configuration example of the column driver circuit 322. The column driver circuit 322 in FIG. 12 includes a decoder 341, a latch circuit 342, a DAC 343, a switch circuit 344, a transistor 345, and a transistor 346. The components other than the decoder 341 are provided for each wiring BL.

The decoder 341 has a function of decoding a signal ADDR, selecting a column specified by the signal ADDR, and inputting a data signal WDATA to a wiring BL in the selected column. Specifically, the decoder 341 outputs the data signal WDATA to the latch circuit 342 in the column specified by the signal ADDR. In the example of FIG. 12, the data signal WDATA is n-bit digital data.

The latch circuit 342 has a function of temporarily storing the data signal WDATA. The latch circuit 342 outputs the data signal WDATA that is stored in accordance with a latch signal W_LAT to the DAC 343. The DAC 343 is provided so as to convert the data signal WDATA into an analog voltage $V_{data}$ As the DAC 343, the voltage output type DAC 4 in FIG. 4 can be used.

The switch circuit 344 has functions of supplying the input data $V_{data}$ to the wiring BL and bringing the wiring BL into an electrically floating state. In the example of FIG. 12, the switch circuit 344 includes an analog switch and an inverter circuit. The switch circuit 344 supplies the data $V_{data}$ to the bit line BL in accordance with the control of a signal W_SW, and then makes the bit line BL electrically floating by turning off the analog switch. The switch circuit 344 enables the column driver circuit 322 to keep the bit line BL in an electrically floating state after the data $V_{data}$ is supplied to the bit line BL.

The transistor 345 has a function of supplying a precharge voltage $V_{precharge}$ to the bit line BL and bringing the bit line BL into an electrically floating state. The on/off state of the transistor 345 is controlled by a signal Pre_EN. The transistor 346 has a function of supplying an initialization voltage $V_{initial}$ to the wiring BL and bringing the bit line BL into an electrically floating state. The on/off state of the transistor 346 is controlled by a signal Init_EN. The signal Pre_EN is a control signal for controlling the precharge operation, and the signal Init_EN is a signal for controlling the initialization operation.

(Another Configuration Example of Memory Cell)

FIG. 11 shows an example in which a gain cell using two transistors and one capacitor is used as the memory cell 311. A gain cell using three transistors and one capacitor can also be used as the memory cell 311. Such an example is illustrated in FIG. 13.

Figure 13:
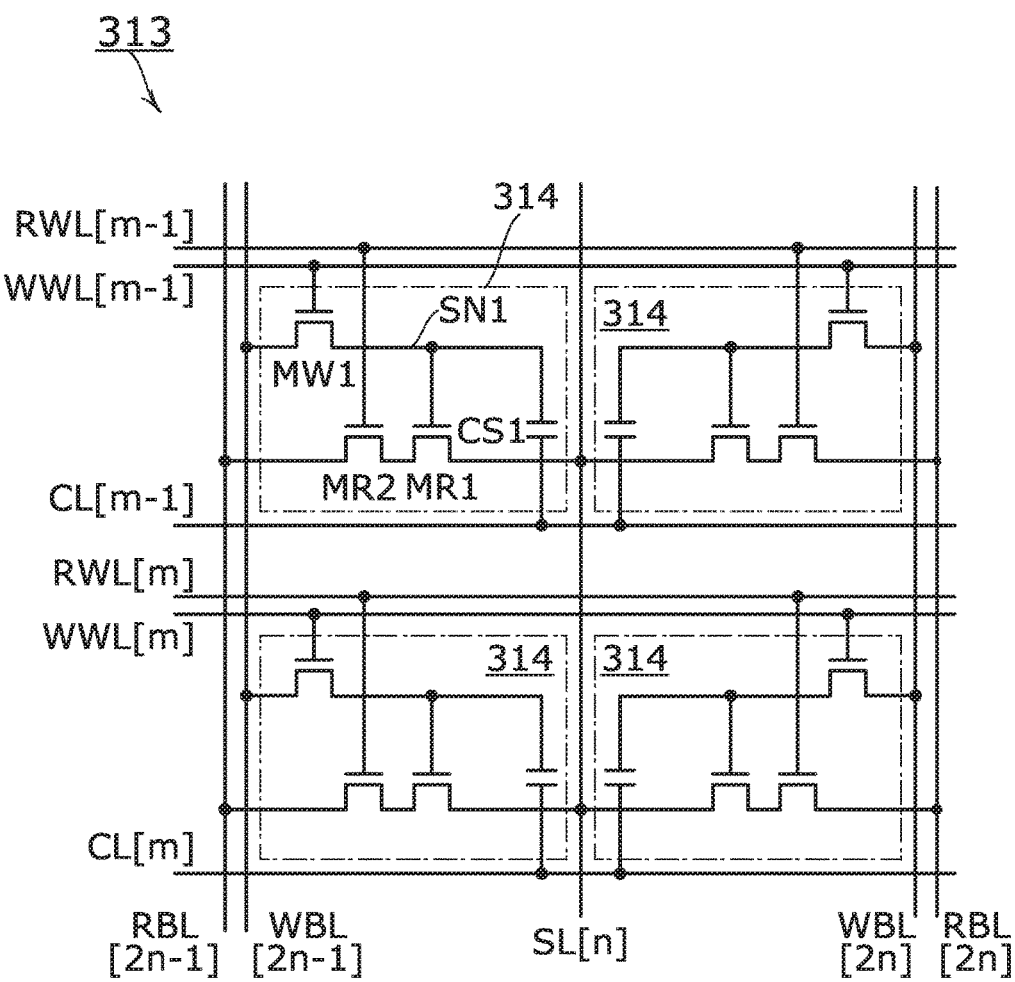
FIG. 13 is a circuit diagram illustrating a configuration example of a memory cell array.

A memory cell array 313 in FIG. 13 includes a plurality of memory cells 314. The memory cells 314 each includes a node SN1, transistors MW1, MR1, MR2, and a capacitor CS1. The transistors MR1 and MR2 may be p-channel transistors. In the example of FIG. 13, the wiring BL is divided into a writing wiring WBL and a reading wiring RBL. The same can be applied to FIG. 12. A gate of the transistor MR2 is electrically connected to a wiring RWL, and the capacitor CS1 is electrically connected to a wiring CL. In the reading operation, the voltage of the wiring RWL is controlled, so that the transistor MR2 is turned on. In the case where the potential of the wiring CL is changed in accordance with the operation of the memory device 300, for example, the wiring CL may be electrically connected to the row driver circuit 321, and a signal output to the wiring CL is generated in the row driver circuit 321. In the case where a constant potential is supplied to the wiring CL at the operation of the memory device 300, all of the wirings CL in the memory cell array 310 is electrically connected to a wiring for supplying a predetermined constant potential (potential supply line).

In each of the memory cells 311 in FIG. 11 and in each of the memory cells 314 in FIG. 13, a back gate may be provided for the transistor MW1 so that the threshold voltage of the transistor MW1 is controlled by the voltage of the back gate.

<<Electronic Device>>

The semiconductor device, such as a DAC, an ADC, an oscillator circuit, a PLL, a memory circuit, or a display device, described above can be incorporated in various electronic devices.

Examples of the electronic devices include digital signal processing, software-defined radio systems, avionic systems (electronic devices used in aircraft, such as communication systems, navigation systems, autopilot systems, and flight management systems), ASIC prototyping, medical image processing, voice recognition, encryption, bioinformatics, emulators for mechanical systems, and radio telescopes in radio astronomy. Specifically, examples of the electronic devices include display devices, personal computers (PCs), or image reproducing devices provided with recording media (typically, devices which reproduce the content of recording media such as digital versatile discs (DVDs) and blue-ray discs and have displays for displaying the reproduced images). Other examples of the electronic devices are mobile phones, game machines including portable game machines, portable data appliances, e-book readers, cameras (e.g., video cameras and digital still cameras), wearable display devices or terminals (e.g., head mounted display devices, goggle-type display devices, glasses-type display devices, armband display devices, bracelet-type display devices, and necklace-type display devices), navigation systems, audio reproducing devices (e.g., car audio systems and digital audio players), copiers, facsimiles, printers, multifunction printers, automated teller machines (ATM), vending machines, and health-related devices (e.g., blood-pressure meters, blood sugar level measuring devices, pedometers, and weight meters). FIGS. 14A to 14H show examples of the electronic devices.

Figure 14A:
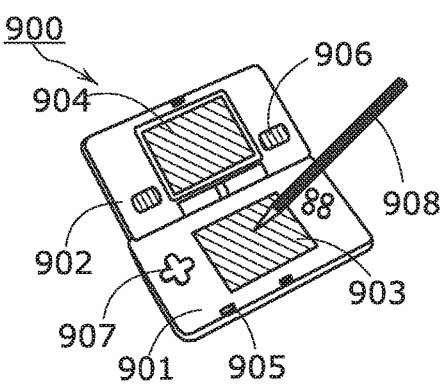
FIGS. 14A to 14H each illustrate a structure example of an electronic device.

A portable game machine 900 shown in FIG. 14A includes a housing 901, a housing 902, a display portion 903, a display portion 904, a microphone 905, a speaker 906, an operation key 907, and the like. The display portion 903 is provided with a touch screen as an input device, which can be handled with a stylus 908 or the like.

Figure 14B:
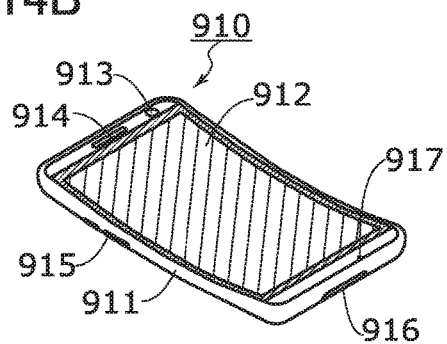

An information terminal 910 shown in FIG. 14B includes a housing 911, a display portion 912, a microphone 917, a speaker portion 914, a camera 913, an external connection portion 916, an operation button 915, and the like. A display panel that uses a flexible substrate and a touch screen are provided in the display portion 912. The information terminal 910 can be used as, for example, a smartphone, a mobile phone, a tablet information terminal, a tablet PC, or an e-book reader.

Figure 14C:
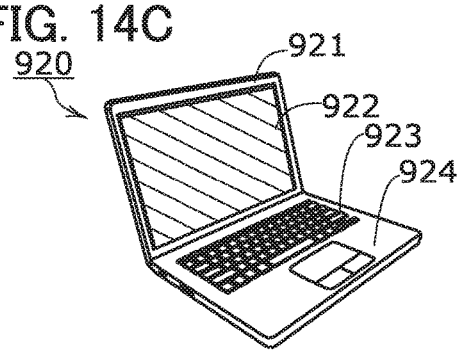

A notebook PC 920 shown in FIG. 14C includes a housing 921, a display portion 922, a keyboard 923, a pointing device 924, and the like.

Figure 14D:
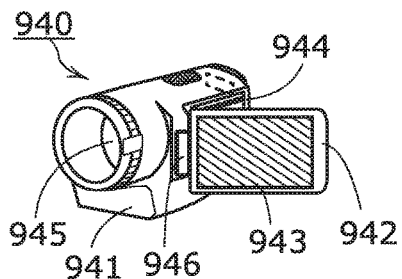

A video camera 940 shown in FIG. 14D includes a housing 941, a housing 942, a display portion 943, operation keys 944, a lens 945, a joint 946, and the like. The operation keys 944 and the lens 945 are provided in the housing 941, and the display portion 943 is provided in the housing 942. The housing 941 and the housing 942 are connected to each other with the joint 946, and an angle between the housing 941 and the housing 942 can be changed with the joint 946. The direction of an image on the display portion 943 may be changed and display and non-display of an image may be switched depending on the angle between the housings 941 and 942.

Figure 14E:
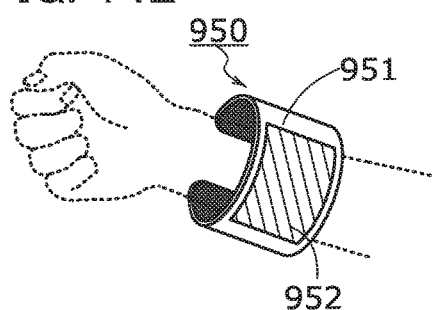

FIG. 14E shows an example of a bangle-type information terminal. An information terminal 950 includes a housing 951, a display portion 952, and the like. The display portion 952 is supported by the housing 951 having a curved surface. A display panel formed with a flexible substrate is provided in the display portion 952, whereby the information terminal 950 that is flexible and lightweight and has improved convenience can be provided.

Figure 14F:
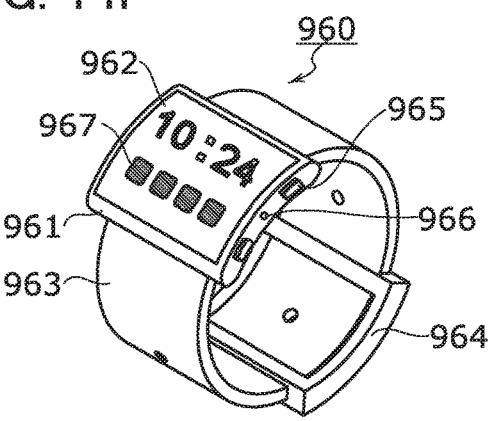

FIG. 14F shows an example of a watch-type information terminal. An information terminal 960 includes a housing 961, a display portion 962, a band 963, a buckle 964, an operation button 965, an input/output terminal 966, and the like. The information terminal 960 is capable of executing a variety of applications such as mobile phone calls, e-mailing, viewing and editing texts, music reproduction, Internet communication, and computer games.

The display surface of the display portion 962 is bent, and images can be displayed on the bent display surface. Further, the display portion 962 includes a touch sensor, and operation can be performed by touching the screen with a finger, a stylus, or the like. For example, by touching an icon 967 displayed on the display portion 962, an application can be started. With the operation button 965, a variety of functions such as time setting, power ON/OFF, ON/OFF of wireless communication, setting and cancellation of manner mode, and setting and cancellation of power saving mode can be performed. For example, the functions of the operation button 965 can be set by setting the operating system incorporated in the information terminal 960.

The information terminal 960 can employ near field communication that is a communication method based on an existing communication standard. For example, mutual communication between the information terminal 960 and a headset capable of wireless communication can be performed, and thus hands-free calling is possible. Moreover, the information terminal 960 includes the input/output terminal 966, and data can be directly transmitted to and received from another information terminal via a connector. Power charging through the input/output terminal 966 is possible. Note that the charging operation may be performed by wireless power feeding without using the input/output terminal 966.

Figure 14G:
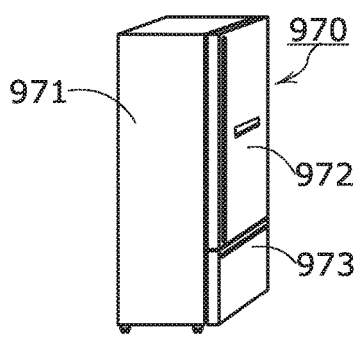

FIG. 14G illustrates an electric refrigerator-freezer as an example of a home electric appliance. An electric refrigerator-freezer 970 includes a housing 971, a refrigerator door 972, a freezer door 973, and the like.

Figure 14H:
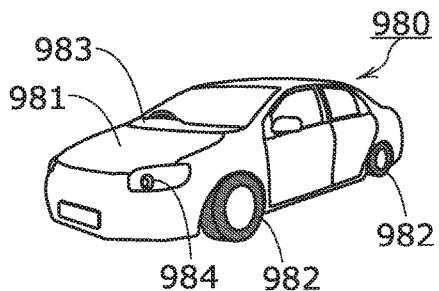

FIG. 14H illustrates a structure example of a motor vehicle. A motor vehicle 980 includes a car body 981, wheels 982, a dashboard 983, lights 984, and the like.

Figure 15A:
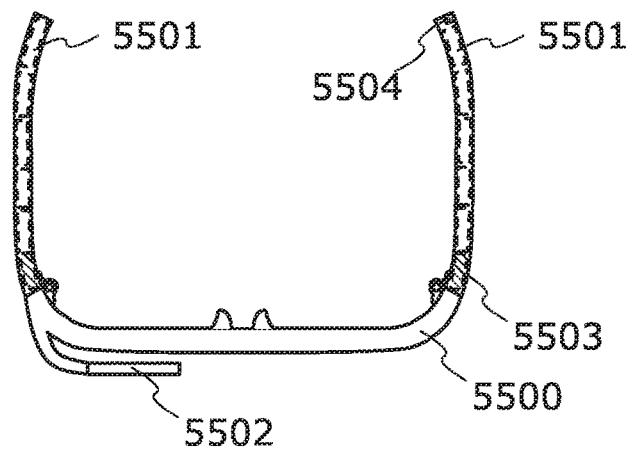
FIGS. 15A to 15C illustrate structure examples of an electronic device.
Figure 15B:
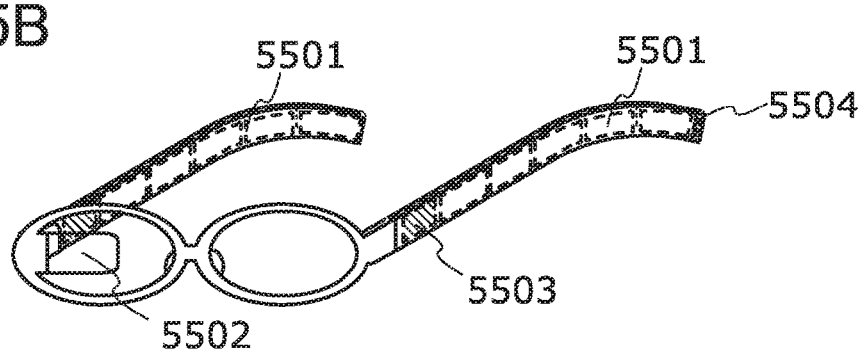
Figure 15C:
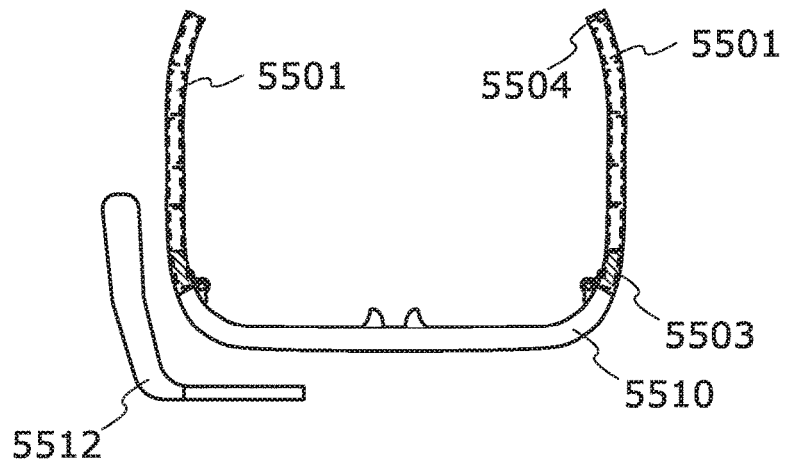

FIGS. 15A to 15C show an example of a wearable information terminal. FIG. 15A is a top view of a glasses-type device 5500 and FIG. 15B is a perspective view thereof. In the example of FIGS. 15A to 15C, the wearable information terminal is a glasses-type device; however, one embodiment of the present invention is not limited thereto. For example, the wearable information terminal may be a head mounted type device, an armband type device, a necklace type device, a ring-type device, bracelet-type device, or the like.

The glasses-type device 5500 shown in FIGS. 15A to 15C includes a portion that is positioned along each side of the head of the user when the device is worn (hereinafter referred to as a temple), and a plurality of power storage elements 5501 is provided in each of the right and left temples. As the power storage elements 5501, a battery, an electric double layer capacitor, and the like are used.

In addition, the glasses-type device 5500 may include a terminal portion 5504. The power storage elements 5501 can be charged through the terminal portion 5504. The power storage elements 5501 are preferably electrically connected to each other, so that all the power storage elements 5501 can be charged through the one terminal portion 5504.

The glasses-type device 5500 may include a display portion 5502. Any of the DACs or the PLL described above may be provided for a driver circuit of the display portion 5502. The glasses-type device 5500 may include a control portion 5503. Any of the DACs, the ADC, the oscillator circuits, the PLL, the memory device, and the like described above may be provided for the control portion 5503. The control portion 5503 can control charge and discharge of the power storage elements 5501 and can generate image data which is displayed on the display portion 5502. Furthermore, if a wireless IC having a wireless communication function is included in the control portion 5503, data can be transmitted to and received from the outside. Any of the DACs, the ADC, the oscillator circuits, and the PLL described above may be provided for the wireless IC.

As shown in FIG. 15C, a glasses-type device 5510 without the display portion 5502 may be employed. An external display portion 5512 may be attached to the glasses-type device 5510. Thus, the distance between the eyes of the user and the display portion 5512 can be easily adjusted. Furthermore, between the glasses-type device 5510 and the external display portion 5512, wireless communication and wireless power feeding may be performed.

Embodiment 3

In this embodiment, an oxide semiconductor, an OS transistor, and the like are described.

<<Structure Example 1 of OS Transistor>>

FIGS. 16A to 16D illustrate a structure example of an OS transistor. FIG. 16A is a top view illustrating a structure example of an OS transistor. FIG. 16B is a cross-sectional view taken along the line y1-y2, FIG. 16C is a cross-sectional view taken along the line x1-x2, and FIG. 16D is a cross-sectional view taken along the line x3-x4. Here, in some cases, the direction of the line y1-y2 is referred to as a channel length direction, and the direction of the line x1-x2 is referred to as a channel width direction. FIG. 16B illustrates a cross-sectional structure of the OS transistor in the channel length direction, and FIGS. 16C and 16D each illustrate a cross-sectional structure of the OS transistor in the channel width direction. Note that to clarify the device structure, FIG. 16A does not illustrate some components.

An OS transistor 501 is formed over an insulating surface, here, over an insulating layer 511. The insulating layer 511 is formed over a surface of a substrate 510. The OS transistor 501 is covered with an insulating layer 514 and an insulating layer 515. Note that the insulating layers 514 and 515 may be regarded as components of the OS transistor 501. The OS transistor 501 includes an insulating layer 512, an insulating layer 513, oxide semiconductor (OS) layers 521 to 523, a conductive layer 530, a conductive layer 541, and a conductive layer 542. Here, the OS layers 521, 522, and 523 are collectively referred to as an OS layer 520.

The insulating layer 513 includes a region functioning as a gate insulating layer. The conductive layer 530 functions as a gate electrode. A conductive layer 531 functions as a backgate electrode. A constant potential, the same potential or signal supplied to the conductive layer 530, or a potential or signal that is different from that supplied to the conductive layer 530 may be supplied to the conductive layer 531. The conductive layer 541 and the conductive layer 542 function as a source electrode and a drain electrode.

As illustrated in FIGS. 16B and 16C, the OS layer 520 includes a region where the OS layer 521, the OS layer 522, and the OS layer 523 are stacked in this order. The insulating layer 513 covers this stacked region. The conductive layer 531 overlaps with the stacked region with the insulating layer 513 positioned therebetween. The conductive layer 541 and the conductive layer 542 are provided over the stacked film formed of the OS layer 521 and the OS layer 523 and are in contact with a top surface of this stacked film and a side surface positioned in the channel length direction of the stacked film. In the example of FIGS. 16A to 16D, the conductive layers 541 and 542 are also in contact with the insulating layer 512. The OS layer 523 is formed to cover the OS layers 521 and 522 and the conductive layers 541 and 542. A bottom surface of the OS layer 523 is in contact with a top surface of the OS layer 522.

The conductive layer 530 is formed so as to surround, in the channel width direction, the region where the OS layers 521 to 523 are stacked in the OS layer 520 with the insulating layer 513 positioned therebetween (see FIG. 16C). Therefore, a gate electric field in the vertical direction and a gate electric field in the lateral direction are applied to this stacked region. In the OS transistor 501, "the gate electric field" refers to an electric field generated by voltage applied to the conductive layer 531 (gate electrode layer). Accordingly, the whole stacked region of the OS layers 521 to 523 can be electrically surrounded by the gate electric fields, so that a channel is formed in the whole OS layer 522 (bulk), in some cases. Thus, favorable on-state current characteristics of the OS transistor 501 can be achieved.

In this specification, a structure of a transistor in which a semiconductor is electrically surrounded by a gate electric field as in the above transistor is referred to as "a surrounded channel (s-channel) structure". The OS transistor 501 has the s-channel structure. With this s-channel structure, a large amount of current can flow between the source and the drain of the transistor, so that a high drain current in an on state (high on-state current) can be achieved.

The s-channel structure of the OS transistor 501 allows a gate electric field to be applied also to the side surface of the OS layer 522, whereby the channel formation region is easily controlled. In the structure where the conductive layer 530 reaches below the OS layer 522 and faces the side surface of the OS layer 521, higher controllability can be achieved, which is preferable. Consequently, the subthreshold swing (S value) of the OS transistor 501 can be made small, so that a short-channel effect can be reduced. Therefore, the structure is suitable for miniaturization.

When an OS transistor has a three-dimensional structure as in the OS transistor 501 illustrated in FIGS. 16A to 16D, the channel length can be less than 100 nm. By miniaturization of the OS transistor, circuit area can be made small. The channel length of the OS transistor is preferably less than 65 nm, further preferably less than or equal to 30 nm or less than or equal to 20 nm.

A conductor functioning as a gate of the transistor is referred to as a gate electrode. A conductor functioning as a source of the transistor is referred to as a source electrode. A conductor functioning as a drain of the transistor is referred to as a drain electrode. A region functioning as a source of the transistor is referred to as a source region. A region functioning as a drain of the transistor is referred to as a drain region. In this specification, a gate electrode is referred to as a gate, a drain electrode or a drain region is referred to as a drain, and a source electrode or a source region is referred to as a source in some cases.

The channel length refers to, for example, a distance between a source and a drain in a region where a semiconductor (or a portion where a current flows in a semiconductor when a transistor is on) and a gate electrode overlap each other or a region where a channel is formed in a top view of the transistor. In one transistor, channel lengths in all regions are not necessarily the same. In other words, the channel length of one transistor is not limited to one value in some cases. Therefore, in this specification, the channel length is any one of values, the maximum value, the minimum value, or the average value in a region where a channel is formed.

A channel width refers to, for example, the length of a portion where a source and a drain face each other in a region where a semiconductor (or a portion where a current flows in a semiconductor when a transistor is on) and a gate electrode overlap with each other, or a region where a channel is formed. In one transistor, channel widths in all regions do not necessarily have the same value. In other words, a channel width of one transistor is not fixed to one value in some cases. Therefore, in this specification, a channel width is any one of values, the maximum value, the minimum value, or the average value in a region where a channel is formed.

Note that depending on transistor structures, a channel width in a region where a channel is formed actually (hereinafter referred to as an effective channel width) is different from a channel width shown in a top view of a transistor (hereinafter referred to as an apparent channel width) in some cases. For example, in a transistor having a three-dimensional structure, an effective channel width is greater than an apparent channel width shown in a top view of the transistor, and its influence cannot be ignored in some cases. For example, in a miniaturized transistor having a three-dimensional structure, the proportion of a channel region formed in a side surface of a semiconductor is higher than the proportion of a channel region formed in a top surface of the semiconductor in some cases. In that case, an effective channel width obtained when a channel is actually formed is greater than an apparent channel width shown in the top view.

In a transistor having a three-dimensional structure, an effective channel width is difficult to measure in some cases. For example, estimation of an effective channel width from a design value requires an assumption that the shape of a semiconductor is known. Therefore, in the case where the shape of a semiconductor is not known accurately, it is difficult to measure an effective channel width accurately.

Therefore, in this specification, in a top view of a transistor, an apparent channel width that is a length of a portion where a source and a drain face each other in a region where a semiconductor and a gate electrode overlap with each other is referred to as a surrounded channel width (SCW) in some cases. Furthermore, in this specification, in the case where the term "channel width" is simply used, it may denote a surrounded channel width or an apparent channel width. Alternatively, in this specification, in the case where the term "channel width" is simply used, it may denote an effective channel width in some cases. Note that the values of a channel length, a channel width, an effective channel width, an apparent channel width, a surrounded channel width, and the like can be determined by obtaining and analyzing a cross-sectional TEM image and the like.

Note that in the case where electric field mobility, a current value per channel width, and the like of a transistor are obtained by calculation, a surrounded channel width may be used for the calculation. In that case, a value different from one in the case where an effective channel width is used for the calculation is obtained in some cases.

<Substrate>

The substrate 510 is not limited to a simple supporting substrate, and may be a substrate where a device such as a transistor is formed. In that case, one of the conductive layers 530, 541, and 542 of the OS transistor 501 may be electrically connected to the device.

<Base Insulating Film>

The insulating layer 511 has a function of preventing impurity diffusion from the substrate 510. The insulating layer 512 preferably has a function of supplying oxygen to the OS layer 520. For this reason, the insulating layer 512 is preferably an insulating film containing oxygen, more preferably, an insulating film containing oxygen in which the oxygen content is higher than that in the stoichiometric composition. For example, a film from which oxygen molecules at more than or equal to $1.0 \times 10^{18}$ molecules/cm$^3$ are released in thermal desorption spectroscopy (TDS) at a surface temperature of the film of higher than or equal to 100° C. and lower than or equal to 700° C. or higher than or equal to 100° C. and lower than or equal to 500° C. can be used. When the substrate 510 is a substrate where a device is formed as described above, the insulating layer 511 is preferably subjected to planarization treatment such as chemical mechanical polishing (CMP) so as to have a flat surface.

The insulating layers 511 and 512 can be formed using an insulating material of aluminum oxide, aluminum oxynitride, magnesium oxide, silicon oxide, silicon oxynitride, silicon nitride oxide, gallium oxide, germanium oxide, yttrium oxide, zirconium oxide, lanthanum oxide, neodymium oxide, hafnium oxide, tantalum oxide, silicon nitride, silicon nitride oxide, aluminum nitride oxide, or the like, or a mixed material of these materials. In this specification, oxynitride refers to a material which includes more oxygen than nitrogen, and nitride oxide refers to a substance which includes more nitrogen than oxygen.

<Gate Electrode>

The conductive layer 530 is preferably formed using a single low-resistant material selected from copper (Cu), tungsten (W), molybdenum (Mo), gold (Au), aluminum (Al), manganese (Mn), titanium (Ti), tantalum (Ta), nickel (Ni), chromium (Cr), lead (Pb), tin (Sn), iron (Fe), cobalt (Co), ruthenium (Ru), iridium (Ir), strontium (Sr), and platinum (Pt); an alloy of any of these materials; or a compound containing any of these materials as its main component.

The conductive layer 530 may have a single-layer structure or a stacked structure of two or more layers. For example, any of the following structures can be employed: a single-layer structure of an aluminum film containing silicon; a two-layer structure in which a titanium film is stacked over an aluminum film; a two-layer structure in which a titanium film is stacked over a titanium nitride film; a two-layer structure in which a tungsten film is stacked over a titanium nitride film; a two-layer structure in which a tungsten film is stacked over a tantalum nitride film or a tungsten nitride film; a three-layer structure in which a titanium film, an aluminum film, and a titanium film are stacked in this order; a single-layer structure of a Cu—Mn alloy film; a two-layer structure in which a Cu film is stacked over a Cu—Mn alloy film; and a three-layer structure in which a Cu—Mn alloy film, a Cu film, and a Cu—Mn alloy film are stacked in this order. A Cu—Mn alloy film is preferably used because of its low electrical resistance and because it forms manganese oxide at the interface with an insulating film containing oxygen and manganese oxide can prevent Cu diffusion.

The conductive layer 530 can also be formed using a light-transmitting conductive material such as indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon oxide is added. It is also possible to have a stacked structure formed using the above light-transmitting conductive material and the above metal element.

<Gate Insulating Layer>

The insulating layer 513 is formed using an insulating film having a single-layer structure or a stacked structure. The insulating layer 513 can be formed using an insulating film containing at least one of aluminum oxide, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, and tantalum oxide. The insulating layer 513 may be a stack including any of the above materials. The insulating layer 513 may contain lanthanum (La), nitrogen, zirconium (Zr), or the like as an impurity. The insulating layer 511 can be formed in a manner similar to that of the insulating layer 513. The insulating layer 513 contains oxygen, nitrogen, silicon, hafnium, or the like, for example. Specifically, the insulating layer 513 preferably includes hafnium oxide, and silicon oxide or silicon oxynitride.

Hafnium oxide has a higher dielectric constant than silicon oxide and silicon oxynitride. Therefore, the thickness of the insulating layer 513 using hafnium oxide can have larger thickness than the insulating layer 513 using silicon oxide; as a result, leakage current due to tunnel current can be low. That is, it is possible to provide a transistor with a low off-state current. Moreover, hafnium oxide with a crystalline structure has higher dielectric constant than hafnium oxide with an amorphous structure. Therefore, it is preferable to use hafnium oxide with a crystalline structure in order to provide a transistor with a low off-state current. Examples of the crystalline structure include a monoclinic crystal structure and a cubic crystal structure. Note that one embodiment of the present invention is not limited to the above examples.

<Source Electrode, Drain Electrode, Backgate Electrode>

The conductive layers 541 and 542 can be formed in a manner similar to that of the conductive layer 530. A Cu—Mn alloy film is preferably used for the conductive layers 541 and 542 because of its low electrical resistance, because it forms manganese oxide at the interface with an oxide semiconductor film when formed in contact with the oxide semiconductor film, and because manganese oxide can prevent Cu diffusion. Furthermore, the conductive layer 531 (see FIGS. 17A to 17D) described later can also be formed in a manner similar to that of the conductive layer 530.

<Protective Insulating Film>

The insulating layer 514 preferably has a function of blocking oxygen, hydrogen, water, an alkali metal, an alkaline earth metal, and the like. The insulating layer 514 can prevent outward diffusion of oxygen from the OS layer 520 and entry of hydrogen, water, or the like into the OS layer 520 from the outside. The insulating layer 514 can be a nitride insulating film, for example. The nitride insulating film is formed using silicon nitride, silicon nitride oxide, aluminum nitride, aluminum nitride oxide, or the like. Note that instead of the nitride insulating film having a blocking effect against oxygen, hydrogen, water, an alkali metal, an alkaline earth metal, and the like, an oxide insulating film having a blocking effect against oxygen, hydrogen, water, and the like, may be provided. As the oxide insulating film having a blocking effect against oxygen, hydrogen, water, and the like, an aluminum oxide film, an aluminum oxynitride film, a gallium oxide film, a gallium oxynitride film, an yttrium oxide film, an yttrium oxynitride film, a hafnium oxide film, and a hafnium oxynitride film can be used.

An aluminum oxide film is preferably used as the insulating layer 514 because it is highly effective in preventing transmission of both oxygen and impurities such as hydrogen and moisture. Thus, during and after the manufacturing process of the transistor, the aluminum oxide film can suitably function as a protective film that has effects of preventing entry of impurities such as hydrogen and moisture, which cause variations in the electrical characteristics of the transistor, into the OS layer 520, preventing release of oxygen, which is the main component of the OS layer 520, from the oxide semiconductor, and preventing unnecessary release of oxygen from the insulating layer 512. In addition, oxygen contained in the aluminum oxide film can be diffused into the oxide semiconductor.

<Interlayer Insulating Film>

The insulating layer 515 is preferably formed over the insulating layer 514. The insulating layer 515 can be formed using an insulating film with a single-layer structure or a stacked structure. The insulating film 515 can be an insulating film containing one or more of magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, and tantalum oxide.

<Oxide Semiconductor Layer>

As the semiconductor material of the OS layers 521 to 523, typically, an In—Ga oxide, an In—Zn oxide, or an In-M-Zn oxide (M is Ga, Y, Sn, Zr, La, Ce, or Nd) is used. The element M is an element having a high bonding energy with oxygen, for example. The element M is an element whose bonding energy with oxygen is higher than that of indium. Alternatively, the element M is an element that can increase the energy gap of the oxide semiconductor. In addition, the OS layers 521 to 523 are not limited to the oxide layers containing indium. The OS layers 521 to 523 can be formed using a Zn—Sn oxide layer, a Ga—Sn oxide layer, or a Zn—Mg oxide layer, for example. The OS layer 522 is preferably formed using an In—Al—Zn oxide layer. The OS layers 521 and 523 can be formed using a Ga oxide.

The OS layer 522 is not limited to the oxide semiconductor containing indium. The OS layer 522 may be, for example, an oxide semiconductor which does not contain indium and contains zinc, an oxide semiconductor which does not contain indium and contains gallium, or an oxide semiconductor which does not contain indium and contains tin. e.g., a zinc tin oxide or a gallium tin oxide.

For the OS layer 522, an oxide with a wide energy gap may be used. The energy gap of the OS layer 522 is, for example, 2.5 eV or larger and 4.2 eV or smaller, preferably 2.8 eV or larger and 3.8 eV or smaller, more preferably 3 eV or larger and 3.5 eV or smaller.

The OS layer 522 is preferably a CAAC-OS film which will be described later. When the oxide semiconductor contains Zn, the oxide semiconductor is easily to be crystallized, for example. Thus, the OS layer 522 preferably contains Zn.

When an interface level is formed at the interface between the OS layer 522 and the OS layer 521, a channel region is formed also in the vicinity of the interface, which causes a change in the threshold voltage of the OS transistor 501. It is preferable that the OS layer 521 contains at least one of the metal elements contained in the OS layer 522. Accordingly, an interface level is unlikely to be formed at the interface between the OS layer 522 and the OS layer 523, and variations in the electrical characteristics of the OS transistor 501, such as the threshold voltage can be reduced.

The OS layer 523 preferably contains at least one of the metal elements contained in the OS layer 522 because interface scattering is unlikely to occur at the interface between the OS layer 522 and the OS layer 523, and carrier transfer is not inhibited. Thus, the field-effect mobility of the OS transistor 501 can be increased.

The OS layers 521, 522, and 523 preferably include at least Indium. In the case of using an In-M-Zn oxide as the OS layer 521, when a summation of In and M is assumed to be 100 atomic %, the proportions of In and M are preferably set to be less than 50 atomic % and greater than 50 atomic %, respectively, more preferably less than 25 atomic % and greater than 75 atomic %, respectively. In the case of using an In-M-Zn oxide as the OS layer 522, when the summation of In and M is assumed to be 100 atomic %, the proportions of In and MA are preferably set to be greater than 25 atomic % and less than 75 atomic %, respectively, more preferably greater than 34 atomic % and less than 66 atomic %, respectively. In the case of using an In-M-Zn oxide as the OS layer 523, when the summation of In and M is assumed to be 100 atomic %, the proportions of In and M are preferably set to be less than 50 atomic % and greater than 50 atomic %, respectively, more preferably less than 25 atomic % and greater than 75 atomic %, respectively. Note that the OS layer 523 may be an oxide that is the same type as that of the OS layer 521. Note that the OS layer 521 and/or the OS layer 523 do/does not necessarily contain indium in some cases. For example, the OS layer 521 and/or the OS layer 523 can be formed using a gallium oxide film.

It is preferable that the OS layer 522 have the highest carrier mobility among the OS layers 521 to 523. Accordingly, a channel can be formed in the OS layer 522 that is apart from the insulating layer 511.

In an oxide containing In such as an In-M-Zn oxide, carrier mobility can be increase by an increase in the In content. In the In-M-Zn oxide, the s orbital of heavy metal mainly contributes to carrier transfer, and when the indium content in the oxide semiconductor is increased, overlaps of the s orbitals of In atoms are increased; therefore, an oxide having a high content of indium has higher mobility than an oxide having a low content of indium. Therefore, an oxide having a high content of indium is used as an oxide semiconductor film, whereby carrier mobility can be increased.

When an oxide semiconductor film is deposited by a sputtering method, because of heating of a substrate surface (the surface on which the CAAC-OS is deposited), space heating, or the like, the composition of the film is sometimes different from that of a target as a source or the like. For example, in the case of using a target of an In—Ga—Zn oxide, since zinc oxide sublimates more easily than indium oxide, gallium oxide, or the like, the source and the In—Ga—Zn oxide are likely to have different compositions. Specifically, the content of Zn is smaller than that of the source in the In—Ga—Zn oxide. Thus, the source is preferably selected taking into account the change in composition. Note that a difference between the compositions of the source and the film is also affected by a pressure or a gas used for the deposition as well as a temperature.

In the case where the OS layer 522 is an In-M-Zn oxide formed by a sputtering method, it is preferable that the atomic ratio of metal elements of a target used for depositing the In-M-Zn oxide be In:M:Zn=1:1:1, 3:1:2, or 4:2:4.1. For example, the atomic ratio of metal elements contained in a semiconductor film deposited using a target of In:M:Zn=4:2:4.1 is approximately In:M:Zn=4:2:3.

In the case where each of the OS layers 521 and 523 is an In-M-Zn oxide formed by a sputtering method, it is preferable that the atomic ratio of metal elements of a target used for depositing the In-M-Zn oxide be In:M:Zn=1:3:2 or 1:3:4.

As a power supply device for generating plasma in the case of forming the oxide semiconductor film by a sputtering method, an RF power supply device, an AC power supply device, a DC power supply device, or the like can be used as appropriate. As a sputtering gas, a rare gas (typically argon), an oxygen gas, or a mixed gas of a rare gas and oxygen gas is used as appropriate. In the case of using the mixed gas of a rare gas and oxygen, the proportion of oxygen to a rare gas is preferably increased. Further, a target may be appropriately selected in accordance with the compositions of the metal oxides to be formed.

In order to obtain an intrinsic or substantially intrinsic oxide semiconductor film, besides the high vacuum evacuation of the chamber, highly purification of a sputtering gas is also needed. As an oxygen gas or an argon gas used for a sputtering gas, a gas which is highly purified to have a dew point of −40° C. or lower, preferably −80° C. or lower, further preferably −100° C. or lower, still further preferably −120° C. or lower is used, whereby entry of moisture or the like into the oxide semiconductors can be prevented as much as possible.

<Energy Band Structure>

Figure 22A:
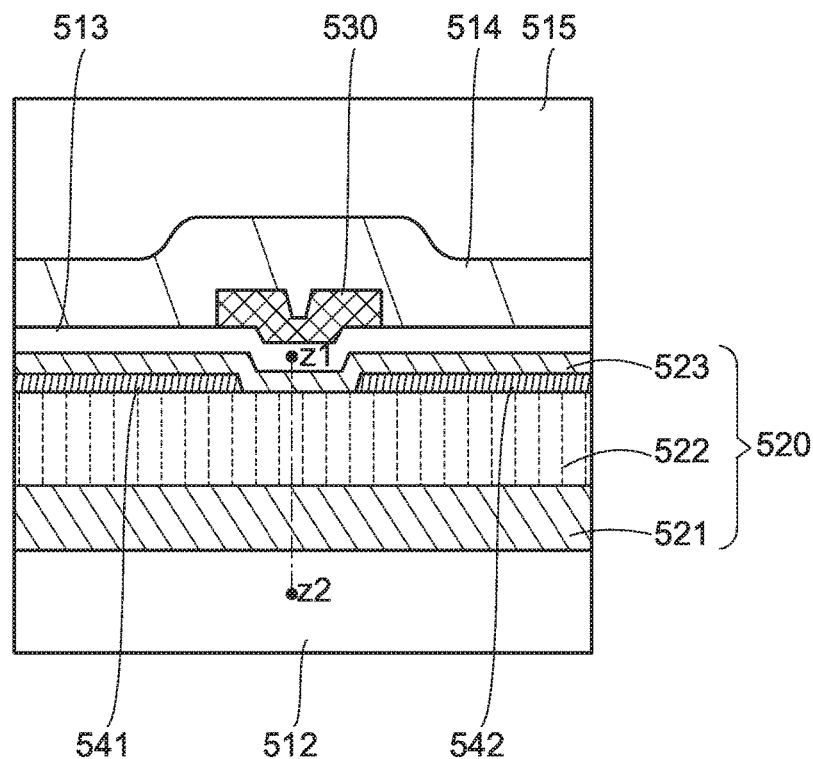
FIG. 22A is an enlarged view of a portion in FIG. 16B
Figure 22B:
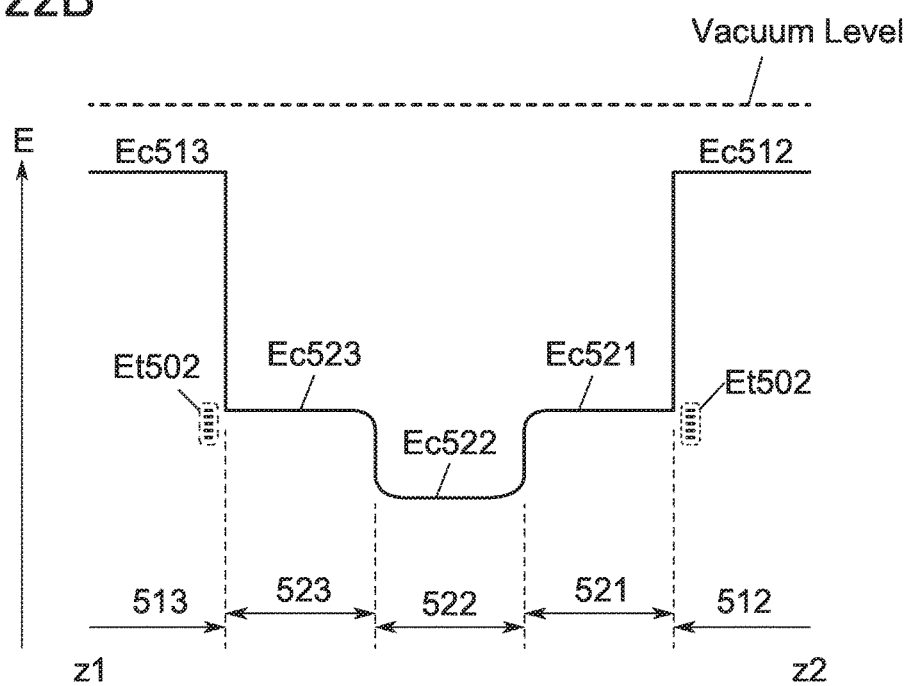
FIG. 22B is an energy band diagram of an OS transistor.

Next, the function and effect of the OS layer 520 in which the OS layers 521, 522, and 523 are stacked are described using an energy band diagram in FIG. 22B. FIG. 22A is an enlarged view of a channel region of the OS transistor 501, which is a partial enlarged view of FIG. 16B. FIG. 22B shows an energy band diagram of a portion taken along dotted line z1-z2 (the channel formation region of the OS transistor 501) in FIG. 22A. The OS transistor 501 is described below as an example, but the same applies to the OS transistors 502 to 506.

In FIG. 22B, Ec512, Ec521, Ec522, Ec523, and Ec513 indicate the energy at the bottom of the conduction band of the insulating layer 512, the OS layer 521, the OS layer 522, the OS layer 523, and the insulating layer 513, respectively.

Here, a difference in energy between the vacuum level and the bottom of the conduction band (the difference is also referred to as electron affinity) corresponds to a value obtained by subtracting an energy gap from a difference in energy between the vacuum level and the top of the valence band (the difference is also referred to as an ionization potential). The energy gap can be measured using a spectroscopic ellipsometer (UT-300 manufactured by HORIBA JOBIN YVON S.A.S.). The energy difference between the vacuum level and the top of the valence band can be measured using an ultraviolet photoelectron spectroscopy (UPS) device (VersaProbe manufactured by ULVAC-PHI, Inc.).

Since the insulating layer 512 and the insulating layer 513 are insulators, Ec512 and Ec513 are closer to the vacuum level than Ec521, Ec522, and Ec523 (i.e., the insulating layer 512 and the insulating layer 513 have a smaller electron affinity than the OS layers 521, 522, and 523).

The OS layer 522 is an oxide layer which has a larger electron affinity than the OS layers 521 and 523. For example, as the OS layer 522, an oxide having higher electron affinity than those of the OS layer 521 and the OS layer 523 by greater than or equal to 0.07 eV and less than or equal to 1.3 eV, preferably greater than or equal to 0.1 eV and less than or equal to 0.7 eV, more preferably greater than or equal to 0.15 eV and less than or equal to 0.4 eV is used. Note that the electron affinity refers to an energy gap between the vacuum level and the bottom of the conduction band.

When voltage is applied to the gate (the conductive layer 530) of the OS transistor 501, a channel is formed in the OS layer 522 having the highest electron affinity among the OS layers 521, 522, and 523.

An indium gallium oxide has small electron affinity and a high oxygen-blocking property. Therefore, the OS layer 523 preferably contains an indium gallium oxide. The gallium atomic ratio [Ga/(In+Ga)] is, for example, higher than or equal to 70%, preferably higher than or equal to 80%, more preferably higher than or equal to 90%.

Ec521 is closer to the vacuum level than Ec522. Specifically, Ec521 is preferably located closer to the vacuum level than Ec522 by 0.05 eV or more, 0.07 eV or more, 0.1 eV or more, or 0.15 eV or more and 2 eV or less, 1 eV or less, 0.5 eV or less, or 0.4 eV or less.

Ec523 is closer to the vacuum level than Ec522. Specifically, Ec523 is preferably located closer to the vacuum level than Ec522 by 0.05 eV or more, 0.07 eV or more, 0.1 eV or more, or 0.15 eV or more and 2 eV or less, 1 eV or less, 0.5 eV or less, or 0.4 eV or less.

In some cases, there is a mixed region of the OS layer 521 and the OS layer 522 between the OS layer 521 and OS layer 522. Furthermore, in some cases, there is a mixed region of the OS layer 523 and the OS layer 522 between the OS layer 523 and OS layer 522. Because the mixed region has a low interface state density, a stack of the OS layers 521 to 523 (the OS layer 520) has a band structure where energy at each interface and in the vicinity of the interface is changed continuously (continuous junction).

Electrons transfer mainly through the OS layer 522 in the OS layer 520 having such an energy band structure. Therefore, even if an interface state exists at the interface between the OS layer 521 and the insulating layer 512 or the interface between the OS layer 523 and the insulating layer 513, electron movement in the OS layer 520 is less likely to be inhibited and the on-state current of the transistor can be increased.

Although trap states Et502 due to impurities or defects might be formed in the vicinity of the interface between the OS layer 521 and the insulating layer 512 and the interface between the OS layer 523 and the insulating layer 513 as illustrated in FIG. 22B, the OS layer 522 can be separated from the trap states Et502 owing to the existence of the OS layers 521 and 523. In the transistor 501, in the channel width direction, the top surface and side surfaces of the OS layer 522 are in contact with the OS layer 523, and the bottom surface of the OS layer 522 is in contact with the OS layer 521 (see FIG. 16C). Surrounding the OS layer 522 by the OS layers 521 and 523 in this manner can further reduce the influence of the trap states Et502.

However, when the energy difference between Ec522 and Ec521 or Ec523 is small, an electron in the OS layer 522 might reach the trap state by passing over the energy difference. Since the electron is trapped in the trap level, negative fixed electric charge is caused at the interface with the insulating film; thus, the threshold voltage of the transistor is shifted in a positive direction. Therefore, each of the energy gaps between Ec521 and Ec522 and between Ec522 and Ec523 is preferably 0.1 eV or more, or further preferably 0.15 eV or more, in which case a change in the threshold voltage of the OS transistor 501 can be reduced and the OS transistor 501 can have favorable electrical characteristics.

As factors of inhibiting electron movement are decreased, the on-state current of the transistor can be increased. For example, in the case where there is no factor of inhibiting electron movement, electrons are assumed to be moved efficiently. Electron movement is inhibited, for example, in the case where physical unevenness in the channel formation region is large. The electron movement is also inhibited, for example, in the case where the density of defect states is high in a region where a channel is formed.

To increase the on-state current of the OS transistor 501, for example, root mean square (RMS) roughness with a measurement area of 1 μm×1 μm of a top surface or a bottom surface of the OS layer 522 (a formation surface; here, the OS layer 521) is less than 1 nm, preferably less than 0.6 nm, more preferably less than 0.5 nm, still more preferably less than 0.4 nm. The average surface roughness (also referred to as Ra) with the measurement area of 1 μm×1 μm is less than 1 nm, preferably less than 0.6 nm, more preferably less than 0.5 nm, still more preferably less than 0.4 nm. The maximum difference (P-V) with the measurement area of 1 μm×1 μm is less than 10 nm, preferably less than 9 nm, more preferably less than 8 nm, still more preferably less than 7 nm. RMS roughness, Ra, and P-V can be measured using a scanning probe microscope SPA-500 manufactured by SII Nano Technology Inc.

For example, in the case where the OS layer 522 contains oxygen vacancies (also denoted by $V_O$), donor levels are formed by entry of hydrogen into sites of oxygen vacancies in some cases. A state in which hydrogen enters sites of oxygen vacancies are denoted by $V_OH$ in the following description in some cases. $V_OH$ is a factor of decreasing the on-state current of the transistor because $V_OH$ scatters electrons. Note that sites of oxygen vacancies become more stable by entry of oxygen than by entry of hydrogen. Thus, by decreasing oxygen vacancies in the OS layer 522, the on-state current of the transistor can be increased in some cases. For example, the hydrogen concentration at a certain depth in the OS layer 522 or in a certain region of the OS layer 522, which is measured by secondary ion mass spectrometry (SIMS), is lower than or equal to $2 \times 10^{20}$ atoms/cm$^3$, preferably lower than or equal to $5 \times 10^{19}$ atoms/cm$^3$, further preferably lower than or equal to $1 \times 10^{19}$ atoms/cm$^3$, still further preferably lower than or equal to $5 \times 10^{18}$ atoms/cm$^3$.

To decrease oxygen vacancies in the OS layer 522, for example, there is a method in which excess oxygen in the insulating film 512 is moved to the OS layer 522 through the OS layer 521. In this case, the OS layer 521 is preferably a layer having an oxygen-transmitting property (a layer through which oxygen passes or is transmitted).

In the case where the OS transistor 501 has an s-channel structure, a channel is formed in the whole of the OS layer 522. Therefore, as the OS layer 522 has a larger thickness, a channel region becomes larger. In other words, the thicker the OS layer 522 is, the larger the on-state current of the transistor is. For example, the OS layer 522 has a region with a thickness of greater than or equal to 20 nm, greater than or equal to 40 nm, greater than or equal to 60 nm, or greater than or equal to 100 nm. Note that the OS layer 522 has a region with a thickness of, for example, less than or equal to 300 nm, preferably less than or equal to 200 nm, more preferably less than or equal to 150 nm because the productivity of the semiconductor device might be decreased.

Moreover, the thickness of the OS layer 523 is preferably as small as possible to increase the on-state current of the transistor. The thickness of the OS layer 523 is less than 10 nm, preferably less than or equal to 5 nm, or further preferably less than or equal to 3 nm, for example. Meanwhile, the OS layer 523 has a function of blocking entry of elements other than oxygen (such as hydrogen and silicon) included in the adjacent insulator into the OS layer 522. For example, the OS layer 523 has a region with a thickness of greater than or equal to 0.3 nm, preferably greater than or equal to 1 nm, more preferably greater than or equal to 2 nm. The OS layer 523 preferably has an oxygen blocking property to suppress outward diffusion of oxygen released from the insulating film 512 and the like.

To improve reliability, preferably, the thickness of the OS layer 521 is large and the thickness of the OS layer 523 is small. For example, the OS layer 521 has a region with a thickness of, for example, greater than or equal to 10 nm, preferably greater than or equal to 20 nm, more preferably greater than or equal to 40 nm, still more preferably greater than or equal to 60 nm. When the thickness of the OS layer 521 is made large, a distance from an interface between the adjacent insulator and the OS layer 521 to the OS layer 522 in which a channel is formed can be large. Since the productivity of the semiconductor device might be decreased, the OS layer 521 has a region with a thickness of, for example, less than or equal to 200 nm, preferably less than or equal to 120 nm, more preferably less than or equal to 80 nm.

In order that an OS transistor in which a channel is formed in an oxide semiconductor have stable electrical characteristics, it is effective to make the oxide semiconductor intrinsic or substantially intrinsic by reducing the concentration of impurities in the oxide semiconductor. The term "substantially intrinsic" refers to a state where an oxide semiconductor has a carrier density lower than $1\times10^{17}/cm^3$, preferably lower than $1\times10^{15}/cm^3$, more preferably lower than $1\times10^{13}/cm^3$.

In the oxide semiconductor, hydrogen, nitrogen, carbon, silicon, and a metal element other than a main component are impurities. For example, hydrogen and nitrogen form donor levels to increase the carrier density, and silicon forms impurity levels in the oxide semiconductor. The impurity levels serve as traps and might cause the electric characteristics of the transistor to deteriorate. Therefore, it is preferable to reduce the concentration of the impurities in the OS layers 521, 522, and 523 and at interfaces between the OS layers.

In order to make the oxide semiconductor intrinsic or substantially intrinsic, for example, the concentration of silicon at a certain depth of the oxide semiconductor or in a region of the oxide semiconductor, which is measured by SIMS, is lower than $1\times10^{19}$ atoms/cm$^3$, preferably lower than $5\times10^{18}$ atoms/cm$^3$, more preferably lower than $1\times10^{18}$ atoms/cm$^3$. The concentration of hydrogen at a certain depth of the oxide semiconductor or in a region of the oxide semiconductor is lower than or equal to $2\times10^{20}$ atoms/cm$^3$, preferably lower than or equal to $5\times10^{19}$ atoms/cm$^3$, more preferably lower than or equal to $1\times10^{19}$ atoms/cm$^3$, still more preferably lower than or equal to $5\times10^{18}$ atoms/cm$^3$. The concentration of nitrogen at a certain depth of the oxide semiconductor or in a region of the oxide semiconductor is lower than $5\times10^{19}$ atoms/cm$^3$, preferably lower than or equal to $5\times10^{18}$ atoms/cm$^3$, more preferably lower than or equal to $1\times10^{18}$ atoms/cm$^3$, still more preferably lower than or equal to $5\times10^{17}$ atoms/cm$^3$.

In addition, in the case where the oxide semiconductor includes a crystal, high concentration of silicon or carbon might reduce the crystallinity of the oxide semiconductor. In order not to reduce the crystallinity of the oxide semiconductor, for example, the concentration of silicon at a certain depth of the oxide semiconductor or in a region of the oxide semiconductor is lower than $1\times10^{19}$ atoms/cm$^3$, preferably lower than $5\times10^{18}$ atoms/cm$^3$, more preferably lower than $1\times10^{18}$ atoms/cm$^3$. Furthermore, the concentration of carbon at a certain depth of the oxide semiconductor or in a region of the oxide semiconductor is lower than $1\times10^{19}$ atoms/cm$^3$, preferably lower than $5\times10^{18}$ atoms/cm$^3$, more preferably lower than $1\times10^{18}$ atoms/cm$^3$, for example.

A transistor in which a highly purified oxide semiconductor is used for a channel formation region as described above has an extremely low off-state current. In the case where the voltage between a source and a drain is set at about 0.1 V, 5 V, or 10 V, for example, the off-state current standardized on the channel width of the transistor can be as low as several yoctoamperes per micrometer to several zeptoamperes per micrometer.

FIGS. 16A to 16D show examples in which the OS layer 520 has a three-layer structure; however, the present invention is not limited thereto. For example, the OS layer 520 may have a two-layer structure without the OS layer 521 or the OS layer 523. Alternatively, the OS layer 520 may have a four-layer structure in which any one of the oxide semiconductors described as the OS layers 521, 522, and 523 is provided below or over the OS layer 521 or below or over the OS layer 523. Alternatively, the OS layer 520 may have an n-layer structure (n is an integer of 5 or more) in which any one of the oxide semiconductors (e.g., the OS layers 521 to 523) is provided at two or more of the following positions: between arbitrary layers in the OS layer 520, over the OS layer 520, and below the OS layer 520.

<<Structure Example 2 of OS Transistor>>

Figure 17A:
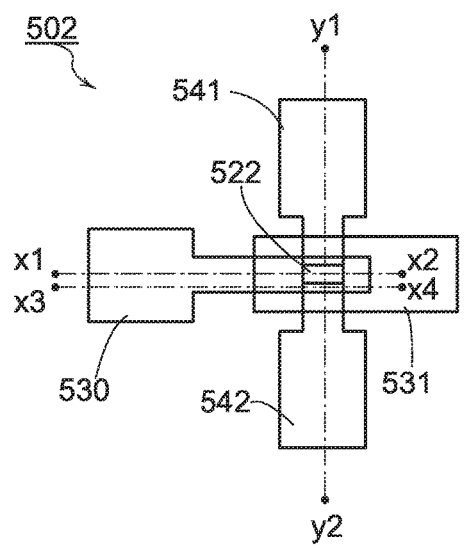
FIGS. 17A to 17D illustrate a structure example of an OS transistor.
Figure 17B:
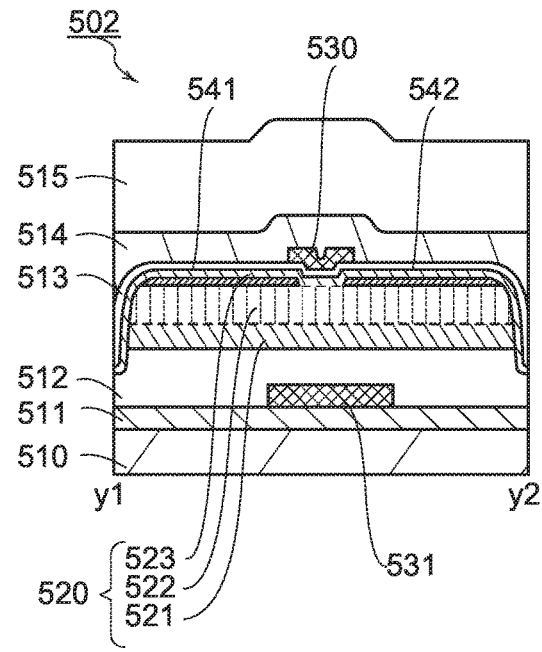
Figure 17C:
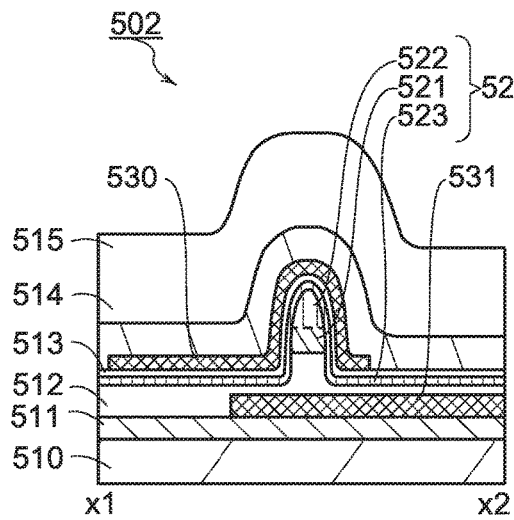
Figure 17D:
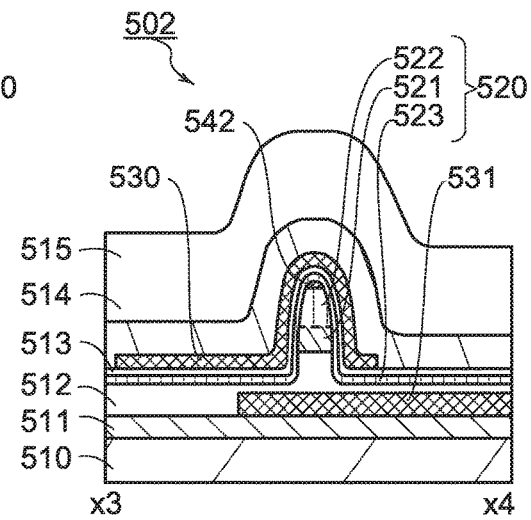
Figure 19A:
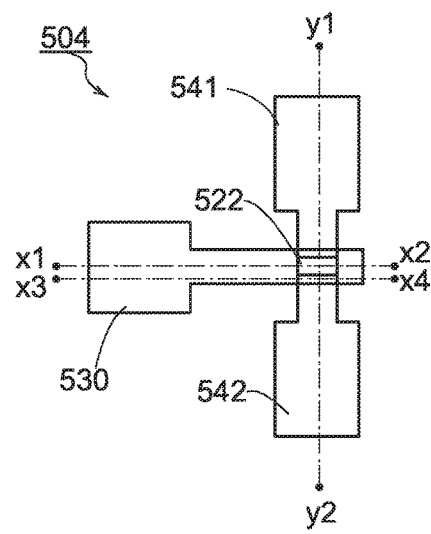
FIGS. 19A to 19D illustrate a structure example of an OS transistor.
Figure 19B:
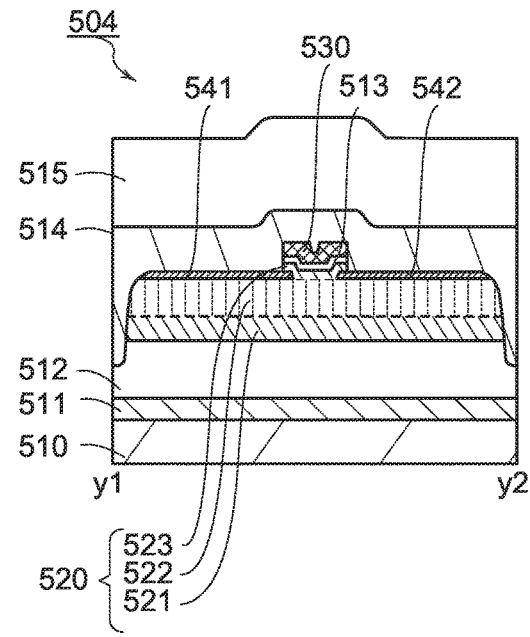
Figure 19C:
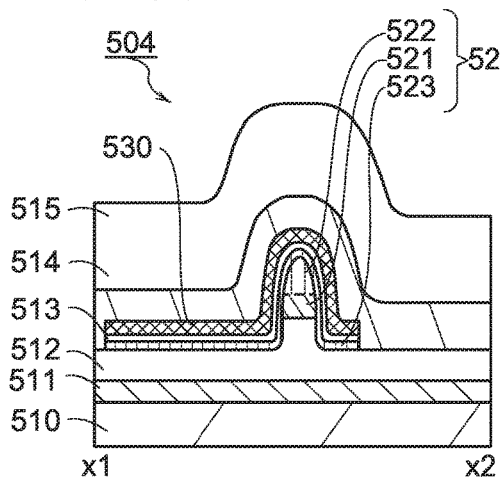
Figure 19D:
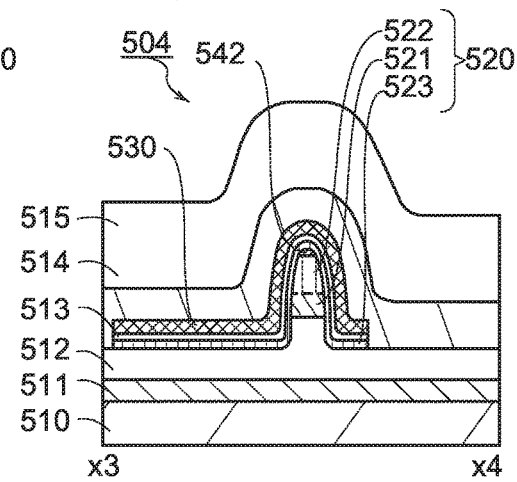
Figure 20A:
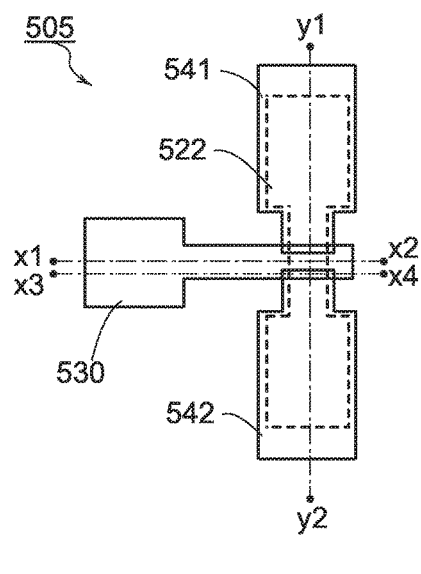
FIGS. 20A to 20D illustrate a structure example of an OS transistor.
Figure 20B:
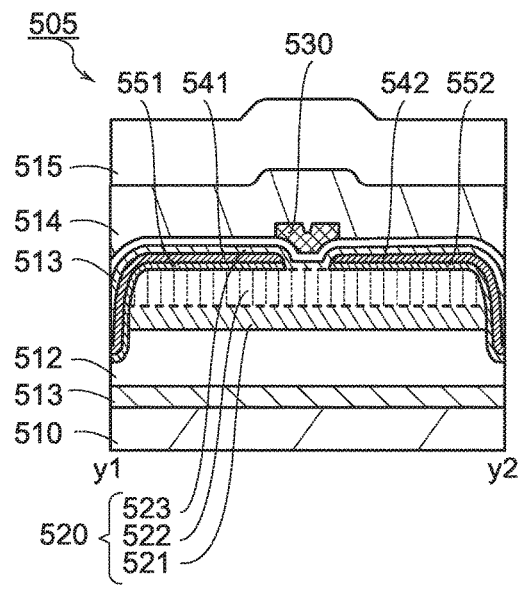
Figure 20C:
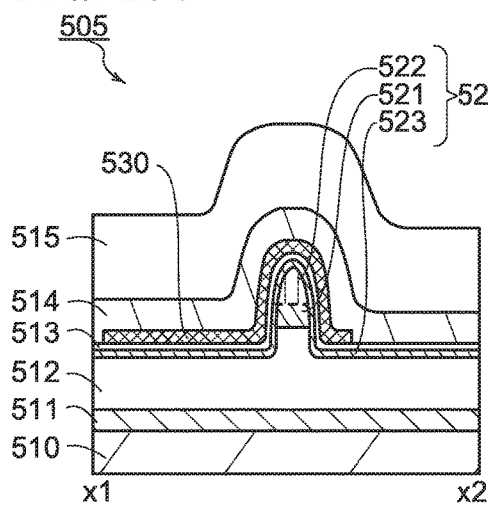
Figure 20D:
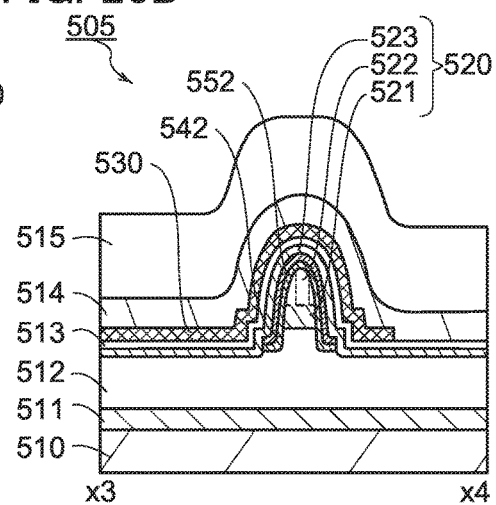

An OS transistor 502 in FIGS. 17A to 17D is a modification example of the OS transistor 501. FIG. 17A is a top view of the OS transistor 502. FIG. 17B is a cross-sectional view taken along line y1-y2 in 17A. FIG. 17C is a cross-sectional view taken along line x1-x2 in 17A. FIG. 17D is a cross-sectional view taken along line x3-x4 in 17A. Note that to clarify the device structure, FIG. 17A does not illustrate some components.

Like the OS transistor 501, the OS transistor 502 in FIGS. 17A to 17D also has the s-channel structure. The OS transistor 502 is different from the OS transistor 501 in the shapes of the conductive layer 541 and the conductive layer 542 and in that the conductive layer 531 is provided over the insulating layer 511.

The conductive layer 541 and the conductive layer 542 in the OS transistor 502 are formed from a hard mask used for forming the stacked film of the OS layer 521 and the OS layer 522. Therefore, the conductive layer 541 and the conductive layer 542 do not have regions in contact with the side surfaces of the OS layer 521 and the OS layer 522 (FIG. 17D).

For example, through the following steps, the OS layers 521 and 522 and the conductive layers 541 and 542 can be formed. A two-layer oxide semiconductor film including the OS layers 521 and 522 is formed. A single-layer or multi-layer conductive film is formed over the oxide semiconductor film. This conductive film is etched, so that a hard mask is formed. Using this hard mask, the two-layer oxide semiconductor film is etched to form the OS layers 521 and 522. Then, the hard mask is etched to form the conductive layer 541 and the conductive layer 542.

The conductive layer 531 can function as a back gate electrode of the OS transistor 502. The conductive layer 531 can be provided in the OS transistor 501 in FIGS. 17A to 17D, and OS transistors 503 to 506 (FIGS. 18A to 18D, FIGS. 19A to 19D, FIGS. 20A to 20D, and FIGS. 21A to 21D) which will be described later.

A signal sa and a fixed potential Vb may be supplied to the conductive layer 530 (gate electrode) and the conductive layer 531 (back gate electrode), respectively. Alternatively, the signal sa and a signal sb may be supplied to the conductive layer 530 and the conductive layer 531, respectively. Further alternatively, a fixed potential Va and a fixed potential Pb may be supplied to the conductive layer 530 and the conductive layer 531, respectively.

<Structure Examples 3 and 4 of OS Transistor>

The OS transistor 503 in FIGS. 18A to 18D is a modification example of the OS transistor 501. The OS transistor 504 in FIGS. 19A to 19D is a modification example of the OS transistor 502. In each of the OS transistors 503 and 504, the conductive layer 530 is used as a mask, and the OS layer 523 and the insulating layer 513 are etched. Accordingly, edges of the OS layer 523 and the insulating layer 513 are substantially aligned with an edge of the conductive layer 530.

<Structure Examples 5 and 6 of OS Transistor>

The OS transistor 505 in FIGS. 20A to 20D is a modification example of the OS transistor 501, and the OS transistor 506 in FIGS. 21A to 21D is a modification example of the OS transistor 502. The OS transistor 505 has a layer 551 between the OS layer 523 and the conductive layer 541. The OS transistor 506 has a layer 552 between the OS layer 523 and the conductive layer 542.

The layers 551 and 552 can be formed using any of a transparent conductor, an oxide semiconductor, a nitride semiconductor, and an oxynitride semiconductor, for example. The layers 551 and 552 can be formed using an n-type oxide semiconductor layer or can be formed using a conductive layer that has higher resistance than the conductive layers 541 and 542. The layers 551 and 552 can be formed using any of, for example, a layer containing indium, tin, and oxygen, a layer containing indium and zinc, a layer containing indium, tungsten, and zinc, a layer containing tin and zinc, a layer containing zinc and gallium, a layer containing zinc and aluminum, a layer containing zinc and fluorine, a layer containing zinc and boron, a layer containing tin and antimony, a layer containing tin and fluorine, a layer containing titanium and niobium, and the like. Note that, these layers may contain one or more of hydrogen, carbon, nitrogen, silicon, germanium, and argon.

The layers 551 and 552 may have a property of transmitting visible light. Alternatively, the layers 551 and 552 may have a property of not transmitting visible light, ultraviolet light, infrared light, or X-rays by reflecting or absorbing it. In some cases, such a property can suppress a change in the electrical characteristics of the transistor due to stray light.

The layers 551 and 552 may preferably be formed using a layer that does not form a Schottky barrier with the OS layer 523. Accordingly, on-state characteristics of the OS transistors 505 and 506 can be improved.

Note that the layers 551 and 552 preferably have higher resistance than the conductive layers 541 and 542. The resistance of the layers 551 and 552 is preferably lower than the channel resistance of the transistor. For example, the layers 551 and 552 may have a resistivity of higher than or equal to 0.1 Ωcm and lower than or equal to 100 Ωcm, higher than or equal to 0.5 Ωcm and lower than or equal to 50 Ωcm, or higher than or equal to 1 Ωcm and lower than or equal to 10 Ωcm. The layers 551 and 552 having resistivity within the above range can reduce electric field concentration in a boundary portion between the channel and the drain. Therefore, a change in the electrical characteristics of the transistor can be suppressed. In addition, punch-through current generated by an electric field from the drain can be reduced. Thus, a transistor with small channel length can have favorable saturation characteristics. Note that in a circuit configuration where the source and the drain do not interchange during the operation, only one of the layers 551 and 552 (e.g., the layer on the drain side) may be preferably provided.

<<Oxide Semiconductor Film>>

An oxide semiconductor film is described below. In this specification, the trigonal and rhombohedral crystal systems are included in the hexagonal crystal system. In this specification, the term "parallel" indicates that the angle formed between two straight lines is greater than or equal to −10° and less than or equal to 10°, and accordingly also includes the case where the angle is greater than or equal to −5° and less than or equal to 5°. The term "substantially parallel" indicates that the angle formed between two straight lines is greater than or equal to −30° and less than or equal to 30°. In addition, the term "perpendicular" indicates that the angle formed between two straight lines is greater than or equal to 80° and less than or equal to 100°, and accordingly also includes the case where the angle is greater than or equal to 85° and less than or equal to 95°. In addition, the term "substantially perpendicular" indicates that the angle formed between two straight lines is greater than or equal to 60° and less than or equal to 120°.

An oxide semiconductor film is classified into a non-single-crystal oxide semiconductor film and a single crystal oxide semiconductor film. Alternatively, an oxide semiconductor is classified into, for example, a crystalline oxide semiconductor and an amorphous oxide semiconductor.

The non-single-crystal oxide semiconductor film includes any of a c-axis aligned crystalline oxide semiconductor (CAAC-OS) film, a polycrystalline oxide semiconductor film, a microcrystalline oxide semiconductor film, an amorphous oxide semiconductor film, and the like. In addition, examples of a crystalline oxide semiconductor include a single crystal oxide semiconductor, a CAAC-OS, a polycrystalline oxide semiconductor, and a microcrystalline oxide semiconductor.

<CAAC-OS Film>

The CAAC-OS film is one of oxide semiconductor films having a plurality of c-axis aligned crystal parts.

In a combined analysis image (also referred to as a high-resolution TEM image) of a bright-field image and a diffraction pattern of a CAAC-OS film, which is obtained using a transmission electron microscope (TEM), a plurality of crystal parts can be observed. However, in the high-resolution TEM image, a boundary between crystal parts, that is, a grain boundary is not clearly observed. Thus, in the CAAC-OS film, a reduction in electron mobility due to the grain boundary is less likely to occur.

In the high-resolution cross-sectional TEM image of the CAAC-OS film observed in a direction substantially parallel to the sample surface, metal atoms arranged in a layered manner are seen in the crystal parts. Each metal atom layer has a morphology reflecting unevenness of a surface where the CAAC-OS film is formed (hereinafter, a surface where the CAAC-OS film is formed is also referred to as a formation surface) or a top surface of the CAAC-OS film, and is arranged parallel to the formation surface or the top surface of the CAAC-OS film.

On the other hand, according to the high-resolution planview TEM image of the CAAC-OS film observed in a direction substantially perpendicular to the sample surface, metal atoms are arranged in a triangular or hexagonal configuration in the crystal parts. However, there is no regularity of arrangement of metal atoms between different crystal parts.

A CAAC-OS film is subjected to structural analysis with an X-ray diffraction (XRD) apparatus. For example, when the CAAC-OS film including an $InGaZnO_4$ crystal is analyzed by an out-of-plane method, a peak appears frequently when the diffraction angle ($2\theta$) is around 31°. This peak is derived from the (009) plane of the $InGaZnO_4$ crystal, which indicates that crystals in the CAAC-OS film have c-axis alignment, and that the c-axes are aligned in a direction substantially perpendicular to the formation surface or the top surface of the CAAC-OS film.

Note that when the CAAC-OS film with an $InGaZnO_4$ crystal is analyzed by an out-of-plane method, a peak may also be observed when $2\theta$ is around 36°, in addition to the peak at $2\theta$ of around 31°. The peak at $2\theta$ of around 36° indicates that a crystal having no c-axis alignment is included in part of the CAAC-OS film. It is preferable that in the CAAC-OS film, a peak appear when $2\theta$ is around 31 and that a peak not appear when $2\theta$ is around 36°.

The CAAC-OS film is an oxide semiconductor film having low impurity concentration. The impurity is an element other than the main components of the oxide semiconductor film, such as hydrogen, carbon, silicon, or a transition metal element. In particular, an element that has higher bonding strength to oxygen than a metal element included in the oxide semiconductor film, such as silicon, disturbs the atomic arrangement of the oxide semiconductor film by depriving the oxide semiconductor film of oxygen and causes a decrease in crystallinity. Further, a heavy metal such as iron or nickel, argon, carbon dioxide, or the like has a large atomic radius (molecular radius), and thus disturbs the atomic arrangement of the oxide semiconductor film and causes a decrease in crystallinity when it is contained in the oxide semiconductor film. Note that the impurity contained in the oxide semiconductor film might serve as a carrier trap or a carrier generation source.

The CAAC-OS film is an oxide semiconductor film having a low density of defect states. In some cases, oxygen vacancies in the oxide semiconductor film serve as carrier traps or serve as carrier generation sources when hydrogen is captured therein.

The state in which impurity concentration is low and density of defect states is low (the number of oxygen vacancies is small) is referred to as a "highly purified intrinsic" or "substantially highly purified intrinsic state. A highly purified intrinsic or substantially highly purified intrinsic oxide semiconductor film has few carrier generation sources, and thus can have a low carrier density. Therefore, a transistor including the oxide semiconductor film rarely has negative threshold voltage (is rarely normally on). The highly purified intrinsic or substantially highly purified intrinsic oxide semiconductor film has few carrier traps. Accordingly, the transistor including the oxide semiconductor film has little variation in electrical characteristics and high reliability. Electric charge trapped by the carrier traps in the oxide semiconductor film takes a long time to be released and might behave like fixed electric charge. Thus, the transistor including the oxide semiconductor film having high impurity concentration and a high density of defect states has unstable electrical characteristics in some cases.

With the use of the CAAC-OS film in a transistor, variation in the electrical characteristics of the transistor due to irradiation with visible light or ultraviolet light is small.

<Microcrystalline Oxide Semiconductor Film>

A microcrystalline oxide semiconductor film has a region in which a crystal part is observed and a region in which a crystal part is not clearly observed in a high-resolution TEM image. In most cases, the size of a crystal part included in the microcrystalline oxide semiconductor film is greater than or equal to 1 nm and less than or equal to 100 nm, or greater than or equal to 1 nm and less than or equal to 10 nm. A microcrystal with a size greater than or equal to 1 nm and less than or equal to 10 nm, or a size greater than or equal to 1 nm and less than or equal to 3 nm, is specifically referred to as nanocrystal (nc). An oxide semiconductor film including nanocrystal is referred to as an nc-OS (nanocrystalline oxide semiconductor) film. In a high-resolution TEM image of the nc-OS film, for example, a grain boundary is not clearly observed in some cases.

In the nc-OS film, a microscopic region (for example, a region with a size greater than or equal to 1 nm and less than or equal to 10 nm, in particular, a region with a size greater than or equal to 1 nm and less than or equal to 3 nm) has a periodic atomic arrangement. There is no regularity of crystal orientation between different crystal parts in the nc-OS film. Thus, the orientation of the whole film is not observed. Accordingly, in some cases, the nc-OS film cannot be distinguished from an amorphous oxide semiconductor film depending on an analysis method. For example, when the nc-OS film is subjected to structural analysis by an out-of-plane method with an XRD apparatus using an X-ray having a diameter larger than the size of a crystal part, a peak indicating a crystal plane does not appear. Further, a halo pattern is shown in a selected-area electron diffraction pattern of the nc-OS film obtained by using an electron beam having a probe diameter (e.g., 50 nm or larger) larger than the size of a crystal part. Meanwhile, spots are shown in a nanobeam electron diffraction pattern of the nc-OS film obtained by using an electron beam having a probe diameter close to or smaller than the size of a crystal part. Furthermore, in a nanobeam electron diffraction pattern of the nc-OS film, regions with high luminance in a circular (ring) pattern are shown in some cases. Moreover, in a nanobeam electron diffraction pattern of the nc-OS film, a plurality of spots are shown in a ring-like region in some cases.

The nc-OS film is an oxide semiconductor film that has high regularity as compared with an amorphous oxide semiconductor film. Therefore, the nc-OS film has a lower density of defect states than an amorphous oxide semiconductor film. Note that there is no regularity of crystal orientation between different crystal parts in the nc-OS film. Therefore, the nc-OS film has a higher density of defect states than the CAAC-OS film.

<Amorphous Oxide Semiconductor Film>

The amorphous oxide semiconductor film has disordered atomic arrangement and no crystal part. For example, the amorphous oxide semiconductor film does not have a specific state as in quartz.

In the high-resolution TEM image of the amorphous oxide semiconductor film, crystal parts cannot be found.

When the amorphous oxide semiconductor film is subjected to structural analysis by an out-of-plane method with an XRD apparatus, a peak which shows a crystal plane does not appear. A halo pattern is observed when the amorphous oxide semiconductor film is subjected to electron diffraction. Furthermore, a spot is not observed and a halo pattern appears when the amorphous oxide semiconductor film is subjected to nanobeam electron diffraction.

Note that an oxide semiconductor film may have a structure having physical properties between the nc-OS film and the amorphous oxide semiconductor film. The oxide semiconductor film having such a structure is specifically referred to as an amorphous-like oxide semiconductor (a-like OS) film.

In a high-resolution TEM image of the a-like OS film, a void may be observed. Furthermore, in the high-resolution TEM image, there are a region where a crystal part is clearly observed and a region where a crystal part is not observed. In the a-like OS film, crystallization by a slight amount of electron beam used for TEM observation occurs and growth of the crystal part is found sometimes. In contrast, in the nc-OS film that has good quality, crystallization hardly occurs by a slight amount of electron beam used for TEM observation.

The crystal part size in the a-like OS film and the nc-OS film can be measured using high-resolution TEM images. For example, an $InGaZnO_4$ crystal has a layered structure in which two Ga—Zn—O layers are included between In—O layers. A unit cell of the $InGaZnO_4$ crystal has a structure in which nine layers including three In—O layers and six Ga—Zn—O layers are stacked in the c-axis direction. Accordingly, the distance between the adjacent layers is equivalent to the lattice spacing on the (009) plane (also referred to as d value). The value is calculated to be 0.29 nm from crystal structural analysis. Thus, focusing on lattice fringes in the high-resolution TEM image, each of lattice fringes in which the lattice spacing therebetween is greater than or equal to 0.28 nm and less than or equal to 0.30 nm corresponds to the a-b plane of the $InGaZnO_4$ crystal.

The density of an oxide semiconductor film might vary with its structure. For example, if the composition of an oxide semiconductor film is determined, the structure of the oxide semiconductor film can be estimated from a comparison between the density of the oxide semiconductor film and the density of a single crystal oxide semiconductor film having the same composition as the oxide semiconductor film. For example, the density of the a-like OS film is higher than or equal to 78.6% and lower than 92.3% of the density of the single crystal oxide semiconductor having the same composition. For example, the density of each of the nc-OS film and the CAAC-OS film is higher than or equal to 92.3% and lower than 100% of the density of the single crystal oxide semiconductor having the same composition. Note that it is difficult to deposit an oxide semiconductor film whose density is lower than 78% of the density of the single crystal oxide semiconductor film.

Specific examples of the above description are given. For example, in the case of an oxide semiconductor film with an atomic ratio of In:Ga:Zn=1:1:1, the density of single-crystal $InGaZnO_4$ with a rhombohedral crystal structure is 6.357 $g/cm^3$. For example, in the case of the oxide semiconductor film with an atomic ratio of In:Ga:Zn=1:1:1, the density of an a-like OS film is higher than or equal to 5.0 $g/cm^3$ and lower than 5.9 $g/cm^3$. In addition, for example, in the case of the oxide semiconductor film with an atomic ratio of In:Ga:Zn=1:1:1, the density of an nc-OS film or a CAAC-OS film is higher than or equal to 5.9 $g/cm^3$ and lower than 6.3 $g/cm^3$.

However, there might be no single crystal oxide semiconductor film having the same composition as the oxide semiconductor film. In that case, single crystal oxide semiconductor films with different compositions are combined in an adequate ratio to calculate film density equivalent to that of a single crystal oxide semiconductor film with the desired composition. Note that it is preferable to use as few kinds of single crystal oxide semiconductor film as possible to calculate the film density.

Note that an oxide semiconductor film may be a stacked film including two or more films of an amorphous oxide semiconductor film, an a-like OS film, a microcrystalline oxide semiconductor film, and a CAAC-OS film, for example.

<<Film Formation Method>>

A sputtering method and a plasma-enhanced chemical vapor deposition (PECVD) method are typical examples of a method for forming an insulating film, a conductive film, a semiconductor film, and the like. The insulating film, the conductive film, the semiconductor film, and the like may be formed by another method, for example, a thermal CVD method. A metal organic chemical vapor deposition (MOCVD) method or an atomic layer deposition (ALD) method can be employed as thermal CVD method, for example.

A thermal CVD method has an advantage that no defect due to plasma damage is generated since it does not utilize plasma for forming a film. Deposition by a thermal CVD method may be performed in such a manner that the pressure in a chamber is set to an atmospheric pressure or a reduced pressure, and a source gas and an oxidizer are supplied to the chamber at a time and react with each other in the vicinity of the substrate or over the substrate.

Deposition by an ALD method may be performed in such a manner that the pressure in a chamber is set to an atmospheric pressure or a reduced pressure, source gases for reaction are sequentially introduced into the chamber, and then the sequence of the gas introduction is repeated. For example, two or more kinds of source gases are sequentially supplied to the chamber by switching respective switching valves (also referred to as high-speed valves). In such a case, a first source gas is introduced, an inert gas (e.g., argon or nitrogen) or the like is introduced at the same time as or after the introduction of the first gas so that the source gases are not mixed, and then a second source gas is introduced. Note that in the case where the first source gas and the inert gas are introduced at a time, the inert gas serves as a carrier gas, and the inert gas may also be introduced at the same time as the introduction of the second source gas. Alternatively, the first source gas may be exhausted by vacuum evacuation instead of the introduction of the inert gas, and then the second source gas may be introduced. The first source gas is adsorbed on the surface of the substrate to form a first single-atomic layer; then the second source gas is introduced to react with the first single-atomic layer; as a result, a second single-atomic layer is stacked over the first single-atomic layer, so that a thin film is formed. The sequence of the gas introduction is repeated plural times until a desired thickness is obtained, whereby a thin film with excellent step coverage can be formed. The thickness of the thin film can be adjusted by the number of repetition times of the sequence of the gas introduction; therefore, an ALD method makes it possible to accurately adjust a thickness and thus is suitable for manufacturing a minute FET.

The conductive film which is described in the above embodiment can be formed by a thermal CVD method such as a MOCVD method or an ALD method. For example, in the case where an InGaZnO$_X$ (X>0) film is formed, trimethylindium, trimethylgallium, and diethylzinc can be used. Note that the chemical formula of trimethylindium is In(CH$_3$)$_3$. The chemical formula of trimethylgallium is Ga(CH$_3$)$_3$. The chemical formula of dimethylzinc is Zn(CH$_3$)$_2$. Without limitation to the above combination, triethylgallium (chemical formula: Ga(C$_2$H$_5$)$_3$) can be used instead of trimethylgallium and diethylzinc (chemical formula: Zn (C$_2$H$_5$)$_2$) can be used instead of dimethylzinc For example, in the case where a tungsten film is formed using a deposition apparatus employing ALD, a WF$_6$ gas and a B$_2$H$_6$ gas are sequentially introduced plural times to form an initial tungsten film, and then a WF$_6$ gas and an H$_2$ gas are used, so that a tungsten film is formed. Note that an SiH$_4$ gas may be used instead of a B$_2$H$_6$ gas.

For example, in the case where an oxide semiconductor film, e.g., an In—Ga—Zn—O film is formed using a deposition apparatus using an ALD method, an In(CH$_3$)$_3$ gas and an O$_3$ gas are sequentially introduced plural times to form an InO$_2$ layer, a GaO layer is formed using a Ga(CH$_3$)$_3$ gas and an O$_3$ gas, and then a ZnO layer is formed using a Zn(CH$_3$)$_2$ gas and an O$_3$ gas. Note that the order of these layers is not limited to this example. A mixed compound layer such as an InGaO$_2$ layer, an InZnO$_2$ layer, a GaInO layer, a ZnInO layer, or a GaZnO layer may be formed by mixing of these gases. Note that although an H$_2$O gas which is bubbled with an inert gas such as Ar may be used instead of an O$_3$ gas, it is preferable to use an O$_3$ gas, which does not contain H. Instead of an In(CH$_3$)$_3$ gas, an In(C$_2$H$_5$)$_3$ gas may be used. Instead of a Ga(CH$_3$)$_3$ gas, a Ga(C$_2$H$_5$)$_3$ gas may be used. A Zn(CH$_3$)$_2$ gas may be used.

Example 1

Embodiment 4

In this embodiment, the device structure of a semiconductor device is described. As described in Embodiment 1, the semiconductor device can include a Si transistor and an OS transistor. In such a structure example, the semiconductor device can be downsized by stacking the Si transistor and the OS transistor. A structure example of a semiconductor device with such a stacked structure is described with reference to FIG. 23.

Figure 23:
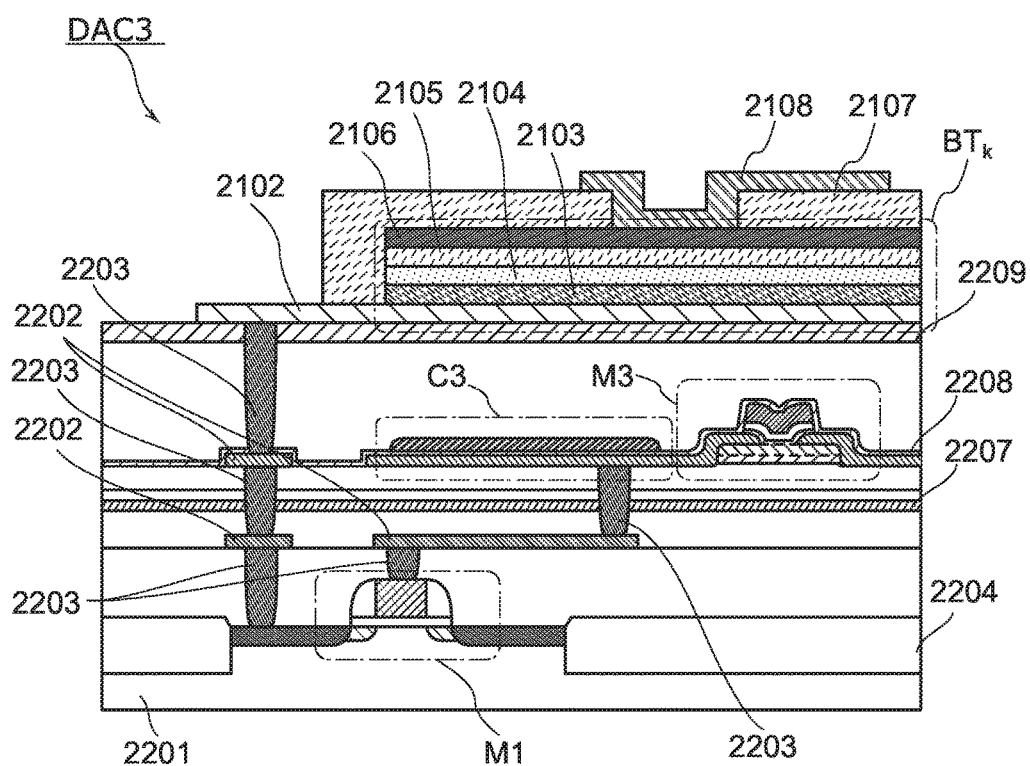
FIG. 23 is a cross-sectional view illustrating a structure example of a semiconductor device.

As an example of the semiconductor device, a device structure of a semiconductor device including the DAC3 in FIG. 3 is described. In FIG. 23, typically, the switch SW3[k] and the battery BT$_k$ are illustrated. FIG. 23 illustrates a cross-sectional structure of the transistor M1, the transistor M3, the capacitor C3, and the battery BT$_k$. Note that FIG. 23 is not a cross-sectional view of the semiconductor device taken along a specific line but a view for illustrating the stacked structure of the semiconductor device.

For the semiconductor substrate 2201, a bulk or a silicon on insulator (SOI) semiconductor substrate, or the like can be used. A crystalline structure of a semiconductor included in the semiconductor substrate 2201 is preferably a single-crystal structure or a polycrystalline structure. As a semiconductor material of the semiconductor substrate 2201, silicon, silicon carbide, silicon germanium, or the like is used. A transistor manufactured using a semiconductor substrate can operate at high speed easily. In the case of using a p-type single crystal silicon substrate as the semiconductor substrate 2201, an impurity element imparting n-type conductivity may be added to part of the semiconductor substrate 2201 to form an n-well, and a p-type transistor can be formed in a region where the n-well is formed. As the impurity element imparting n-type conductivity, phosphorus (P), arsenic (As), or the like can be used. As the impurity element imparting p-type conductivity, boron (B) or the like may be used.

Here, a planar-type field-effect transistor is used as the transistor M. The insulating layer 2204 functions as an element separation region. The device structure of the transistor M1 is not limited to the example of FIG. 23. For example, a 3D transistor formed utilizing an projection portion of a semiconductor substrate (e.g., a fin-type transistor or a Tri-gate type transistor) can be employed.

The transistor M3 and the capacitor C3 are stacked over the transistor M1. The transistor M3 is an OS transistor in which a channel is formed in an oxide semiconductor layer. When the transistor described in this embodiment is used as the transistor M3, the transistor can have excellent sub-threshold characteristics and a minute structure. In the example of FIG. 23, the transistor M3 has a device structure similar to that of the transistor 501 in FIGS. 16A to 16D. The transistor M3 and the capacitor C3 are each electrically connected to a gate electrode of the transistor M1 via a plug 2203 and a wiring 2202. FIG. 23 shows an example in which an electrode of the capacitor C3 and an electrode of the transistor M3 are integrated and an insulating layer covering the transistor M3 also serves as a dielectric of the capacitor C3. For example, the capacitor C3 can be stacked over the transistor M3.

An insulating layer 2207 is provided between the transistor M1 and the transistor M3. The insulating layer 2207 makes hydrogen remain in the lower portion, thereby improving the reliability of the transistor M1. In addition, since the insulating layer 2207 suppresses diffusion of hydrogen from the lower portion to the upper portion, the reliability of the transistor M3 can also be improved. The insulating layer 2207 can be, for example, formed using aluminum oxide, aluminum oxynitride, gallium oxide, gallium oxynitride, yttrium oxide, yttrium oxynitride, hafnium oxide, hafnium oxynitride, or yttria-stabilized zirconia (YSZ).

An insulating layer 2208 is provided so as to cover the transistor M3. For the insulating layer 2208, a material that is similar to that of the insulating layer 2207 can be used, and in particular, an aluminum oxide film is preferably used. The aluminum oxide film has a high shielding (blocking) effect of preventing penetration of both oxygen and impurities such as hydrogen and moisture. Thus, by using the aluminum oxide film as the insulating layer 2208, release of oxygen from the oxide semiconductor layer included in the transistor M3 can be prevented and entry of water and hydrogen into the oxide semiconductor layer can be prevented.

The wiring 2202, the plug 2203, and a wiring 2108 can be formed using a metal made of a low resistance material, such as copper (Cu), tungsten (W), molybdenum (Mo), gold (Au), aluminum (Al), manganese (Mn), titanium (Ti), tantalum (Ta), nickel (Ni), chromium (Cr), lead (Pb), tin (Sn), iron (Fe), or cobalt (Co); an alloy of such a metal; or a metal compound containing such a metal. It is particularly preferable to use a high-melting-point material that has both heat resistance and conductivity, such as tungsten or molybdenum. In addition, the wiring 2202, the plug 2203, and the wiring 2108 are preferably formed using a low-resistance conductive material such as aluminum or copper. The wiring 2202, the plug 2203, and the wiring 2108 are preferably formed using a Cu—Mn alloy, since in that case, manganese oxide formed at the interface with an insulator containing oxygen has a function of preventing Cu diffusion. The wirings 2108 and 2202 and the plug 2203 may have a single layer structure or a stacked structure.

In FIG. 23, regions where reference numerals and hatching patterns are not given show regions formed of an insulator. In these regions, an insulator containing one or more materials selected from aluminum oxide, aluminum nitride oxide, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, tantalum oxide, and the like can be used. Alternatively, in these regions, an organic resin such as a polyimide resin, a polyamide resin, an acrylic resin, a siloxane resin, an epoxy resin, or a phenol resin can be used.

The battery $BT_k$ is an all-solid-state secondary battery including a solid electrolyte. The battery $BT_k$ can be fabricated using a semiconductor manufacturing process. Note that the semiconductor manufacturing process refers to methods in general that are used for manufacturing semiconductor devices, such as a film formation process, a crystallization process, a plating process, a cleaning process, a lithography process, an etching process, a polishing process, an impurity implantation process, or a heat treatment process.

The battery $BT_k$ is formed over an insulating layer 2209. The insulating layer 2209 may be formed to have a single-layer or stacked structure, using one or more of silicon oxide, silicon oxynitride, silicon nitride oxide, silicon nitride, aluminum oxide, aluminum nitride, aluminum oxynitride, hafnium oxide, zirconium oxide, yttrium oxide, gallium oxide, lanthanum oxide, cesium oxide, tantalum oxide, and magnesium oxide.

In the case where the battery $BT_k$ includes lithium, the insulating layer 2209 preferably has a function of preventing (blocking) diffusion of lithium. When lithium that is included in the battery $BT_k$ enters a semiconductor element (the transistor M1 or the transistor M3) as a movable ion, the semiconductor element deteriorates. With the insulating layer 2209 blocking lithium ions, a highly reliable semiconductor device can be provided.

In the case where the battery $BT_k$ includes lithium, the insulating layer 2209 preferably includes halogen such as fluorine, chlorine, bromine, or iodine. When the insulating layer 2209 includes halogen, the halogen is easily combined with lithium that is an alkali metal. Then, lithium is fixed in the insulating layer 2209, whereby diffusion of lithium to the outside of the insulating layer 2209 can be prevented.

In the case where the insulating layer 2209 is formed of silicon nitride by a chemical vapor deposition (CVD) method, for example, when a halogen-containing gas is mixed in a source gas at 3% to 6% (volume ratio), e.g., at 5%, the obtained silicon nitride film includes the halogen. The concentration of the halogen element included in the insulating layer 2209, measured by secondary ion mass spectrometry (SIMS), is greater than or equal to $1\times10^{17}$ atoms/cm$^3$, preferably greater than or equal to $1\times10^{18}$ atoms/cm$^3$, and more preferably greater than or equal to $1\times10^{19}$ atoms/cm$^3$.

The insulating layer 2107 has a function of protecting the battery $BT_k$. As the insulating layer 2107, for example, an insulating material such as a resin (e.g., a polyimide resin, a polyamide resin, an acrylic resin, a siloxane resin, an epoxy resin, or a phenol resin), glass, an amorphous compound, or ceramics can be used. Furthermore, a layer containing calcium fluoride or the like may be provided as a water absorption layer between resin layers. The insulating layer 2107 can be formed by a spin coating method, an ink-jet method, or the like. Alternatively, the insulating layer 2107 can be formed to have a single-layer structure or a stacked structure using one or more of silicon oxide, silicon oxynitride, silicon nitride oxide, silicon nitride, aluminum oxide, aluminum nitride, aluminum oxynitride, hafnium oxide, zirconium oxide, yttrium oxide, gallium oxide, lanthanum oxide, cesium oxide, tantalum oxide, and magnesium oxide.

The semiconductor device may further include a semiconductor element over the battery $BT_k$. In that case, the insulating layer 2107 preferably has a function of preventing (blocking) diffusion of lithium, as with the insulating layer 2209. With the insulating layer 2107 blocking lithium, a highly reliable semiconductor device can be provided.

In the case where a semiconductor element is formed over the battery $BT_k$, the insulating layer 2107 preferably includes halogen such as fluorine, chlorine, bromine, or iodine, as with the insulating layer 2209. With the insulating layer 2107 including halogen, the halogen is easily combined with lithium that is an alkali metal, whereby diffusion of lithium to the outside of the insulating layer 2107 can be prevented.

The DAC3 in FIG. 23 preferably includes a cooling device such as a heat sink, a water-cooling cooler, or a cooling fan over a battery block including the battery $BT_k$. The provision of the cooling device can prevent a malfunction of the semiconductor device caused by heat generation of the battery $BT_k$. An air gap (a space of a vacuum layer) may be provided between the battery $BT_k$ and the transistor M3. The provision of the air gap can prevent a malfunction of the switch SW3 caused by heat generation of the battery $BT_k$.

In the example of FIG. 23, the battery $BT_k$ is stacked over the transistor M3; however, a structure of the semiconductor device is not limited thereto. For example, in the case where formation of the battery $BT_k$ requires heat treatment at such a high temperature as to destroy the transistor M3, the battery $BT_k$ may be provided between the transistor M1 and the transistor M3.

<Structure Example of Battery $BT_k$>

The battery $BT_k$ includes a positive electrode current collector layer 2102, a positive electrode active material layer 2103, a solid electrolyte layer 2104, a negative electrode active material layer 2105, and a negative electrode current collector layer 2106. The positive electrode current collector layer 2102 and the positive electrode active material layer 2103 function as a positive electrode, and the negative electrode current collector layer 2106 and the negative electrode active material layer 2105 function as a negative electrode. In the example of FIG. 23, the insulating film 2107 is formed over the negative electrode current collector layer 2106, and the wiring 2108 is formed in an opening portion of the insulating layer 2107. The wiring 2108 is electrically connected to the negative electrode current collector layer 2106. The positive electrode current collector layer 2102 is electrically connected to the transistor M1 via the wiring 2202 and the plug 2203. Depending on a circuit configuration and the like, a wiring in contact with the positive electrode current collector layer 2102 may be formed so that the wiring and the transistor M1 are electrically connected to each other.

Although not shown in the drawing, a lithium layer may be formed at the interface between the solid electrolyte layer 2104 and the positive electrode active material layer 2103 or at the interface between the solid electrolyte layer 2104 and the negative electrode active material layer 2105. The lithium layer is for supplying (or predoping) lithium serving as a carrier to the positive electrode active material layer or the negative electrode active material layer in the battery $BT_k$. The lithium layer may be formed over the entire surface of a layer over which the lithium layer is to be formed. Further, a copper layer or a nickel layer may be formed in contact with the lithium layer. The copper layer or the nickel layer has a shape substantially the same as that of the lithium layer. The copper layer or the nickel layer can function as a current collector when the positive electrode active material layer or the negative electrode active material layer is predoped with lithium from the lithium layer.

Note that the predoping may be performed so that the positive electrode active material layer or the negative electrode active material layer is doped with all the lithium included in the lithium layer or so that part of the lithium layer is left after the predoping. The part of the lithium layer left after the predoping can be used to compensate lithium lost by irreversible capacity due to charge and discharge of the battery $BT_k$.

The positive electrode current collector layer 2102, the positive electrode active material layer 2103, the negative electrode active material layer 2105, and the negative electrode current collector layer 2106 can be formed by a sputtering method, a CVD method, nanoimprint lithography, an evaporation method, or the like. When a sputtering method is used, it is preferable to use a DC power supply rather than an RF power supply for deposition. A sputtering method using a DC power supply is preferable because the deposition rate is high and thus cycle time is short. The thickness of each of the positive electrode current collector layer 2102, the positive electrode active material layer 2103, the negative electrode active material layer 2105, and the negative electrode current collector layer 2106 may be greater than or equal to 100 nm and less than or equal to 100 μm, for example.

The positive electrode current collector layer 2102 may be formed to have a single-layer or layered structure using one or more of titanium (Ti), aluminum (Al), gold (Au), and platinum (Pt). Alternatively, a single-layer or layered conductive film including an alloy of the above metals or a compound containing any of these as a main component may be used.

The positive electrode active material layer 2103 may be formed to have a single-layer or layered structure using one or more of lithium cobaltate, lithium iron phosphate, lithium manganite, lithium nickelate, and vanadium oxide.

Furthermore, the positive electrode active material layer 2103 may be formed using an olivine-type lithium-containing complex phosphate. Typical examples of a lithium-containing complex phosphate ($LiMPO_4$ (general formula) (M is one or more of Fe(II), Mn(II), Co(II), and Ni(II))) are $LiFePO_4$, $LiNiPO_4$, $LiCoPO_4$, $LiMnPO_4$, $LiFe_aNi_bPO_4$, $LiFe_aCo_bPO_4$, $LiFe_aMn_bPO_4$, $LiNi_aCo_bPO_4$, $LiNi_aMn_bPO_4$ ($a+b \leq 1$, $0<a<1$, and $0<b<1$), $LiFe_aNi_bCoPO_4$, $LiFe_aNi_bMnPO_4$, $LiNi_aCo_dMnPO_4$ ($c+d+e \leq 1$, $0<c<1$, $0<d<1$, and $0<e<1$), and $LiFe_fNi_gCo_hMn_iPO_4$ ($f+g+h+i \leq 1$, $0<f<1$, $0<g<1$, $0<h<1$, and $0<i<1$).

The positive electrode active material layer 2103 and the negative electrode active material layer 2105 may each include a binder for improving adhesion of active materials as necessary.

It is preferable for the binder to include, for example, water-soluble polymers. As the water-soluble polymers, a polysaccharide or the like can be used. As the polysaccharide, a cellulose derivative such as carboxymethyl cellulose (CMC), methyl cellulose, ethyl cellulose, hydroxypropyl cellulose, diacetyl cellulose, or regenerated cellulose, starch, or the like can be used.

As the binder, a rubber material such as styrene-butadiene rubber (SBR), styrene-isoprene-styrene rubber, acrylonitrile-butadiene rubber, butadiene rubber, or ethylene-propylene-diene copolymer is preferably used. Any of these rubber materials is more preferably used in combination with the aforementioned water-soluble polymers.

Alternatively, as the binder, a material such as polystyrene, poly(methyl acrylate), poly(methyl methacrylate) (PMMA), sodium polyacrylate, polyvinyl alcohol (PVA), polyethylene oxide (PEO), polypropylene oxide, polyimide, polyvinyl chloride, polytetrafluoroethylene, polyethylene, polypropylene, isobutylene, polyethylene terephthalate, nylon, polyvinylidene fluoride (PVdF), or polyacrylonitrile (PAN) can be preferably used. Two or more of the above materials may be used in combination for the binder.

Furthermore, the positive electrode active material layer 2103 and the negative electrode active material layer 2105 may each include a conductive additive or the like for improving the conductivity of the active material layers. Examples of the conductive additive include natural graphite, artificial graphite such as mesocarbon microbeads, and carbon fiber. Examples of carbon fiber include mesophase pitch-based carbon fiber, isotropic pitch-based carbon fiber, carbon nanofiber, and carbon nanotube. Carbon nanotube can be formed by, for example, a vapor deposition method. Other examples of the conductive additive include carbon materials such as carbon black (acetylene black (AB)) and graphene. Alternatively, metal powder or metal fibers of copper, nickel, aluminum, silver, gold, or the like, a conductive ceramic material, or the like can be used.

Flaky graphene has an excellent electrical characteristic of high conductivity and excellent physical properties of high flexibility and high mechanical strength. Thus, the use of graphene as the conductive additive can increase contact points and the contact area of active materials.

Note that graphene in this specification includes single-layer graphene and multilayer graphene including two to hundred layers. Single-layer graphene refers to a one-atom-thick sheet of carbon molecules having π bonds. Graphene oxide refers to a compound formed by oxidation of such graphene. When graphene oxide is reduced to form graphene, oxygen contained in the graphene oxide is not entirely released and part of the oxygen remains in the graphene. When the graphene contains oxygen, the proportion of the oxygen, which is measured by X-ray photoelectron spectroscopy (XPS), is higher than or equal to 2 at. % and lower than or equal to 11 at. %, preferably higher than or equal to 3 at. % and lower than or equal to 10 at. %.

A separator may be provided in the solid electrolyte layer 2104 to prevent short-circuiting between the positive electrode and the negative electrode, as necessary. As the separator, an insulator with pores is preferably used. For example, cellulose; a glass fiber; ceramics; or a synthetic fiber containing nylon (polyamide), vinylon (polyvinyl alcohol based fiber), polyester, acrylic, polyolefin, or polyurethane; can be used.

An inorganic solid electrolyte that can be formed by a sputtering method, an evaporation method, or a CVD method is used for the solid electrolyte layer 2104. Examples of the inorganic solid electrolyte are a sulfide-based solid electrolyte and an oxide-based solid electrolyte.

Examples of the sulfide-based solid electrolyte are lithium complex sulfide materials such as $Li_7P_3S_{11}$, $Li_{3.25}P_{0.95}S_4$, $Li_{10}GeP_2S_{12}$, $Li_{3.25}Ge_{0.25}P_{0.75}S_4$, $Li_2S$—$P_2S_5$, $Li_2S$—

$GeS_2$, $Li_2S$—$SiS_2$—$Li_3PO_4$, $Li_2S$—$SiS_2$—$Ga_2S_3$, $Li_2S$—$SiS_2$—$Li_4SiO_4$, $LiI$—$Li_2S$—$P_2S_5$, $LiI$—$Li_2S$—$B_2S_3$, and $LiI$—$Li_2S$—$SiS_2$.

Examples of the oxide-based solid electrolyte are compounds containing lithium and oxygen, such as $Li_{1.3}Al_{0.3}Ti_{1.7}(PO_4)_3$, $Li_{1.07}Al_{0.69}Ti_{1.46}(PO_4)_3$, $Li_4SiO_4$—$Li_3BO_3$, $Li_{2.9}PO_{3.3}N_{0.46}$, $Li_{3.6}Si_{0.6}P_{0.4}O_4$, $L_{1.5}Al_{0.5}Ge_{1.6}(PO_4)_3$, $Li_2O$, $Li_2CO_3$, $Li_2MoO_4$, $Li_3PO_4$, $Li_3VO_4$, $Li_4SiO_4$, $LLT(La_{2/3-x}Li_{3x}TiO_3)$, and $LLZ(Li_7La_3Zr_2O_{12})$.

Alternatively, a polymer solid electrolyte such as poly(ethylene oxide) (PEO) formed by a coating method or the like may be used for the solid electrolyte layer 2104. Still alternatively, a composite solid electrolyte containing any of the above inorganic solid electrolytes and a polymer solid electrolyte may be used for the solid electrolyte layer 2104.

The negative electrode active material layer 2105 may be formed to have a single-layer or layered structure using one or more of carbon (C), silicon (Si), germanium (Ge), tin (Sn), aluminum (Al), lithium (Li), lithium titanium oxide, lithium niobate, niobium oxide, tantalum oxide, and silicon oxide.

The negative electrode current collector layer 2106 may be formed to have a single-layer or layered structure using one or more of titanium (Ti), copper (Cu), stainless steel, iron (Fe), gold (Au), platinum (Pt), and nickel (Ni). Alternatively, a single-layer or layered conductive film including an alloy of the above metals or a compound containing any of these as a main component may be used.

In the battery $BT_k$ shown in FIG. 23, the positions of the positive electrode and the negative electrode may be reversed. That is to say, the negative electrode current collector layer 2106, the negative electrode active material layer 2105, the solid electrolyte layer 2104, the positive electrode active material layer 2103, and the positive electrode current collector layer 2102 may be formed in this order from the bottom.

For example, in the case where $LiFePo_4$ with a thickness of 1 μm is used for the positive electrode active material layer 2103, the capacity of the battery $BT_k$ obtained by calculation is approximately 60 μAh/cm². For example, in the case where $LiCoO_2$ with a thickness of 1 μm is used for the positive electrode active material layer 2103, the capacity of the battery $BT_k$ obtained by calculation is approximately 70 μAh/cm². For example, in the case where $LiMn_2O_4$ with a thickness of 1 μm is used for the positive electrode active material layer 2103, the capacity of the battery $BT_k$ obtained by calculation is approximately 60 μAh/cm².

Note that each of the above capacities is obtained by using the theoretical capacity of the positive electrode active material (i.e., 170 mAh/g for $LiFePo_4$, 137 mAh/g for $LiCoO_2$, and 148 mAh/g for $LiMn_2O_4$), supposing that lithium is used for the negative electrode active material layer 2105.

In this specification and the like, an explicit description "X and Y are connected" means that X and Y are electrically connected, X and Y are functionally connected, and X and Y are directly connected. Accordingly, without being limited to a predetermined connection relationship, for example, a connection relationship shown in drawings or texts, another connection relationship is included in the drawings or the texts. Here, X and Y each denote an object (e.g., a device, an element, a circuit, a wiring, an electrode, a terminal, a conductive film, a layer, or the like).

Examples of the case where X and Y are directly connected include the case where an element that allows an electrical connection between X and Y (e.g., a switch, a transistor, a capacitor, an inductor, a resistor, a diode, a display element, a light-emitting element, and a load) is not connected between X and Y, and the case where X and Y are connected without the element that allows the electrical connection between X and Y provided therebetween.

For example, in the case where X and Y are electrically connected, one or more elements that enable electrical connection between X and Y (e.g., a switch, a transistor, a capacitor, an inductor, a resistor, a diode, a display element, a light-emitting element, and a load) can be connected between X and Y. A switch is controlled to be on or off. That is, a switch is conducting or not conducting (is turned on or off) to determine whether current flows therethrough or not. Alternatively, the switch has a function of selecting and changing a current path. Note that the case where X and Y are electrically connected includes the case where X and Y are directly connected.

For example, in the case where X and Y are functionally connected, one or more circuits that enable functional connection between X and Y (e.g., a logic circuit such as an inverter, a NAND circuit, or a NOR circuit; a signal converter circuit such as a DA converter circuit, an AD converter circuit, or a gamma correction circuit; a potential level converter circuit such as a power supply circuit (e.g., a step-up circuit or a step-down circuit) or a level shifter circuit for changing the potential level of a signal; a voltage source; a current source; a switching circuit; an amplifier circuit such as a circuit that can increase signal amplitude, the amount of current, or the like, an operational amplifier, a differential amplifier circuit, a source follower circuit, or a buffer circuit; a signal generation circuit; a memory circuit; and/or a control circuit) can be connected between X and Y. Note that for example, in the case where a signal output from X is transmitted to Y even when another circuit is interposed between X and Y, X and Y are functionally connected. Note that the case where X and Y are functionally connected includes the case where X and Y are directly connected and the case where X and Y are electrically connected.

Note that in this specification and the like, an explicit description "X and Y are electrically connected" means that X and Y are electrically connected (i.e., the case where X and Y are connected with another element or another circuit provided therebetween), X and Y are functionally connected (i.e., the case where X and Y are functionally connected with another element or another circuit provided therebetween), and X and Y are directly connected (i.e., the case where X and Y are connected without another element or another circuit provided therebetween). That is, in this specification and the like, the explicit description "X and Y are electrically connected" is the same as the description "X and Y are connected".

For example, any of the following expressions can be used for the case where a source (or a first terminal or the like) of a transistor is electrically connected to X through (or not through) Z1 and a drain (or a second terminal or the like) of the transistor is electrically connected to Y through (or not through) Z2, or the case where a source (or a first terminal or the like) of a transistor is directly connected to one part of Z1 and another part of Z1 is directly connected to X while a drain (or a second terminal or the like) of the transistor is directly connected to one part of Z2 and another part of Z2 is directly connected to Y.

The expressions include, for example, "X, Y, a source (or a first terminal or the like) of a transistor, and a drain (or a second terminal or the like) of the transistor are electrically connected to each other, and X, the source (or the first terminal or the like) of the transistor, the drain (or the second terminal or the like) of the transistor, and Y are electrically connected to each other in this order", "a source (or a first terminal or the like) of a transistor is electrically connected to X, a drain (or a second terminal or the like) of the transistor is electrically connected to Y, and X, the source (or the first terminal or the like) of the transistor, the drain (or the second terminal or the like) of the transistor, and Y are electrically connected to each other in this order", and "X is electrically connected to Y through a source (or a first terminal or the like) and a drain (or a second terminal or the like) of a transistor, and X, the source (or the first terminal or the like) of the transistor, the drain (or the second terminal or the like) of the transistor, and Y are provided to be connected in this order". When the connection order in a circuit configuration is defined by an expression similar to the above examples, a source (or a first terminal or the like) and a drain (or a second terminal or the like) of a transistor can be distinguished from each other to specify the technical scope.

Another example of the expression is "a source (or a first terminal or the like) of a transistor is electrically connected to X through at least a first connection path, the first connection path does not include a second connection path, the second connection path is a path between the source (or the first terminal or the like) of the transistor and a drain (or a second terminal or the like) of the transistor. Z1 is on the first connection path, the drain (or the second terminal or the like) of the transistor is electrically connected to Y through at least a third connection path, the third connection path does not include the second connection path, and Z2 is on the third connection path." It is possible to use the expression "a source (or a first terminal or the like) of a transistor is electrically connected to X through Z1 on at least a first connection path, the first connection path does not include a second connection path, the second connection path includes a connection path through the transistor, a drain (or a second terminal or the like) of the transistor is electrically connected to Y through Z2 on at least a third connection path, and the third connection path does not include the second connection path." It is also possible to use the expression "a source (or a first terminal or the like) of a transistor is electrically connected to X through Z1 on at least a first electrical path, the first electrical path does not include a second electrical path, the second electrical path is an electrical path from the source (or the first terminal or the like) of the transistor to a drain (or a second terminal or the like) of the transistor, the drain (or the second terminal or the like) of the transistor is electrically connected to Y through Z2 on at least a third electrical path, the third electrical path does not include a fourth electrical path, and the fourth electrical path is an electrical path from the drain (or the second terminal or the like) of the transistor to the source (or the first terminal or the like) of the transistor." When the connection path in a circuit configuration is defined by an expression similar to the above examples, a source (or a first terminal or the like) and a drain (or a second terminal or the like) of a transistor can be distinguished from each other to specify the technical scope Note that these expressions are examples and there is no limitation on the expressions. Here, X, Y, Z1, and Z2 each denote an object (e.g., a device, an element, a circuit, a wiring, an electrode, a terminal, a conductive film, and a layer).

Even when independent components are electrically connected to each other in a circuit diagram, one component has functions of a plurality of components in some cases. For example, when part of a wiring also functions as an electrode, one conductive film functions as the wiring and the electrode. Thus, "electrical connection" in this specification includes in its category such a case where one conductive film has functions of a plurality of components.

This application is based on Japanese Patent Application serial no. 2014-162900 filed with Japan Patent Office on Aug. 8, 2014, the entire contents of which are hereby incorporated by reference.

What is claimed is:
1. A semiconductor device comprising:
a first node;
a second node;
a first-stage power storage element to an n-th-stage power storage element;
a first-stage switch to an n-th-stage switch;
a first switch electrically connected to the second node; and
a second switch electrically connected to the second node,
wherein capacities of the first-stage power storage element to the n-th-stage power storage element are different from one another,
wherein the first-stage power storage element to the n-th-stage power storage element are electrically connected in parallel between the first node and the second node,
wherein the first-stage power storage element to the n-th-stage power storage element are electrically connected to the first node via the first-stage switch to the n-th-stage switch, respectively,
wherein n is an integer greater than or equal to 2,
wherein the first switch is electrically connected to a load which is supplied a first potential,
wherein the second switch is supplied a second potential, and
wherein the first potential is lower than the second potential.
2. The semiconductor device according to claim 1, wherein the first stage switch to the n-th-stage switch each comprise a transistor, and on/off states of the first stage switch to the n-th-stage switch are controlled by the first signal to the n-th signal, respectively.
3. The semiconductor device according to claim 1, wherein the first stage switch to the n-th-stage switch each comprise a first transistor, a second transistor, and a capacitor,
wherein a first terminal of each first transistor is electrically connected to a first terminal of each of the first-stage power storage element to the n-th-stage power storage element, respectively,
wherein a second terminal of each first transistor is electrically connected to the first node,
wherein a gate of each first transistor is electrically connected to the capacitor of each of the first stage switch to the n-th-stage switch, respectively,
wherein each of the first signal to the n-th signal is input to a first terminal of each second transistor, respectively,
wherein a second terminal of each second transistor is electrically connected to each gate of the first transistor, respectively, and
wherein on/off states of second transistors of the first-stage switch to the n-th-stage switch are controlled by a common signal.
4. The semiconductor device according to claim 3, wherein a channel of each second transistor includes an oxide semiconductor.

5. The semiconductor device according to claim 1,
wherein a capacity of the k-th-stage power storage element is $2^n$ times the capacity of the first-stage power storage element, and
wherein k is an integer greater than or equal to 1 and less than or equal to n.

6. The semiconductor device according to claim 1,
wherein a signal group including the first signal to the n-th signal is an n-bit digital signal.

7. An oscillator circuit, comprising q-stage inverter circuits,
wherein q is an odd number greater than 1 and less than n,
wherein the q-stage inverter circuits are electrically connected in series, and
wherein the semiconductor device according to claim 1 is electrically connected to each of input nodes of power supply voltages of the q-stage inverter circuits.

8. A phase locked loop comprising the oscillator circuit according to claim 7.

9. A memory device comprising:
a memory cell array; and
a row driver circuit and a column driver circuit configured to drive the memory cell array,
wherein the column driver circuit includes the semiconductor device according to claim 1.

10. An electronic device comprising:
the semiconductor device according to claim 1, and
at least one of a display device, a touch panel, a microphone, a speaker, an operation key, and a housing.

11. A semiconductor device comprising:
a first node;
a second node;
a first-stage power storage element to an n-th-stage power storage element;
a first-stage switch to an n-th-stage switch;
a first switch electrically connected to the second node; and
a second switch electrically connected to the second node,
wherein capacities of the first-stage power storage element to the n-th-stage power storage element are different from one another,
wherein the first-stage power storage element to the n-th-stage power storage element are electrically connected in parallel between the first node and the second node,
wherein the first-stage power storage element to the n-th-stage power storage element are electrically connected to the first node via the first-stage switch to the n-th-stage switch, respectively,
wherein n is an integer greater than or equal to 2,
wherein the first switch is electrically connected to a load which is supplied a first potential,
wherein the second switch is supplied a second potential,
wherein the first potential is lower than the second potential,
wherein the first stage switch to the n-th-stage switch each comprise a transistor, and on/off states of the first stage switch to the n-th-stage switch are controlled by the first signal to the n-th signal, respectively, and
wherein a channel of each transistor includes an oxide semiconductor.

12. The semiconductor device according to claim 11,
wherein a capacity of the k-th-stage power storage element is $2^n$ times the capacity of the first-stage power storage element, and
wherein k is an integer greater than or equal to 1 and less than or equal to n.

13. The semiconductor device according to claim 11,
wherein a signal group including the first signal to the n-th signal is an n-bit digital signal.

14. An oscillator circuit, comprising q-stage inverter circuits,
wherein q is an odd number greater than 1 and less than n,
wherein the q-stage inverter circuits are electrically connected in series, and
wherein the semiconductor device according to claim 11 is electrically connected to each of input nodes of power supply voltages of the q-stage inverter circuits.

15. A phase locked loop comprising the oscillator circuit according to claim 14.

16. A memory device comprising:
a memory cell array; and
a row driver circuit and a column driver circuit configured to drive the memory cell array,
wherein the column driver circuit includes the semiconductor device according to claim 11.

17. An electronic device comprising:
the semiconductor device according to claim 11, and
at least one of a display device, a touch panel, a microphone, a speaker, an operation key, and a housing.

* * * * *